United States Patent
Kikutani et al.

(10) Patent No.: US 8,975,178 B2
(45) Date of Patent: Mar. 10, 2015

(54) METHOD OF MANUFACTURING A MEMORY DEVICE USING FINE PATTERNING TECHNIQUES

(75) Inventors: Keisuke Kikutani, Yokkaichi (JP); Satoshi Nagashima, Yokkaichi (JP); Hidefumi Mukai, Mie-gun (JP); Takehiro Kondoh, Yokkaichi (JP); Hisataka Meguro, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 13/602,841

(22) Filed: Sep. 4, 2012

(65) Prior Publication Data

US 2013/0237051 A1      Sep. 12, 2013

(30) Foreign Application Priority Data

Dec. 27, 2011    (JP) ................. 2011-286861

(51) Int. Cl.

| | | |
|---|---|---|
| H01L 21/4763 | (2006.01) | |
| H01L 21/768 | (2006.01) | |
| H01L 21/033 | (2006.01) | |
| H01L 21/3213 | (2006.01) | |
| H01L 27/115 | (2006.01) | |

(52) U.S. Cl.
CPC ...... H01L 21/76801 (2013.01); H01L 21/0337 (2013.01); H01L 21/0338 (2013.01); H01L 21/32139 (2013.01); H01L 27/11519 (2013.01); H01L 27/11524 (2013.01); H01L 27/11548 (2013.01); H01L 27/11565 (2013.01); H01L 27/1157 (2013.01); H01L 27/11575 (2013.01)
USPC ............. 438/624; 438/618; 438/622

(58) Field of Classification Search
None
See application file for complete search history.

(56) References Cited

U.S. PATENT DOCUMENTS

| | | |
|---|---|---|
| 7,838,996 B2 | 11/2010 | Sato et al. |
| 8,044,456 B2 | 10/2011 | Nagashima et al. |
| 8,142,986 B2 | 3/2012 | Sim et al. |
| 8,216,947 B2 | 7/2012 | Lee et al. |

(Continued)

FOREIGN PATENT DOCUMENTS

| | | |
|---|---|---|
| JP | 2008-27991 | 2/2008 |
| JP | 2009-94238 | 4/2009 |

(Continued)

OTHER PUBLICATIONS

Japanese Office Action issued Aug. 21, 2012, in Japan Patent Application No. 2010-069098.

(Continued)

*Primary Examiner* — Charles Garber
*Assistant Examiner* — Brigitte Paterson
(74) *Attorney, Agent, or Firm* — Oblon, Spivak, McClelland, Maier & Neustadt, L.L.P.

(57) ABSTRACT

According to one embodiment, a method of manufacturing a device, includes forming a first core including a line portion extending between first and second regions and having a first width and a fringe having a dimension larger than the first width, forming a mask on the fringe and on a first sidewall on the first core, removing the first core so that a remaining portion having a dimension larger than the first width is formed below the mask, forming a second sidewall on a pattern corresponding the first sidewall and the remaining portion, the second sidewall having a second width less than the first width and facing a first interval less than the first width in the first region and facing a second interval larger than the first interval in the second region.

20 Claims, 61 Drawing Sheets

(56) References Cited

U.S. PATENT DOCUMENTS

2003/0001267 A1* 1/2003 Watanabe .................... 257/758
2006/0006495 A1 1/2006 Herner et al.
2007/0114508 A1 5/2007 Herner et al.
2011/0256723 A1 10/2011 Lee et al.
2012/0241834 A1* 9/2012 Nakajima et al. ............. 257/316

FOREIGN PATENT DOCUMENTS

| JP | 2009-517864 | 4/2009 |
| JP | 2009-260309 | 11/2009 |
| JP | 2010-45205 | 2/2010 |
| JP | 2010-103538 | 5/2010 |
| JP | 2010-153869 | 7/2010 |
| WO | WO 2009/005700 A2 | 1/2009 |

OTHER PUBLICATIONS

U.S. Appl. No. 13/603,887, filed Sep. 5, 2012, Kikutani.
Office Action issued Nov. 11, 2014 in Japanese Patent Application No. 2011-286861 (with English translation).

* cited by examiner

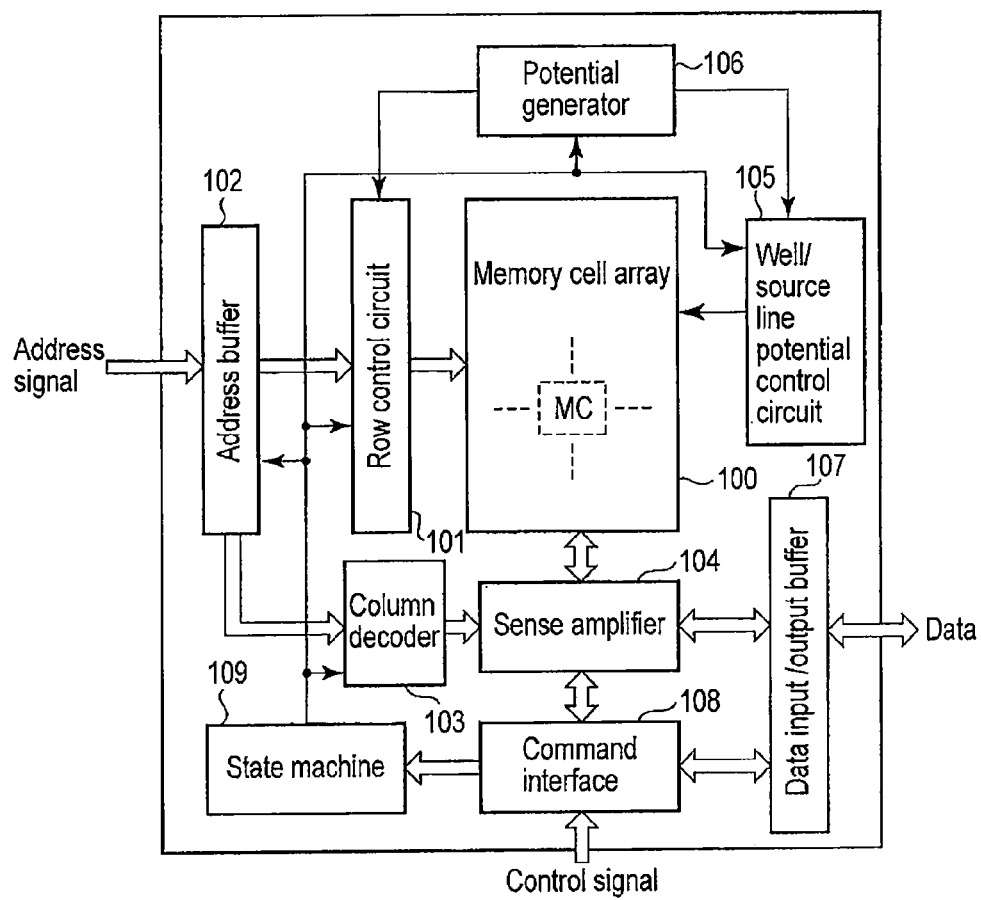
F I G. 1

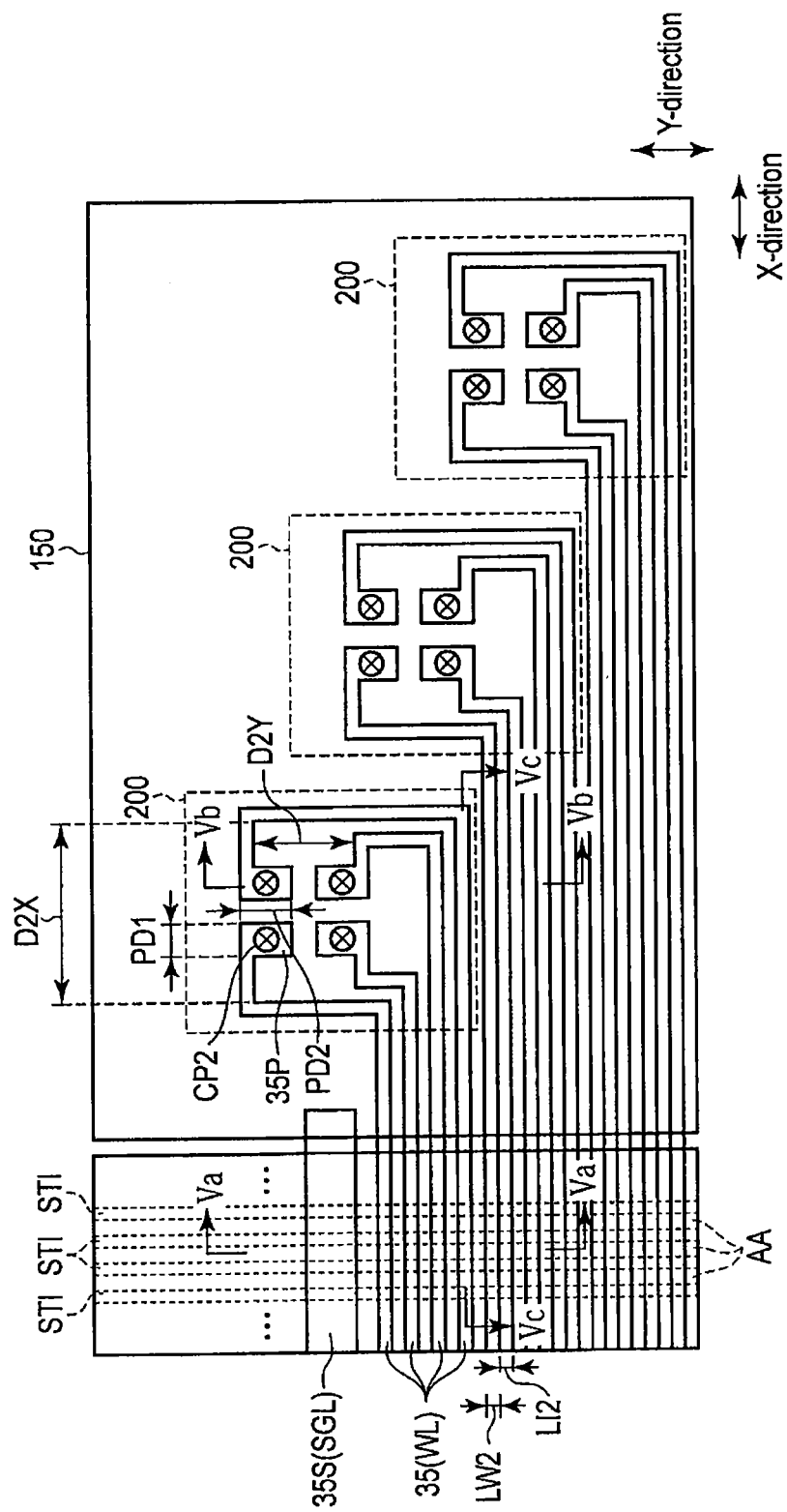
F I G. 4

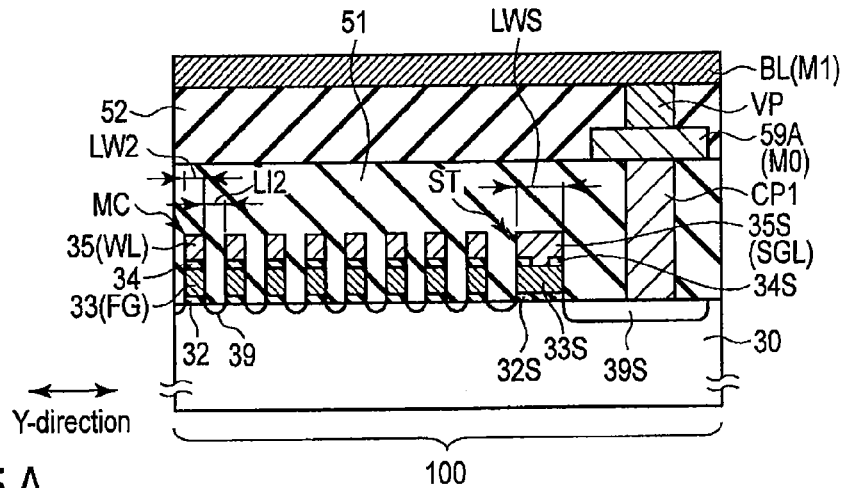
F I G. 5 A
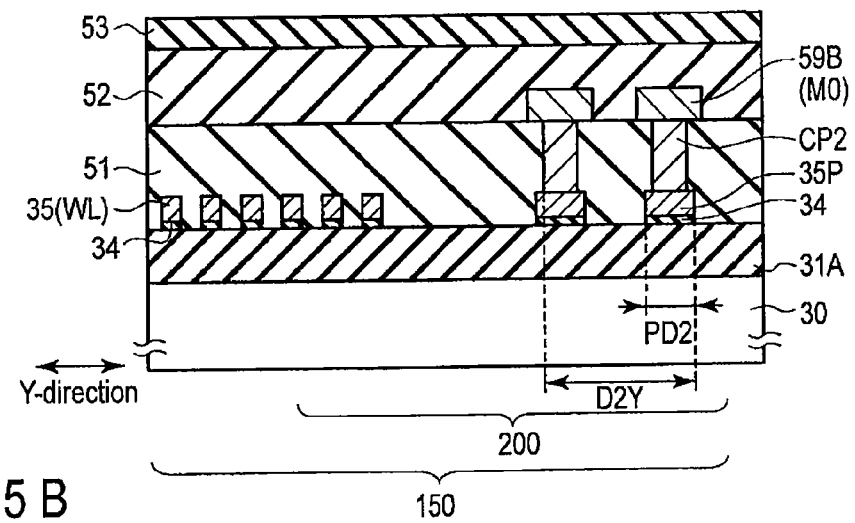
F I G. 5 B
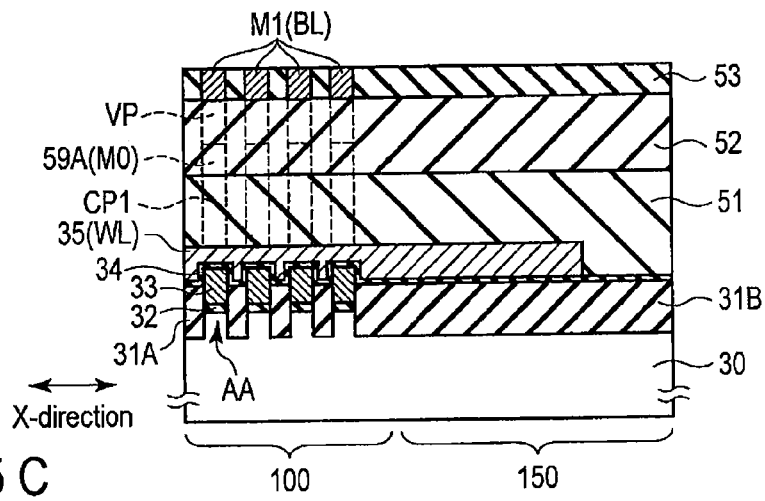
F I G. 5 C

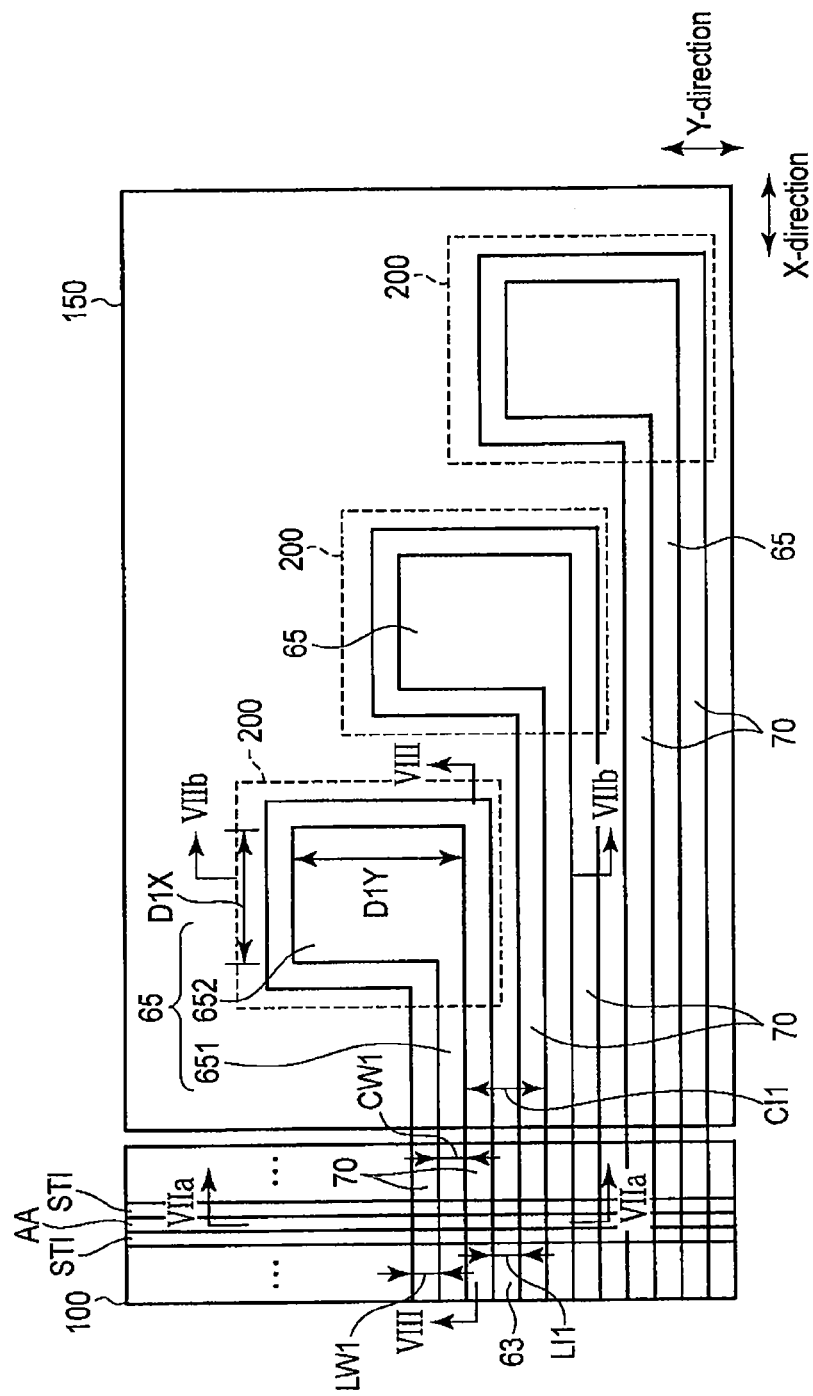
F I G. 6

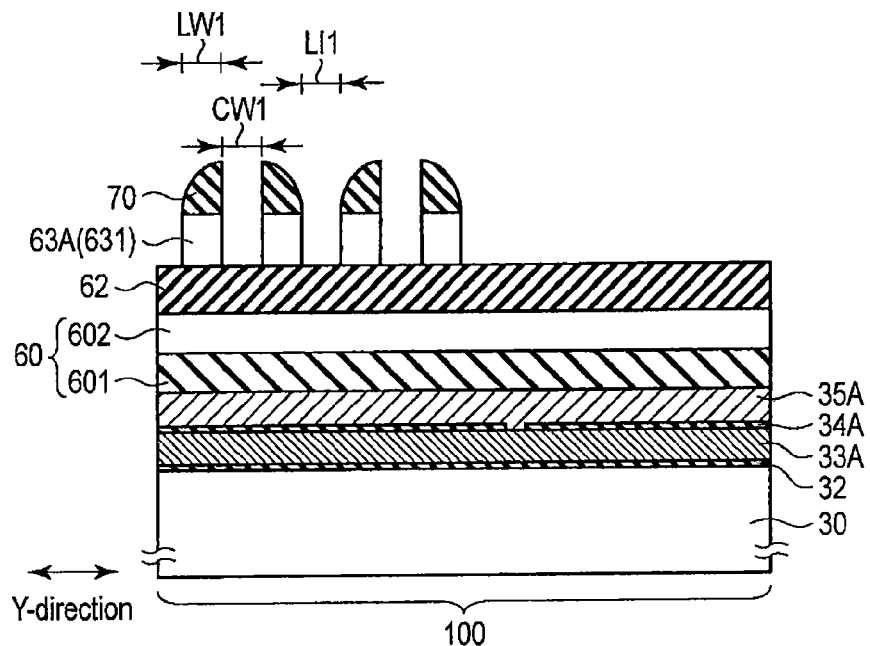
F I G. 13 A
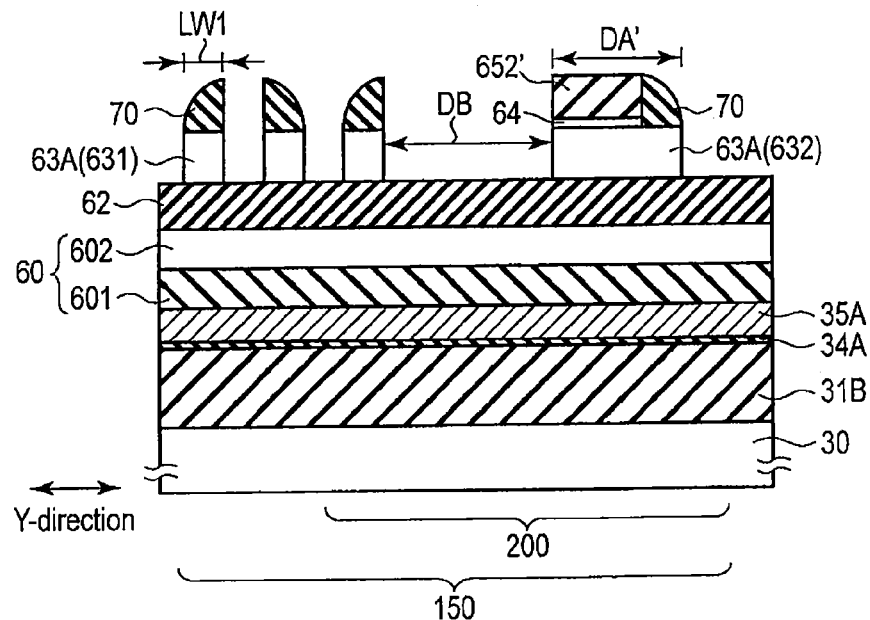
F I G. 13 B

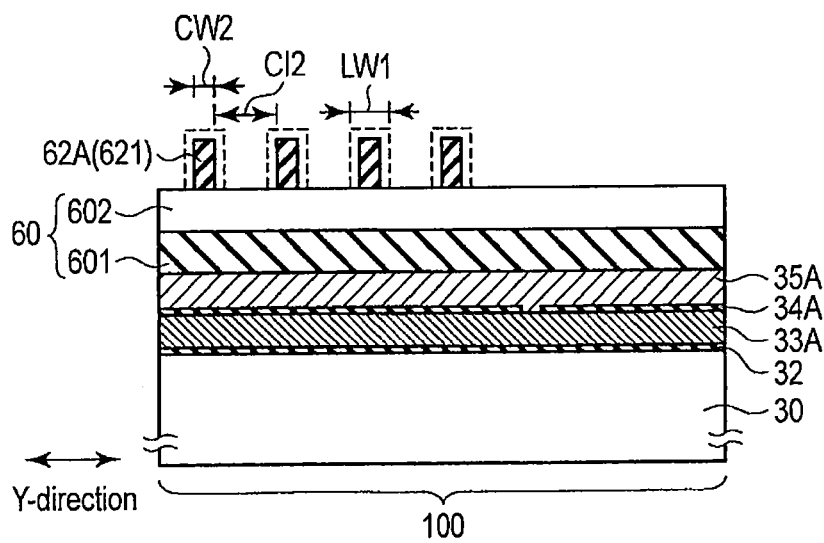
F I G. 1 5 A
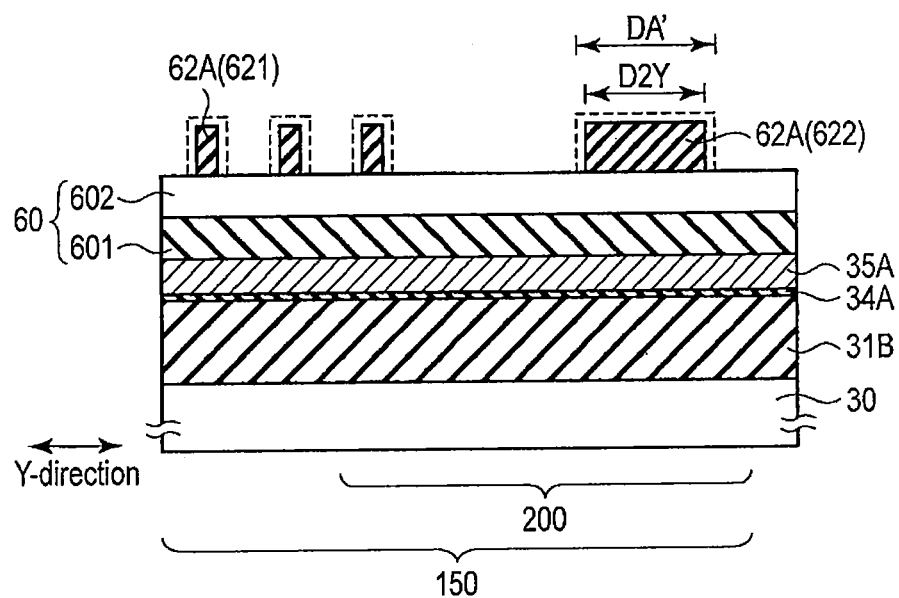
F I G. 1 5 B

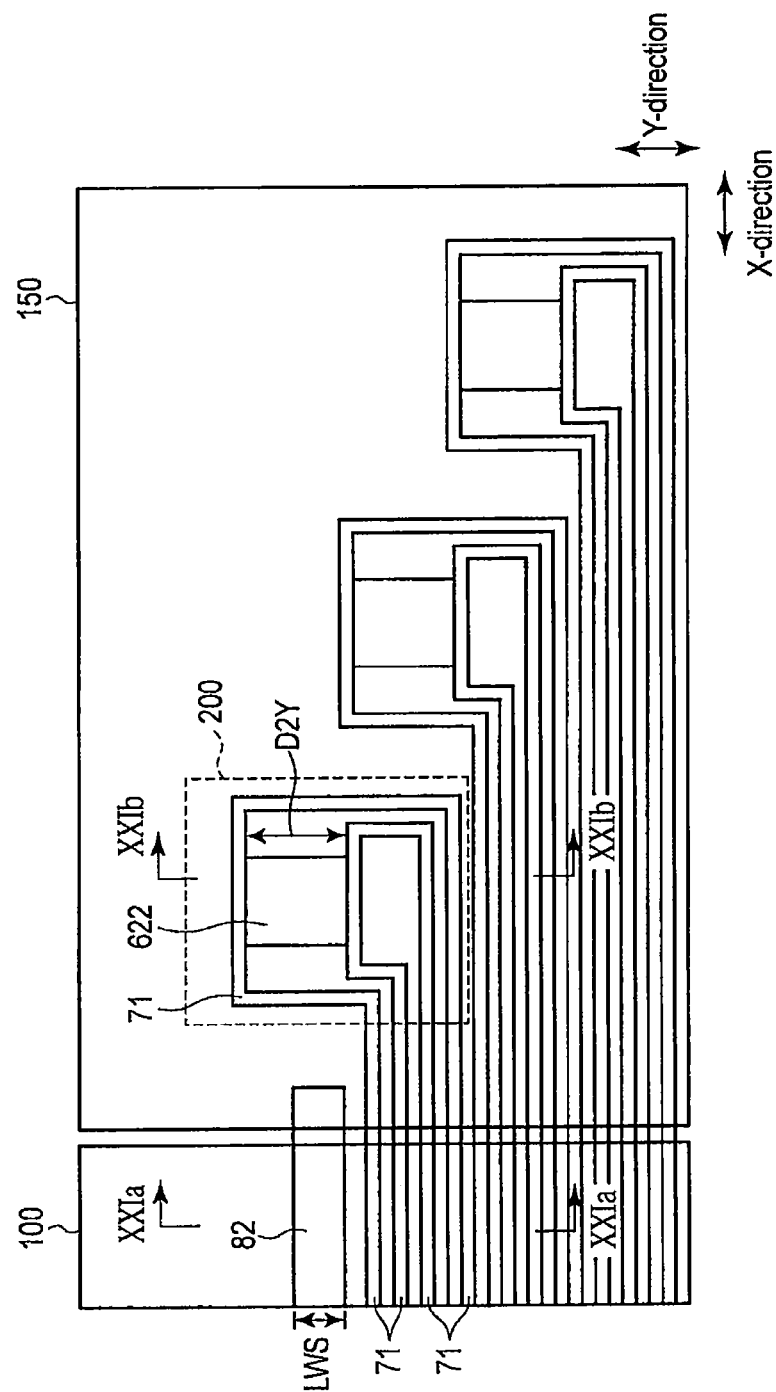
F I G. 20

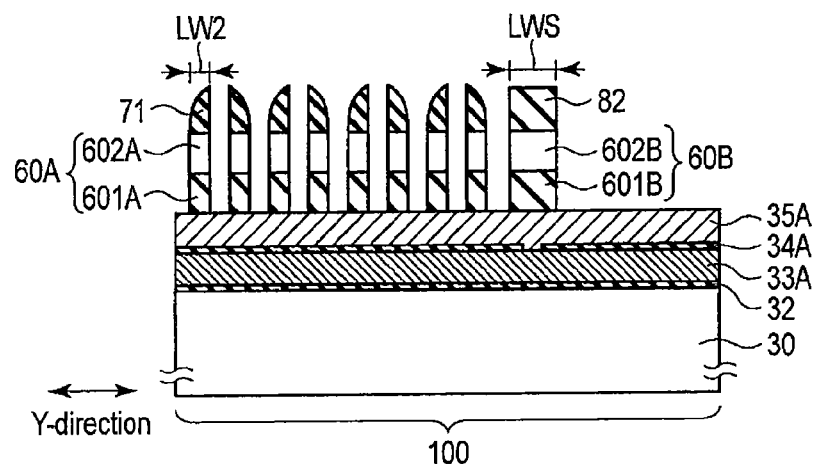
F I G. 2 1 A
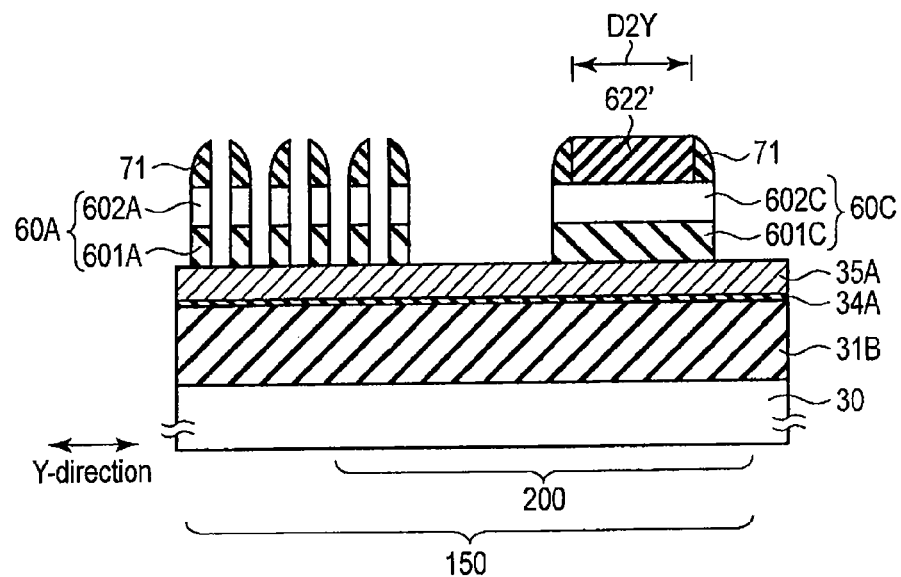
F I G. 2 1 B

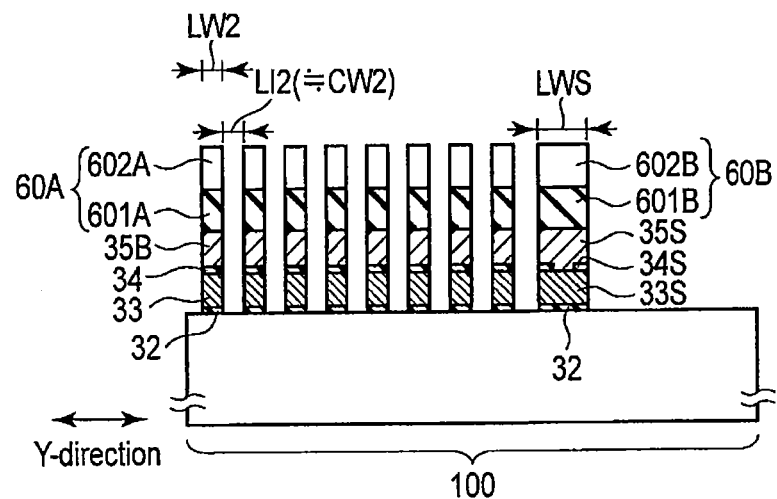
F I G. 22 A
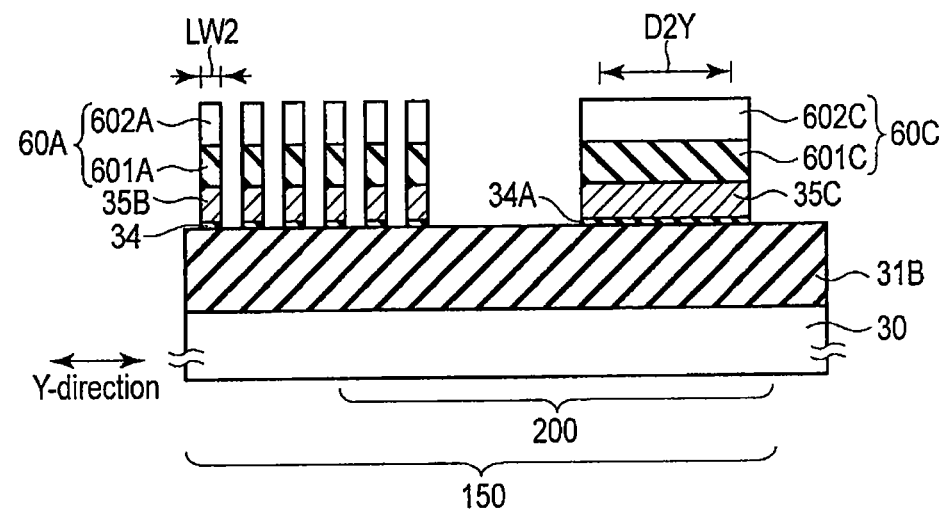
F I G. 22 B

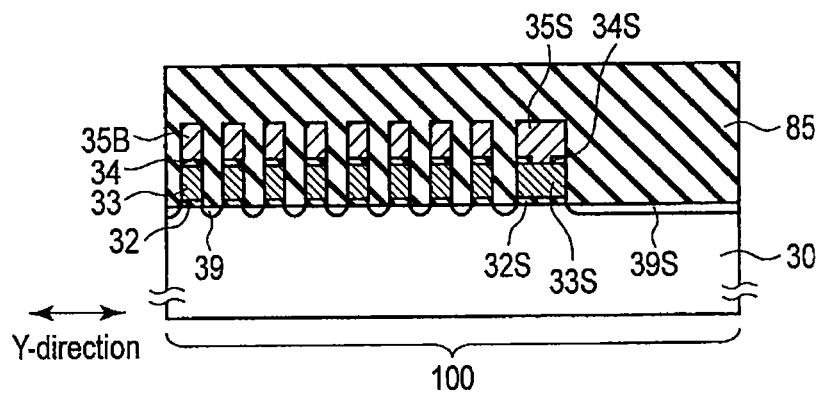
F I G. 2 4 A
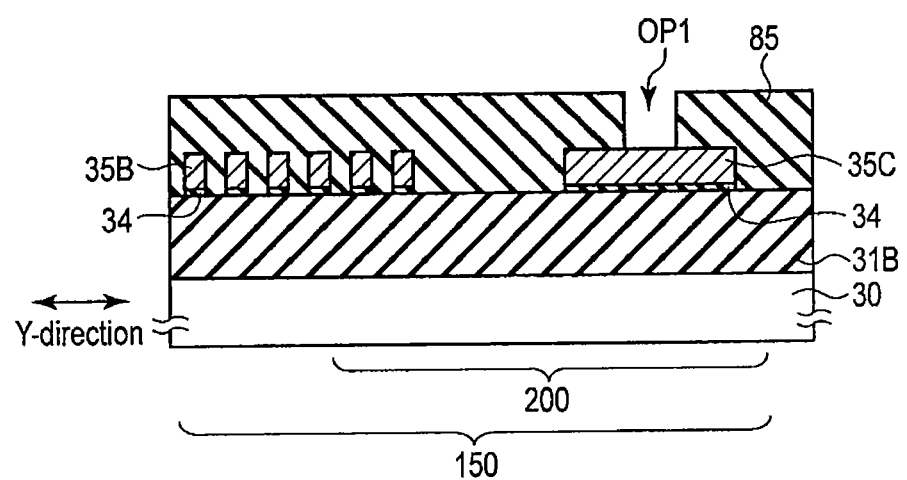
F I G. 2 4 B

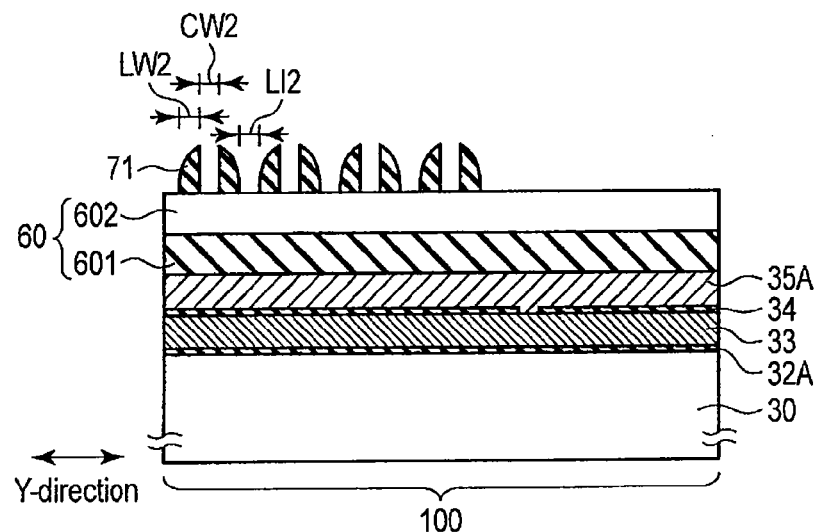
F I G. 27 A
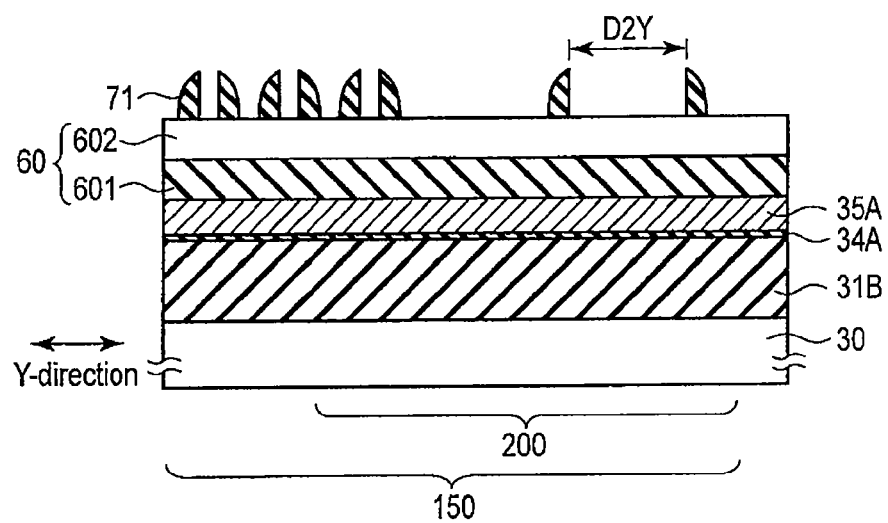
F I G. 27 B

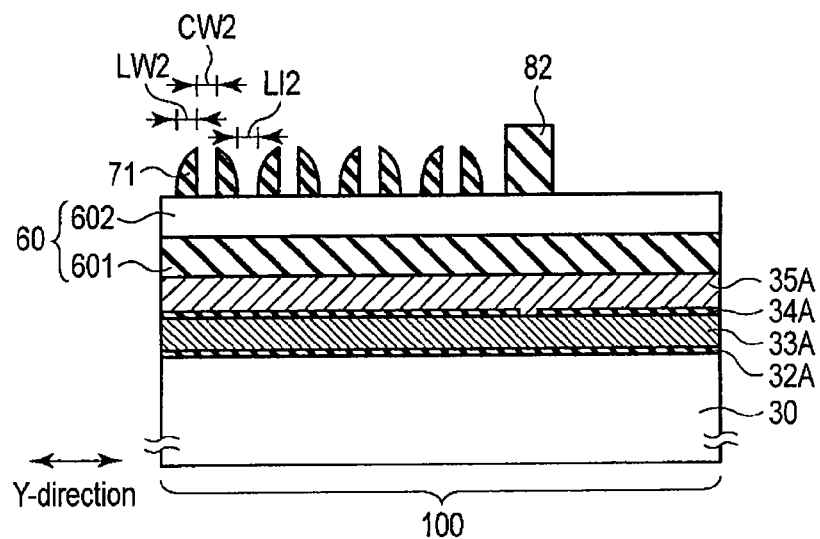
F I G. 29 A
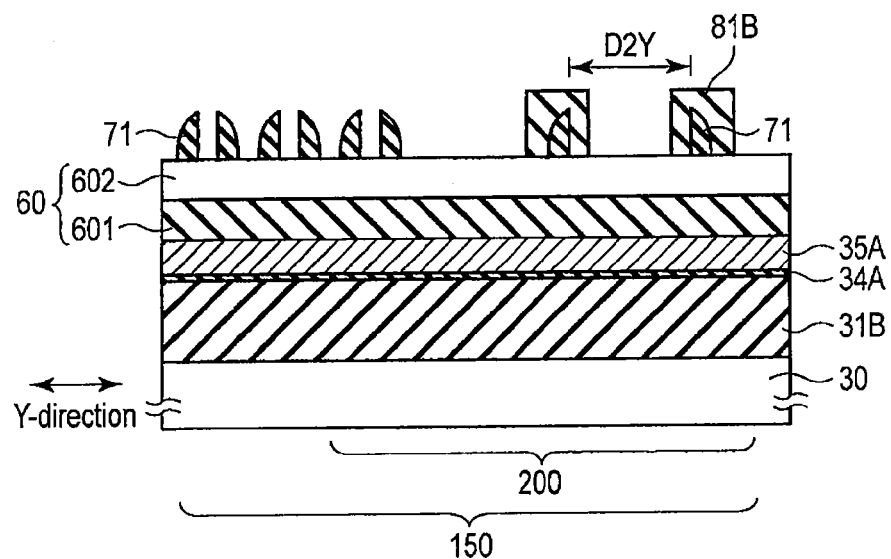
F I G. 29 B

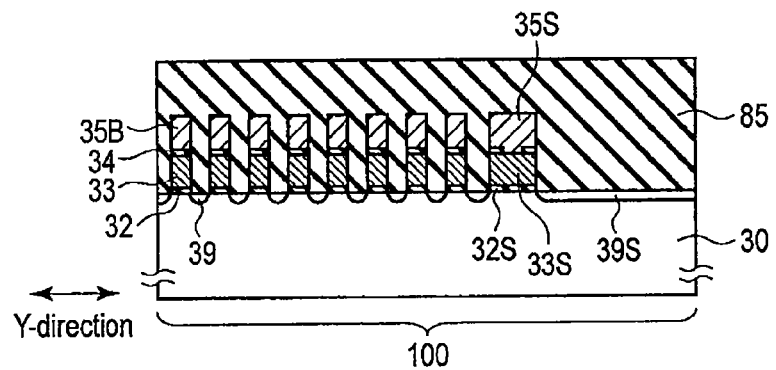
F I G. 3 1 A
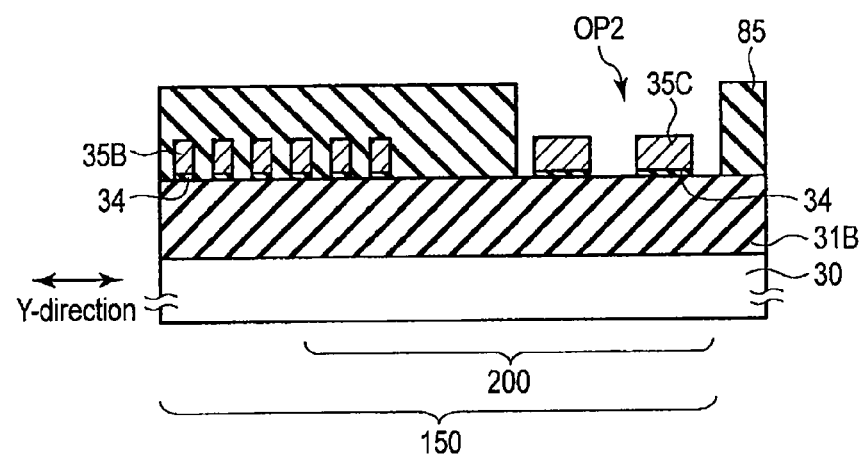
F I G. 3 1 B

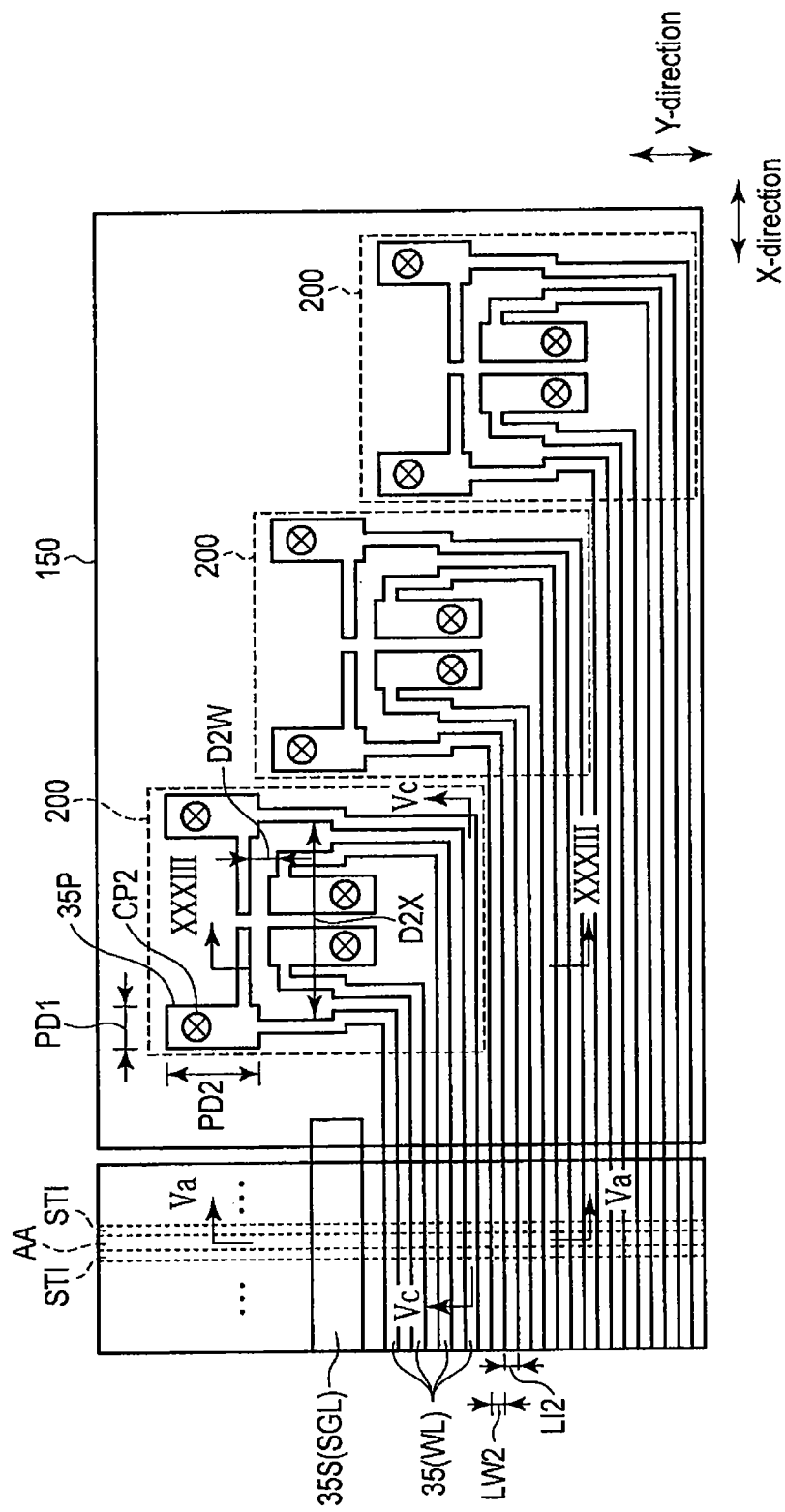
F I G. 32

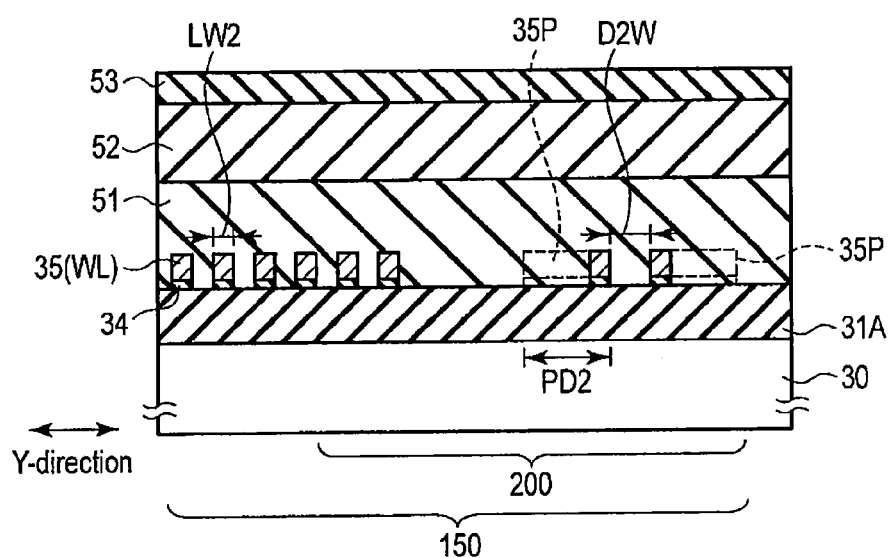
F I G. 33

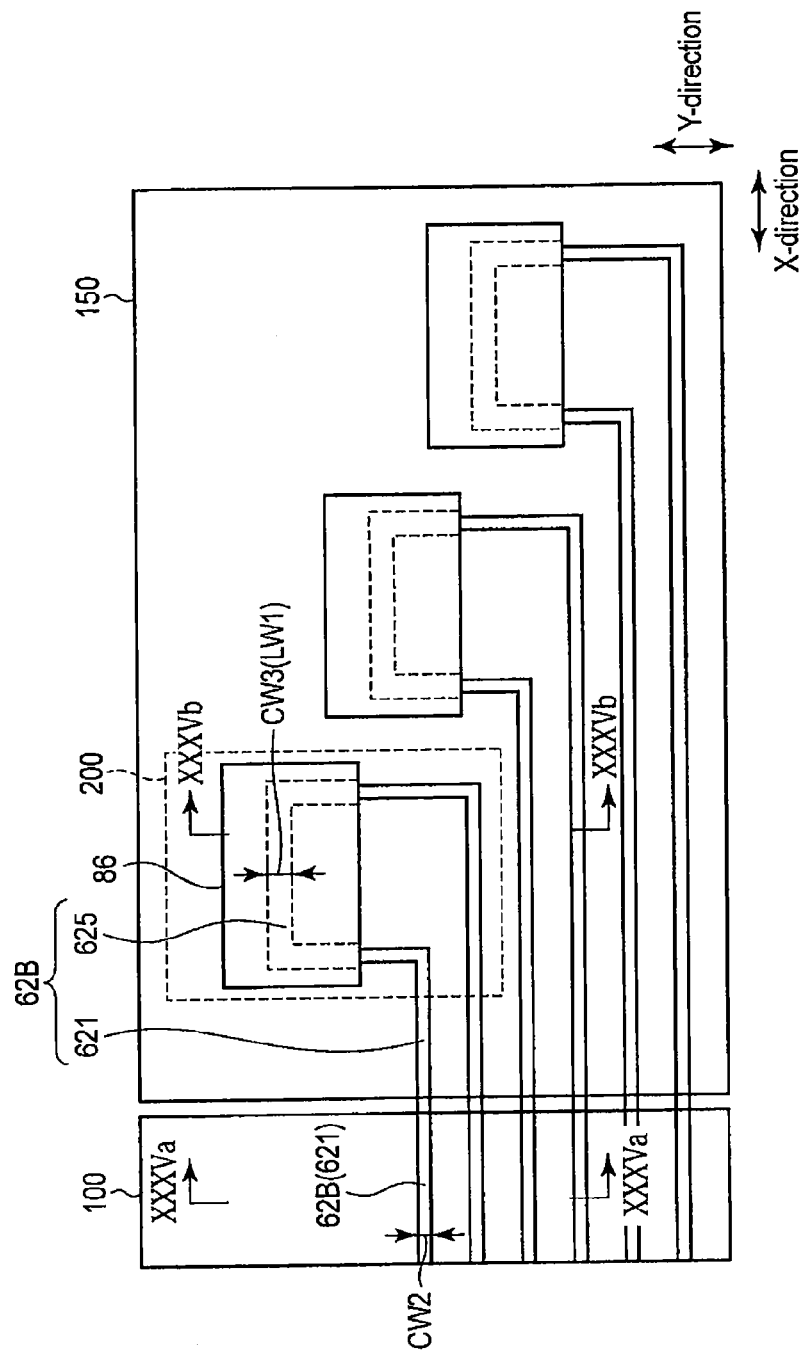
F I G. 34

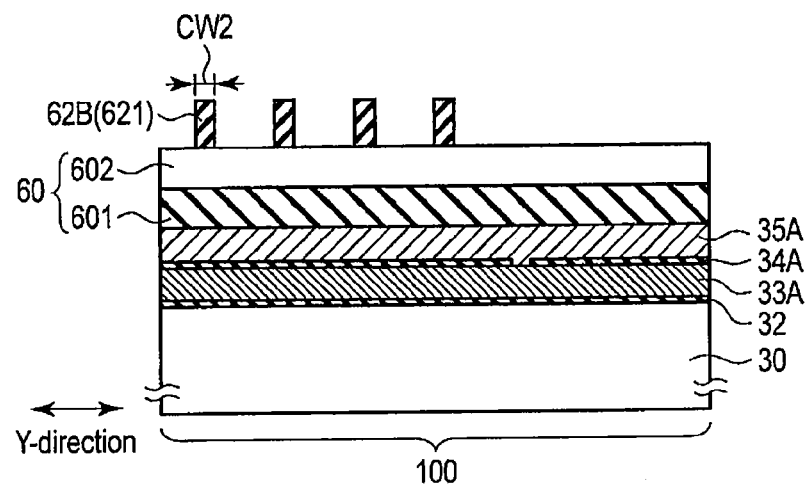
F I G. 35A
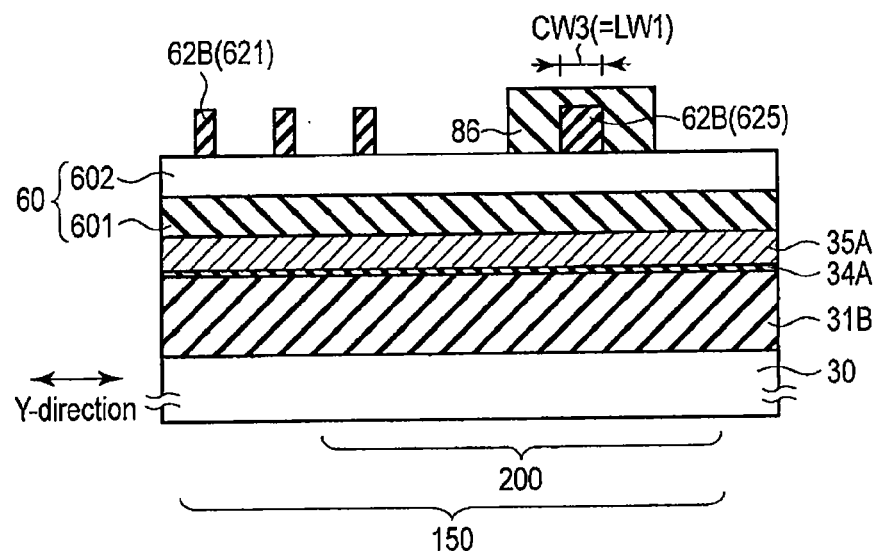
F I G. 35B

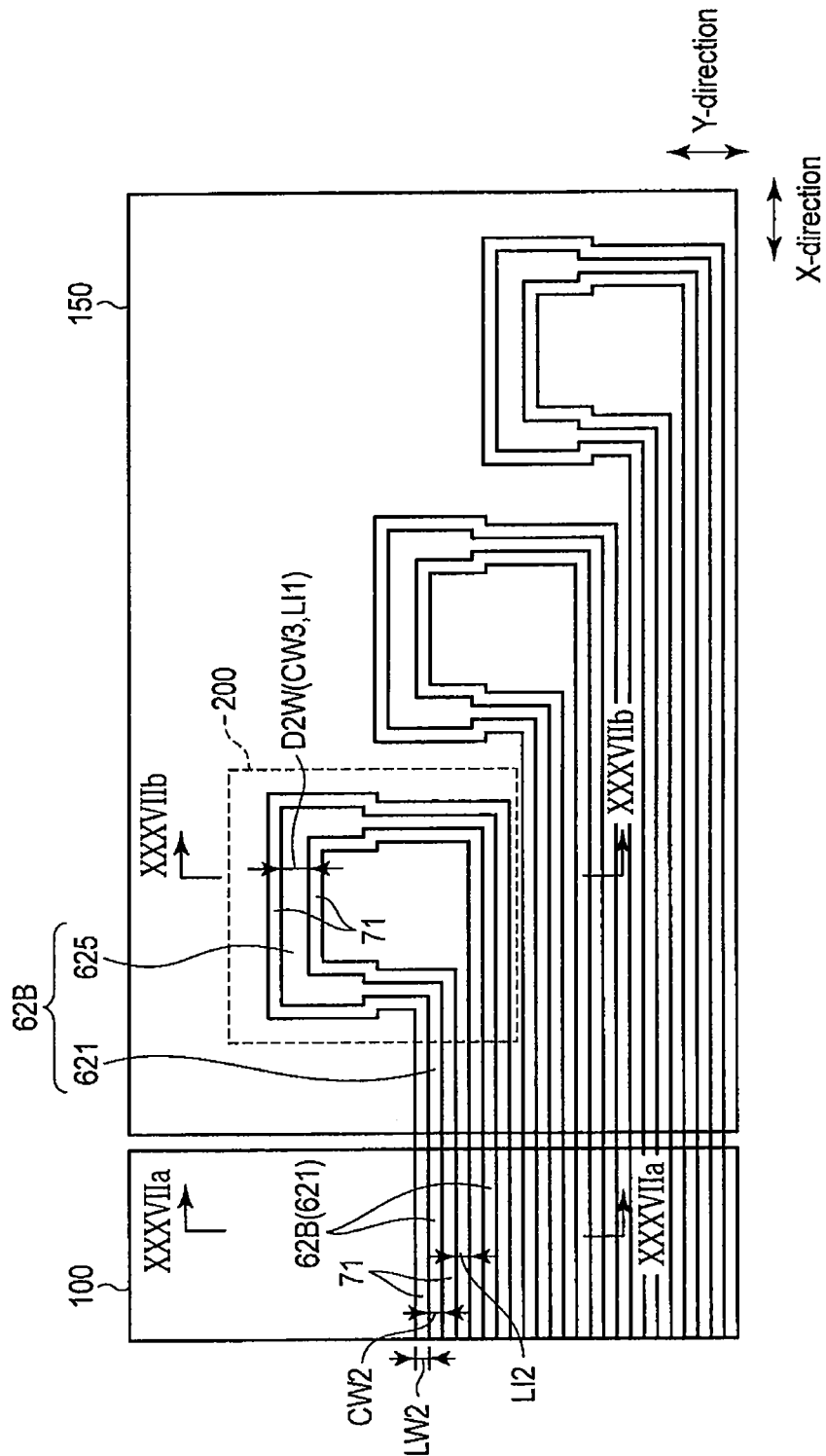
F I G. 36

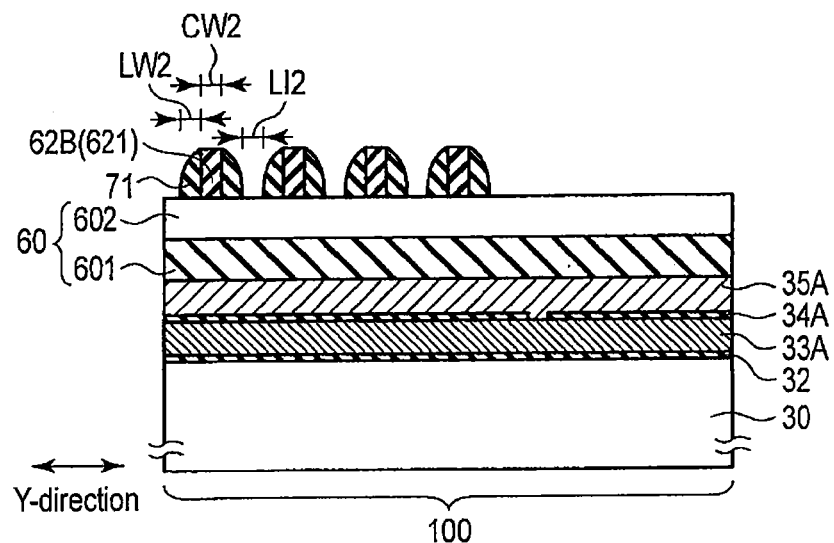
F I G. 37A
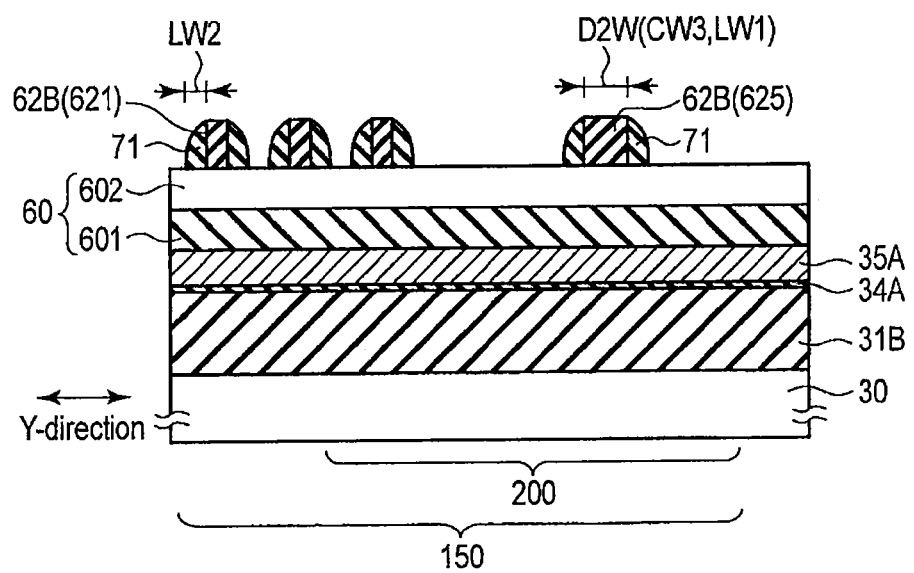
F I G. 37B

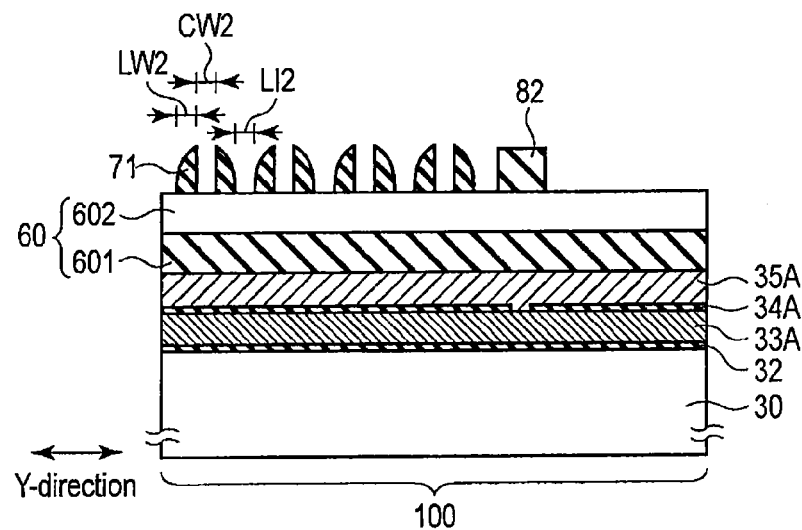
F I G. 39 A
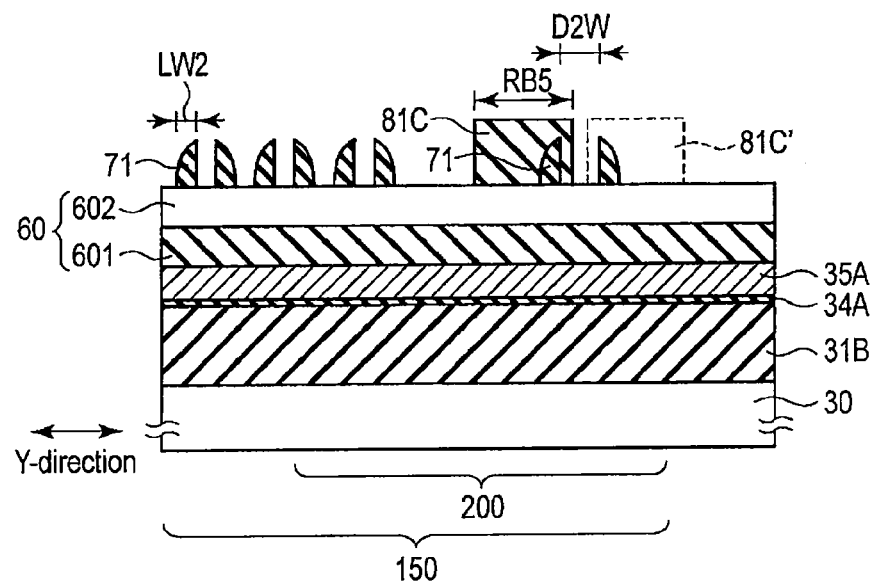
F I G. 39 B

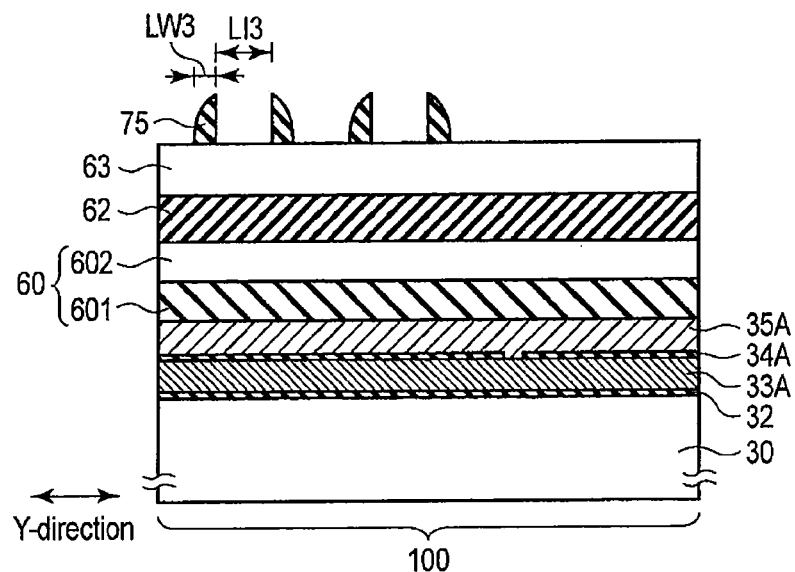
F I G. 44 A
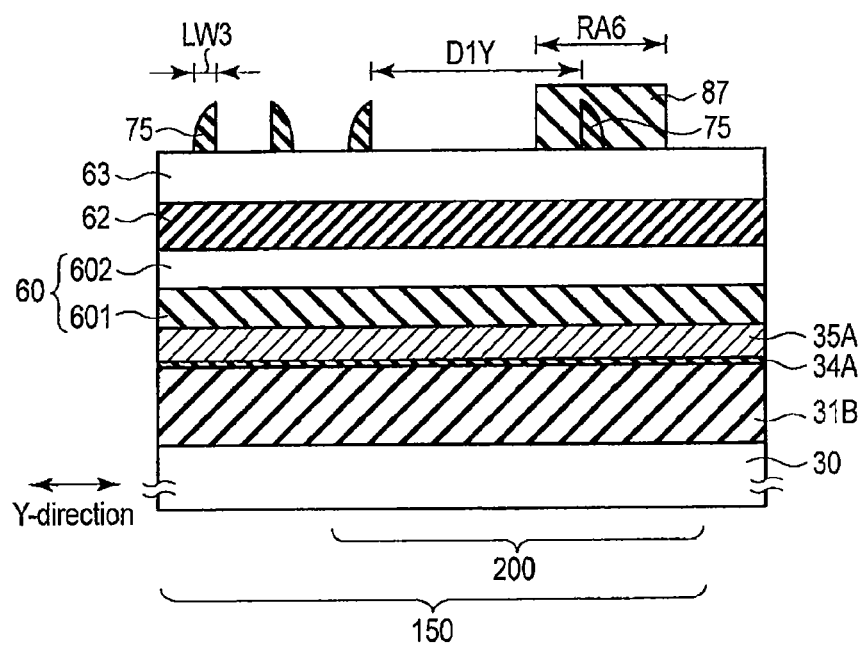
F I G. 44 B

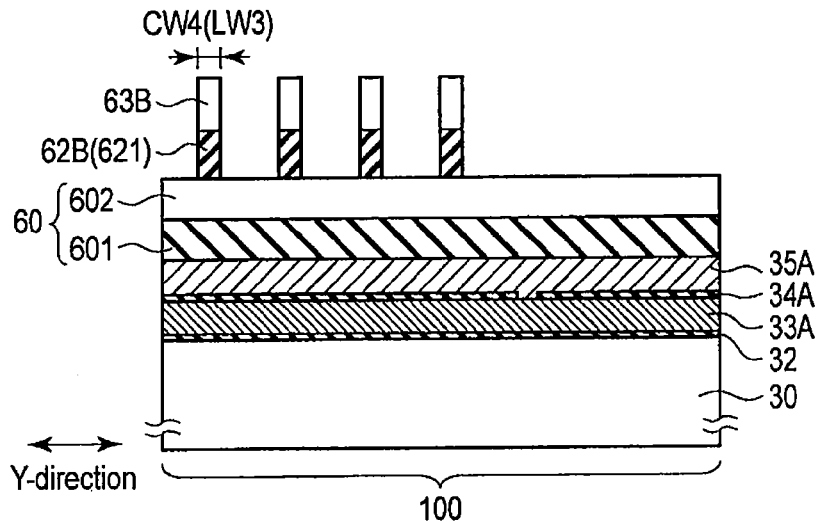
F I G. 4 6 A
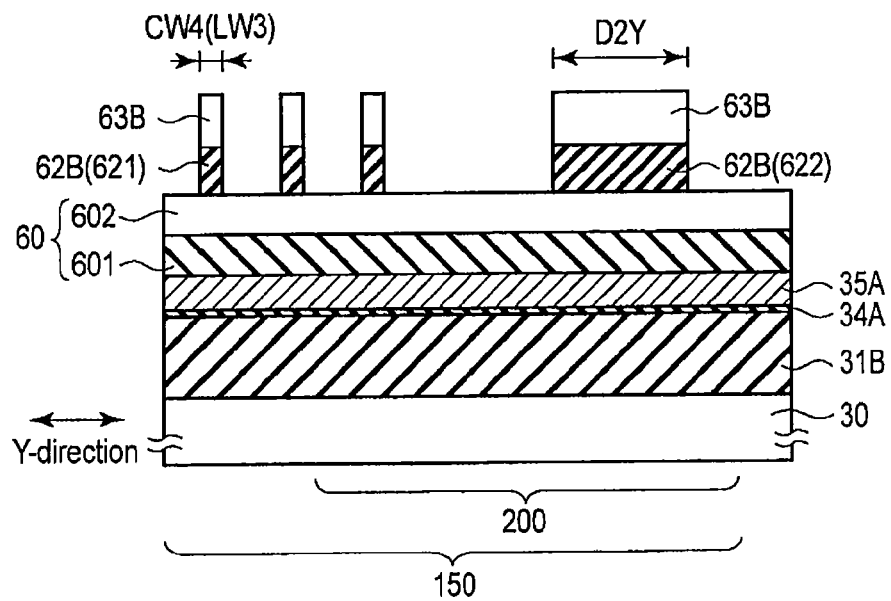
F I G. 4 6 B

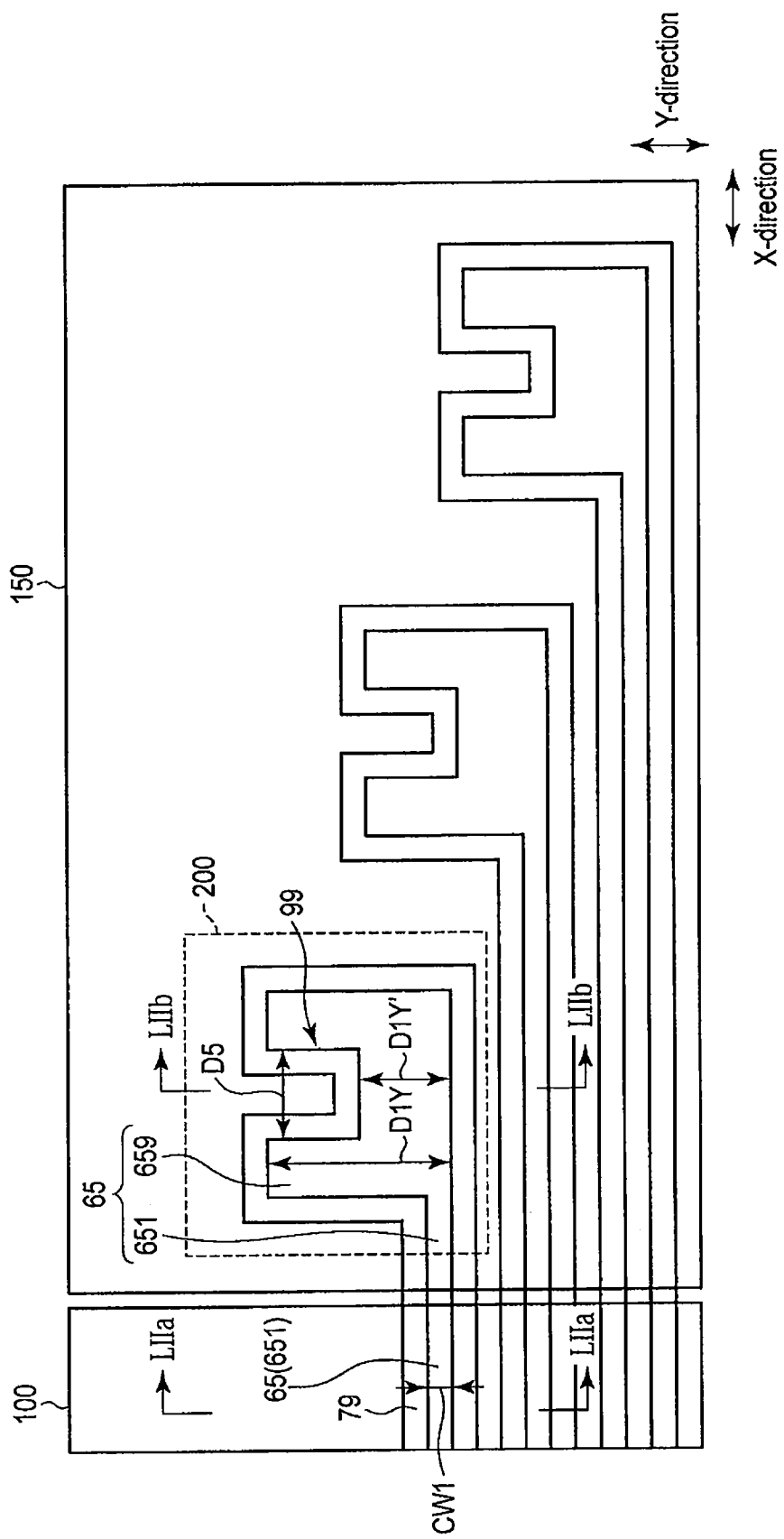
F I G. 51

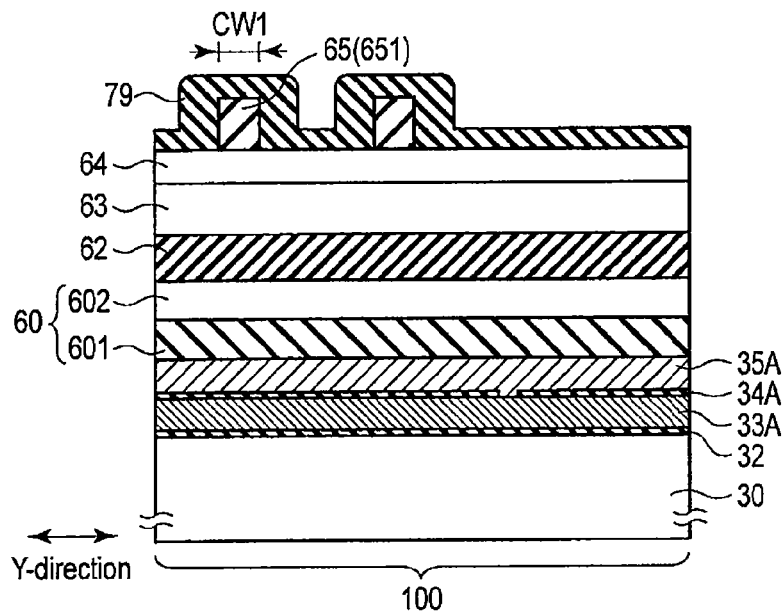
F I G. 5 2 A
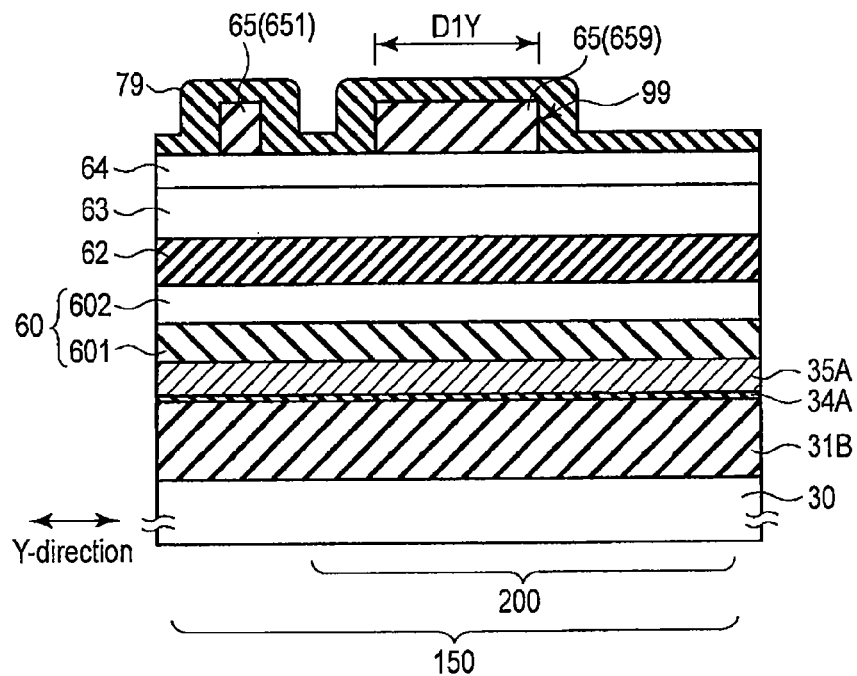
F I G. 5 2 B

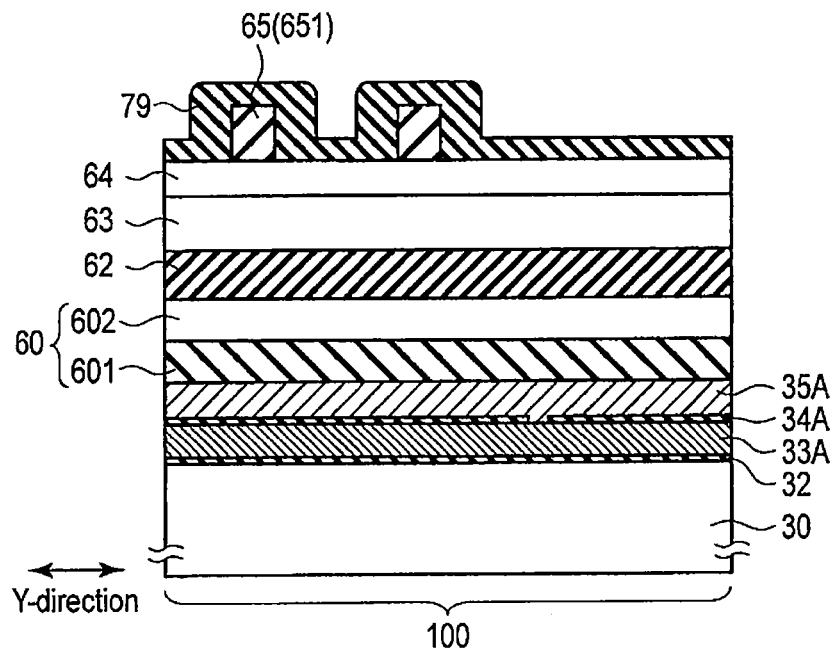
F I G. 5 4 A
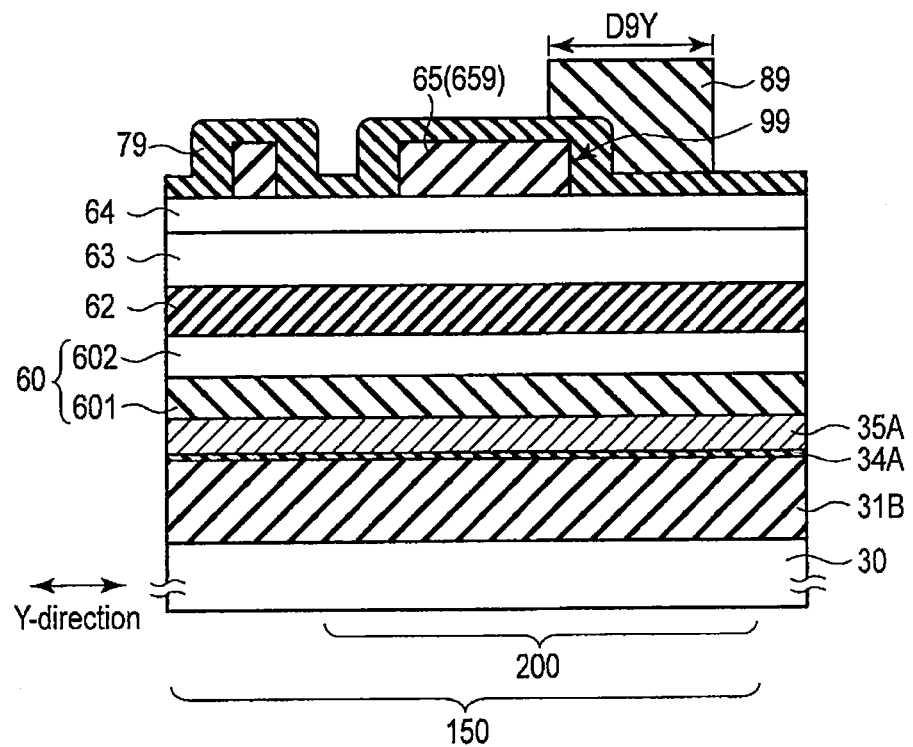
F I G. 5 4 B

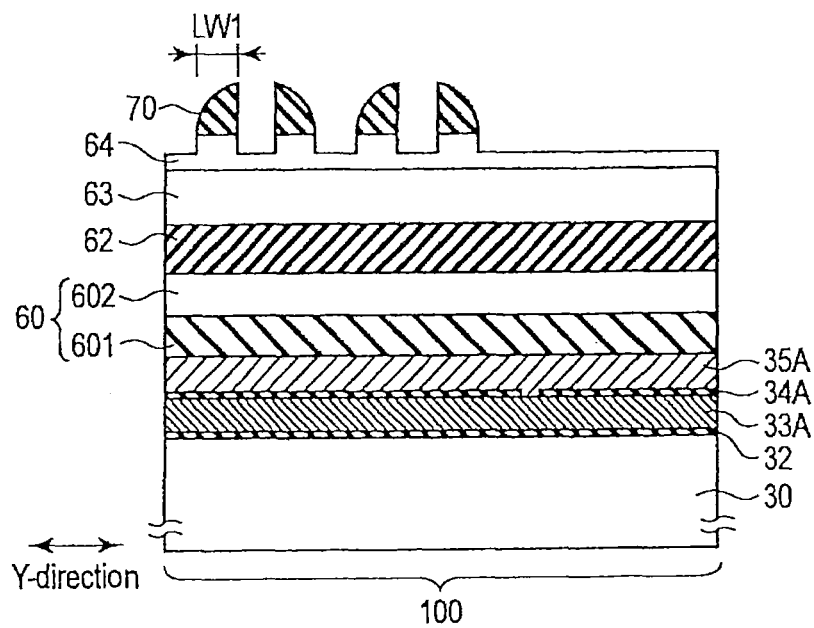
F I G. 5 5 A
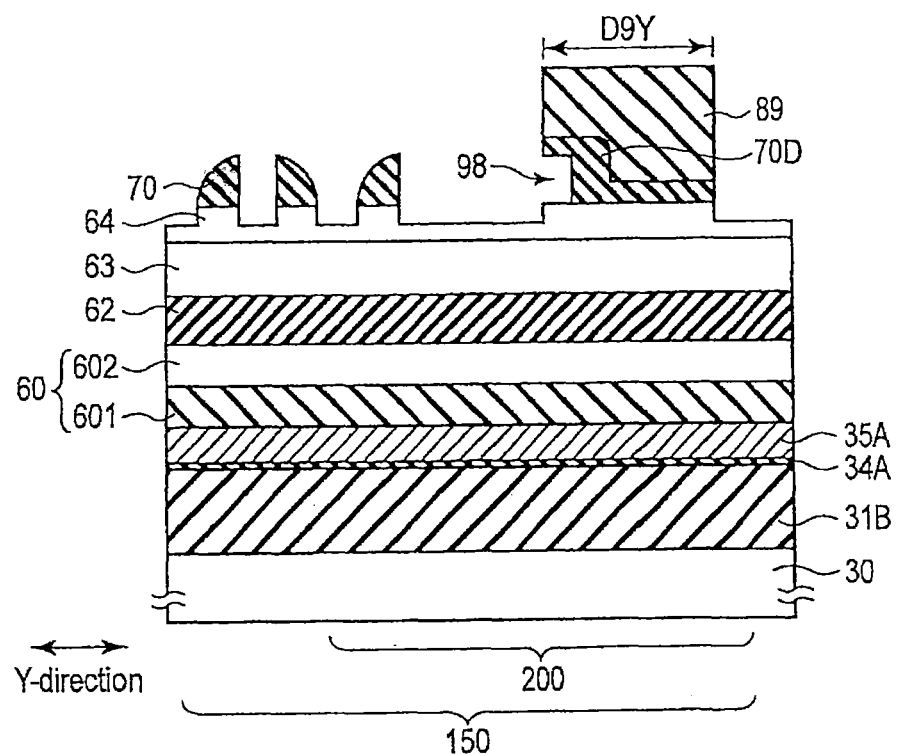
F I G. 5 5 B

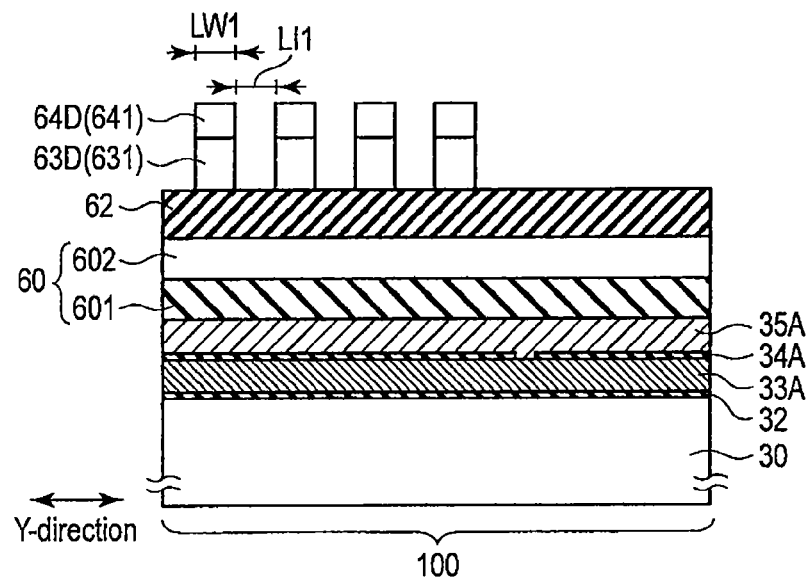
F I G. 5 7 A
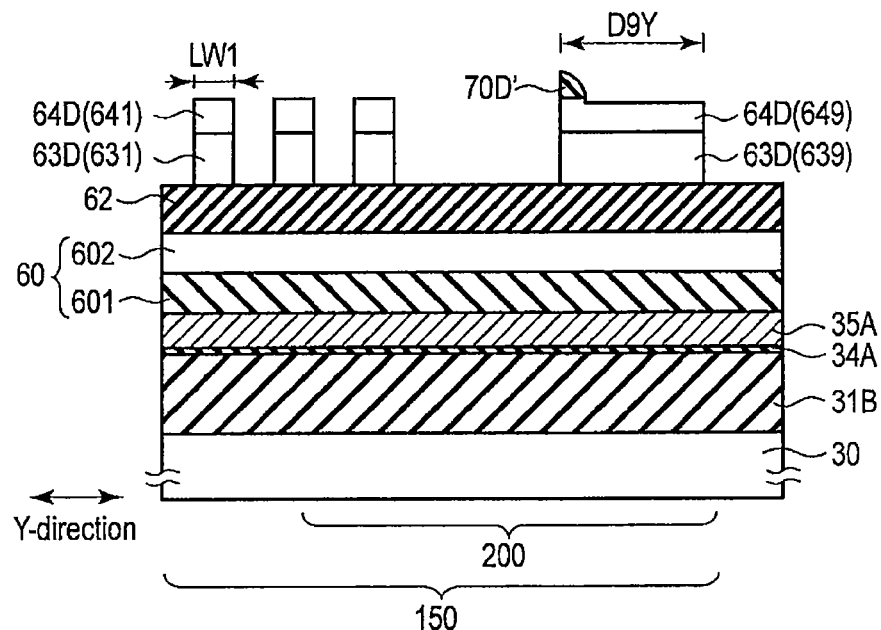
F I G. 5 7 B

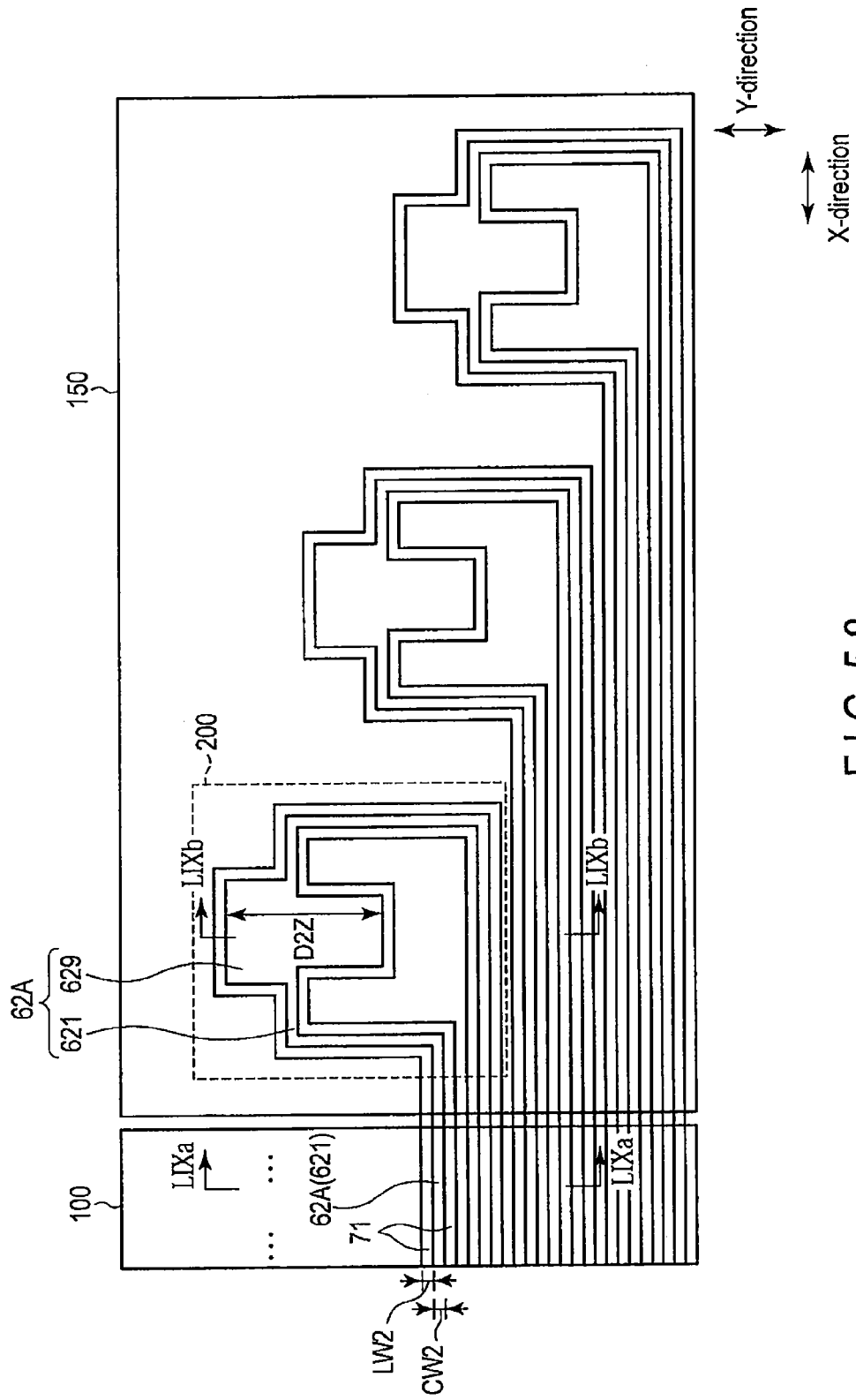
F I G. 58

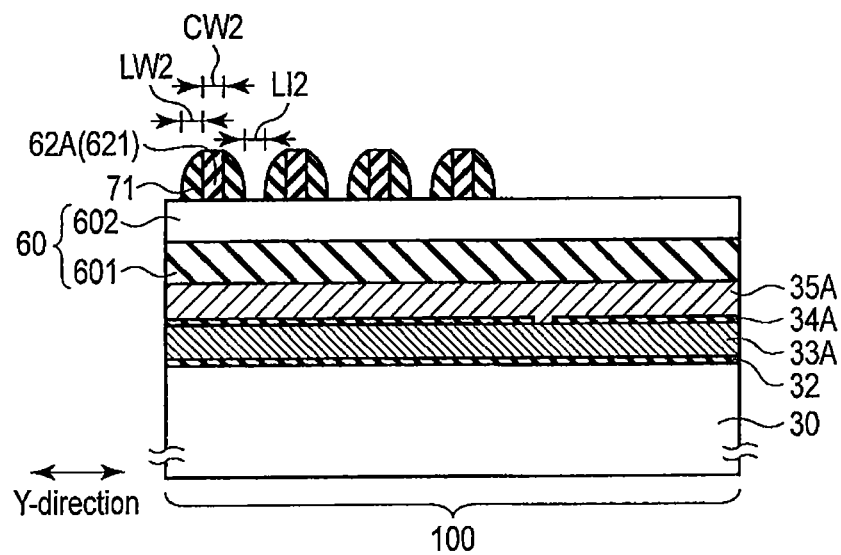
F I G. 5 9 A
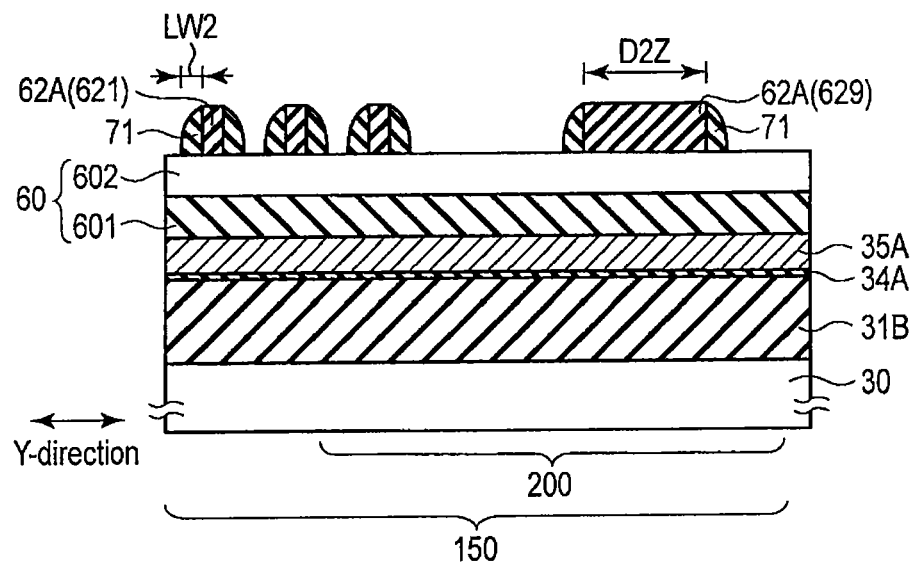
F I G. 5 9 B

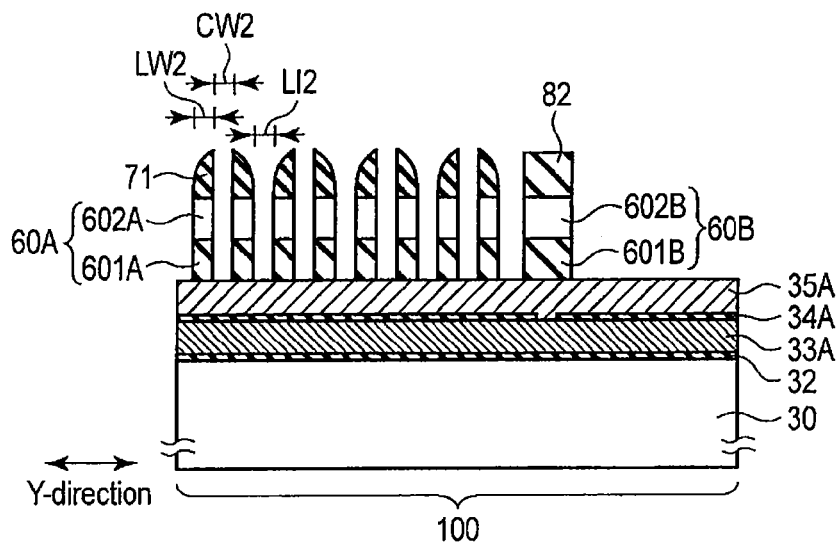
F I G. 6 1 A
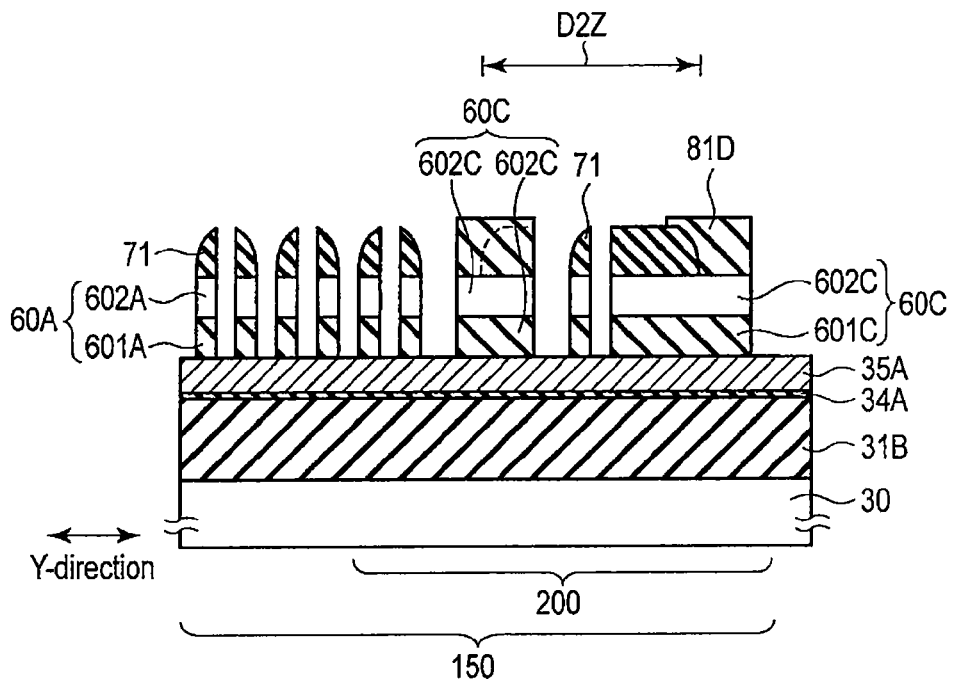
F I G. 6 1 B

METHOD OF MANUFACTURING A MEMORY DEVICE USING FINE PATTERNING TECHNIQUES

CROSS-REFERENCE TO RELATED APPLICATIONS

This application is based upon and claims the benefit of priority from Japanese Patent Application No. 2011-286861, filed Dec. 27, 2011, the entire contents of which are incorporated herein by reference.

FIELD

Embodiments described herein relate generally to a method of manufacturing a semiconductor device.

BACKGROUND

With an increasingly smaller chip size and a denser element of a semiconductor device, the formation of an interconnect pattern smaller than a critical dimension of the resolution of photolithography is demanded. The sidewall transfer technology is known as a technology to form a fine interconnect pattern. According to the sidewall transfer technology, a pattern having a dimension smaller the critical dimension (a line width or pitch) of the resolution of photolithography can be formed.

A technique to form a pattern having a dimension less than ¼ critical dimension of the resolution of photolithography by repeating a sidewall transfer process a plurality of times is also proposed.

For example, a line & space pattern like a pattern of a memory cell array of a flash memory is formed by the sidewall transfer technology. A contact pattern (a pad or fringe) is formed so as to be connected to a line pattern (interconnect) led from a memory cell array in a region to connect a peripheral circuit and the memory cell array. The dimension of the contact pattern is preferably larger than the dimension (line width) of the line pattern.

However, it may be difficult to form a contact pattern having different dimensions from those of a line pattern in a process common to the formation of a line & space pattern in a manufacturing process to which the sidewall transfer technology to form a line & space pattern is applied.

BRIEF DESCRIPTION OF THE DRAWINGS

FIG. 1 is a schematic diagram showing an example of an overall configuration of a semiconductor device;

FIG. 4 is a plan view showing the structure of a semiconductor device according to a first embodiment;

FIGS. 5A, 5B, and 5C are sectional views showing the structure of the semiconductor device according to the first embodiment;

FIG. 6 is a plan view showing a process of a method of manufacturing the semiconductor device according to the first embodiment;

FIGS. 13A and 13B are sectional process drawings illustrating the method of manufacturing the semiconductor device according to the first embodiment;

FIGS. 15A and 15B are sectional process drawings illustrating the method of manufacturing the semiconductor device according to the first embodiment;

FIG. 20 is a plan view showing a process of the method of manufacturing the semiconductor device according to the first embodiment;

FIGS. 21A and 21B are sectional process drawings illustrating the method of manufacturing the semiconductor device according to the first embodiment;

FIGS. 22A and 22B are sectional process drawings illustrating the method of manufacturing the semiconductor device according to the first embodiment;

FIGS. 24A and 24B are sectional process drawings illustrating the method of manufacturing the semiconductor device according to the first embodiment;

FIGS. 27A and 27B are sectional views showing a process of the method of manufacturing the semiconductor device according to the second embodiment;

FIGS. 29A and 29B are sectional views showing a process of the method of manufacturing the semiconductor device according to the second embodiment;

FIGS. 31A and 31B are sectional views showing a process of the method of manufacturing the semiconductor device according to the second embodiment;

FIG. 32 is a plan view illustrating the structure of a semiconductor device according to a third embodiment;

FIG. 33 is a sectional view showing a process of the method of manufacturing the semiconductor device according to the third embodiment;

FIG. 34 is a plan view showing a process of the method of manufacturing the semiconductor device according to the third embodiment;

FIGS. 35A and 35B are sectional views showing a process of the method of manufacturing the semiconductor device according to the third embodiment;

FIG. 36 is a plan view showing a process of the method of manufacturing the semiconductor device according to the third embodiment;

FIGS. 37A and 37B are sectional views showing a process of the method of manufacturing the semiconductor device according to the third embodiment;

FIGS. 39A and 39B are sectional views showing a process of the method of manufacturing the semiconductor device according to the third embodiment;

FIGS. 44A and 44B are sectional views showing a process of the method of manufacturing the semiconductor device according to the fourth embodiment;

FIGS. 46A and 46B are sectional views showing a process of the method of manufacturing the semiconductor device according to the fourth embodiment;

FIG. 51 is a plan view showing a process of the method of manufacturing the semiconductor device according to the fifth embodiment;

FIGS. 52A and 52B are sectional views showing a process of the method of manufacturing the semiconductor device according to the fifth embodiment;

FIGS. 54A and 54B are sectional views showing a process of the method of manufacturing the semiconductor device according to the fifth embodiment;

FIGS. 55A and 55B are sectional views showing a process of the method of manufacturing the semiconductor device according to the fifth embodiment;

FIGS. 57A and 57B are sectional views showing a process of the method of manufacturing the semiconductor device according to the fifth embodiment;

FIG. 58 is a plan view showing a process of the method of manufacturing the semiconductor device according to the fifth embodiment;

FIGS. 59A and 59B are sectional views showing a process of the method of manufacturing the semiconductor device according to the fifth embodiment;

FIGS. 61A and 61B are sectional views showing a process of the method of manufacturing the semiconductor device according to the fifth embodiment.

DETAILED DESCRIPTION

[Embodiments]

Figure 2:
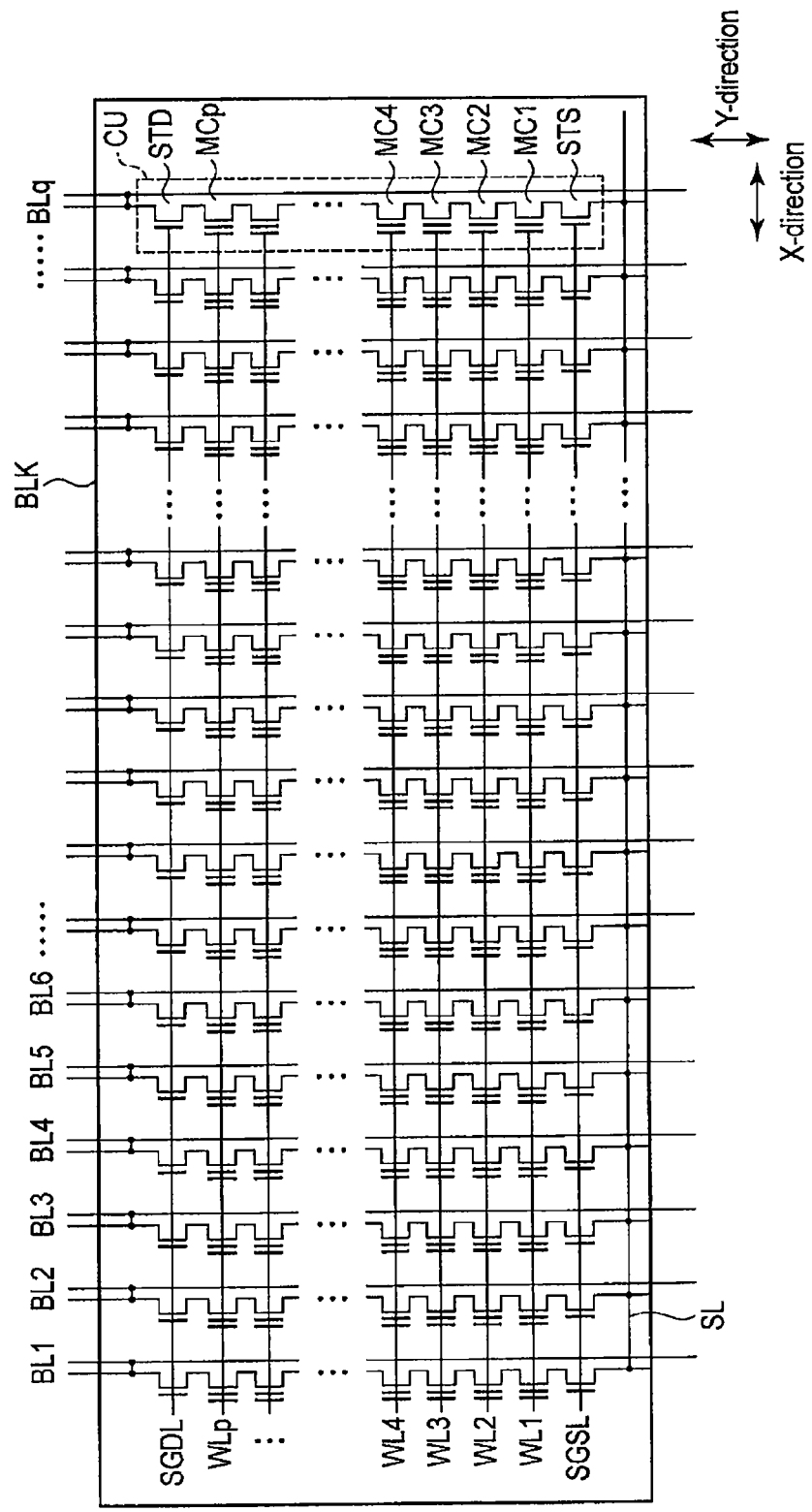
FIG. 2 is a schematic diagram showing an example of an internal configuration of the semiconductor device.

Each embodiment will be described in detail below with reference to the drawings. In the description that follows, the same reference numerals are attached to elements having the same function and structure and a duplicate description will be provided when necessary.

In general, according to one embodiment, a method of manufacturing a semiconductor device, includes forming a first layer to be processed on a first region and a second region of a semiconductor substrate; forming a first core material above the first layer, the first core material including a line portion extending in a first direction from the first region toward the second region and having a first line width in a second direction perpendicular to the first direction and a fringe connected to the line portion in the second region and having a first dimension larger than the first line width; forming a first sidewall film having the first line width on a side face of the first core material so as to surround the side face of the first core material; forming a first mask covering at least one of the fringe and the first sidewall film; removing the first core material so that a first remaining portion having a second dimension larger than the first line width is formed below the first mask, the first remaining portion including at least one of the first core material and the first sidewall film; forming a second sidewall film on the side face of a first pattern so as to surround the first pattern corresponding to a pattern of the first sidewall film and a pattern of the first remaining portion, the second sidewall film having a second line width equal to the first line width or less and facing each other with a first interval equal to the first line width or less in the first region and facing each other with a second interval larger than the first interval in the second region; and after the first pattern being removed, forming a plurality of interconnects having the second line width, adjacent to each other in the first region with the first interval, and adjacent to each other in the second region with the second interval by processing the first layer using the second sidewall film as a mask.

(1) First Embodiment

(a) Overall Configuration

An overall configuration example of a semiconductor device according to the first embodiment will be described by using FIGS. 1 and 2. FIG. 1 is a block diagram showing principal units of the semiconductor device according to the present embodiment.

The semiconductor device according to the present embodiment is, for example, a semiconductor memory. However, the semiconductor device according to the present embodiment is not limited to the semiconductor memory.

A memory cell array 100 includes a plurality of memory cells (memory devices). The memory cell array 100 stores data from outside.

The configuration of the memory cell array 100 will be described using FIG. 2 by taking a flash memory as an example. In a NAND flash memory, for example, a plurality of blocks as a control unit are provided in the memory cell array 100. FIG. 2 shows an equivalent circuit diagram of one block BLK in the memory cell array 100.

One block BLK includes a plurality of memory cell units CU aligned in an X direction (row direction). In one block BLK, for example, q memory cell units CU are provided.

One memory cell unit CU includes a memory cell string formed of a plurality (for example, p) of memory cells MC1 to MCp, a first select transistor STS (hereinafter, called the source-side select transistor) connected to one end of the memory cell string, and a second select transistor STD (hereinafter, called the drain-side select transistor) connected to the other end of the memory cell string. In the memory cell string, a current path of the memory cells MC1 to MCp is connected in series along a Y direction (column direction).

A source line SL is connected to one end (source side) of the memory cell unit CU, that is, one end of the current path of the source-side select transistor STS. A bit line is connected to the other end (drain side) of the memory cell unit CU, that is, one end of the current path of the drain-side select transistor STD.

The number of memory cells forming one memory cell unit CU may be 2 or greater and may be, for example, 16, 32, or 64 or more. The memory cells MC1 to MCp are simply denoted as the memory cell MC when the memory cells MC1 to MCp are not to be distinguished below. Likewise, the source-side and drain-side select transistors STD, STS are simply denoted as the select transistor ST when the source-side and drain-side select transistors STD, STS are not to be distinguished.

The memory cell MC is a field effect transistor of a stack gate structure having a charge storage layer capable of holding charges. In the memory cell MC, the threshold of the transistor changes depending on the amount of charges in the charge storage layer. Data to be stored and the threshold voltage of the transistor are associated in the memory cell MC.

The source/drains are connected in two memory cells MC adjacent in the Y direction. Accordingly, the current path of the memory cells MC is connected in series to form a memory cell string.

The drain of the source-side select transistor STS is connected to the source of the memory cell MC1. The source of the source-side select transistor STS is connected to the source line SL. The source of the drain-side select transistor STD is connected to the drain of the memory cell MCp. The drain of the drain-side select transistor STD is connected to one bit line BLq. The number of bit lines BL1 to BLq allocated to the block BLK is equal to the number of memory cell units CU in the block BLK.

Word lines WL1 to WLp extend in the X direction and each of the word lines WL1 to WLp is commonly connected to gates of a plurality of memory cells MC arranged along the X direction. In one memory cell unit CU, the number of word lines WL1 to WLp is equal to the number (p) of memory cells in one memory cell string.

A drain-side select gate line SGDL extends in the X direction and is commonly connected to gates of a plurality of drain-side select transistors STD arranged along the X direction. A source-side select gate line SGSL extends in the X direction and is commonly connected to gates of a plurality of source-side select transistors STS arranged along the X direction.

The word lines WL1 to WLp are simply denoted as the word line WL when the word lines WL1 to WLp are not to be distinguished below and the bit lines BL1 to BLq are simply denoted as the bit line BL when the bit lines BL1 to BLq are not to be distinguished. Likewise, the source-side and drain-side select gate lines SGSL, SGDL are simply denoted as the select gate line SGL when the source-side and drain-side select gate lines SGSL, SGDL are not to be distinguished.

A row control circuit (for example, a word line driver) 101 controls the row of the memory cell array 100. The row control circuit 101 drives the word line WL to access the selected memory cell based on an address signal from an address buffer 102.

A column decoder 103 selects a column of the memory cell array 100 based on an address signal from the address buffer 102 and drives the selected bit line BL.

A sense amplifier 104 detects and amplifies potential fluctuations of the bit line BL. Also, the sense amplifier 104 temporarily holds data read from the memory cell array 100 and data to be written into the memory cell array 100.

A well/source line potential control circuit 105 controls the potential in a well region in the memory cell array 100 and the potential of the source line SL.

A potential generator 106 generates a voltage applied to the word line WL when data is written (programmed), data is read, or data is erased. The potential generator 106 also generates a potential applied to, for example, the select gate line SGL, the source line SL, and the well region in a semiconductor substrate. The potential generated by the potential generator 106 is input to the row control circuit 101 and apply to each of the select word line WL, the non-select word line WL, and the select gate line SGL.

A data input/output buffer 107 act as a data input/output interface. The data input/output buffer 107 temporarily holds data input from outside. The data input/output buffer 107 temporarily holds data output from the memory cell array 100 and outputs the held data to the outside at a predetermined timing.

A command interface 108 determines whether data input into the data input/output buffer 107 is command data (command signal). If data input into the data input/output buffer 107 includes command data, the command interface 108 transfers the command data to a state machine 109.

The state machine 109 controls the operation of each circuit in a flash memory in accordance with a request from outside.

(b) Structure

The structure of a semiconductor device (for example, a flash memory) according to the present embodiment will be described with reference to FIGS. 3 to 5C.

An example of the interconnect layout of a semiconductor device (for example, a flash memory) according to the present embodiment will be described by using FIG. 3.

Figure 3:
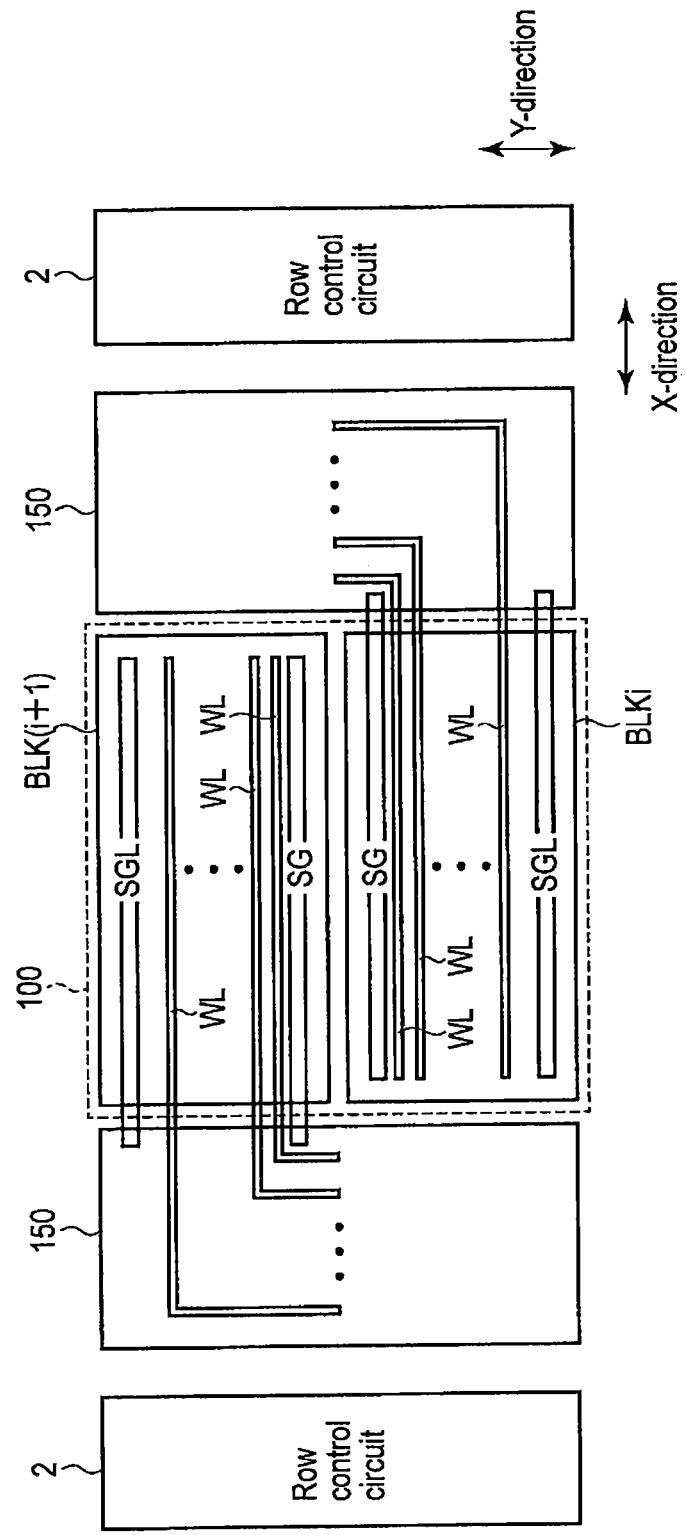
FIG. 3 is a schematic diagram showing an example of a plane layout of the semiconductor device.

FIG. 3 is a diagram schematically showing a physical relationship between the memory cell array 100 and the row control circuit 101 and a leading region 150 arranged on the periphery of the memory cell array 100.

The memory cell array 100 is constituted of a plurality of blocks arranged by being aligned in the Y direction (column direction). To simplify the description, two blocks BLKi, BLK(i+1) are shown in FIG. 3. However, the number of blocks in the memory cell array 100 is not limited to 2.

A plurality of word lines WL are provided in the blocks BLKi, BLK(i+1). Two select gate lines SGL are arranged at one end and the other end in the Y direction of each of the blocks BLKi, BLK(i+1) so as to sandwich the word line WL in each of the blocks BLKi, BLK(i+1). In each of the blocks BLKi, BLK(i+1), one of the two select gate lines SGL is the select gate line SGL of the source-side select transistor and the other select gate line SGL is the select gate line SGL of the drain-side select transistor.

In the example shown in FIG. 3, the leading region 150 is provided at one end and the other end of the memory cell array 100. In this case, the word lines WL in the two blocks BLKi, BLK(i+1) adjacent to each other are led into the leading regions 150 on the opposite sides.

The pitch (line width of the interconnect and the interval between interconnects) of interconnects in the memory cell array 100 is different from the pitch (line width of the interconnect and the interval between interconnects) of interconnects of peripheral circuits such as the row control circuit 101. Thus, as shown in FIG. 3, the leading region (also called a hookup region) 150 to convert the line width of the interconnect and the interval of interconnects is provided between the memory cell array 100 and the row control circuit 101.

In the example shown in FIG. 3, the word lines WL as a whole surround the two select gate lines SGL present on the boundary side of the two blocks BLKi, BLK(i+1). The plurality of word lines WL extends in the X direction in the memory cell array 100. The end of the plurality of word lines WL are bent in the leading region 150 to the boundary side (Y direction, downward or upward in FIG. 3) of the two blocks BLKi, BLK(i+1).

As shown in FIG. 3, the plurality of word lines WL are separated at an end of the memory cell array 100 or in the leading region 150 to ensure independence of each word line WL.

In the leading region 150, a contact plug (contact hole) is connected to the word line WL, for example, between the position where the word line WL is bent and the tip thereof. The contact plug (not shown) is arranged on a contact portion (not shown) provided in the leading region 150. The contact portion is connected to the word line WL in the leading region 150. The contact portion is formed of the same member (material) as the word line WL. The contact portion may also be called a pad or fringe below. Also, a portion of a word line in the leading region 150 may be called a leading line.

A region (hereinafter, called a dummy cell region) including dummy cells that do not function as memory cells may be provided between the memory cell array 100 and the leading region 150. In the present embodiment, the illustration of the dummy cell region is omitted.

FIGS. 4 to 5C are diagrams showing the structure of the flash memory according to the present embodiment.

FIG. 4 is a plan view showing a planar structure of the flash memory according to the present embodiment. FIGS. 5A to 5C are sectional views showing a section structure of the flash memory according to the present embodiment. FIG. 5A is a sectional view along a Va-Va line in FIG. 4. FIG. 5B is a sectional view along a Vb-Vb line in FIG. 4. FIG. 5C is a sectional view along a Vc-Vc line in FIG. 4.

In FIGS. 4 to 5C, a portion of the structure of the memory cell array 100 and the leading region 150 is shown. In FIGS. 4 and 5, the select gate line SGL on one side of the memory cell unit, the select transistor ST connected to the select gate line SGL, the word line WL, and the memory cell MC connected to the word line WL are illustrated.

As shown in FIGS. 4 to 5C, the memory cell MC and the select transistor ST are provided on a semiconductor substrate 30 on which a well region (not shown) is formed.

As shown in FIGS. 5A and 5C, the memory cell MC is arranged in the memory cell array 100. The memory cell MC is, as described above, a field effect transistor of a stack gate structure having a charge storage layer. The gate of the memory cell MC includes a charge storage layer 33 formed on a gate insulating film (tunnel insulating film) 32, an insulator (called an inter-gate insulating film or block insulating film) 34 formed on the charge storage layer 33, and a control gate electrode 35 formed on the insulator 34. In the example shown in FIGS. 5A and 5C, the charge storage layer 33 is formed by using, for example, conductive silicon. The silicon charge storage layer 33 is called the floating gate electrode 33. Incidentally, the charge storage layer 33 may be formed by using an insulating film (for example, silicon nitride) including a trap level for electrons. The insulator 34 may have a single-layer structure including one of silicon oxide, silicon nitride, and high permittivity insulating film (high-k film) or a multilayer structure including a plurality of these films.

In the memory cell array 100, as shown in FIG. 5C, an isolation insulating film 31A in an STI structure is embedded in the semiconductor substrate 30. Active regions AA are partitioned in the semiconductor substrate 30 by the isolation insulating film 31A. The active regions AA extend in the Y direction.

A plurality of the floating gate electrodes 33 arranged in the X direction are isolated by the isolation insulating film 31 for each memory cell MC.

The control gate electrode 35 extends in the X direction and is shared by a plurality of memory cells MC arranged in the X direction. The control gate electrode 35 is used as the word line WL.

A gate electrode of the select transistor ST has a structure similar to the stack gate structure of the memory cell MC. The gate electrode of the select transistor ST includes, for example, a first electrode layer 33S formed simultaneously with the charge storage layer 33, an insulator 34S formed simultaneously with the inter-gate insulating film 34, and a second electrode layer 35S formed simultaneously with the control gate electrode 35. In the select transistor ST, the first electrode layer 33S and the second electrode layer 35S are connected via an opening formed in the insulator 34S.

A plurality of the first electrode layers 33S arranged in the X direction are electrically isolated, like the floating gate electrodes 33, by the isolation insulating film 31A. The second electrode layer 35S extends, like the control gate electrode 35, in the X direction and is shared by a plurality of select transistors ST arranged in the X direction. The gate electrodes 33S, 35S of the select transistor ST are used as the select gate lines SGL.

Current paths of the memory cell MC and the select transistor ST are connected in series in the Y direction by, for example, a diffusion layer 39 formed in the semiconductor substrate 30. Two select transistors ST adjacent in the X direction share a diffusion layer 39S in the semiconductor substrate 30. The diffusion layers 39, 39S are used as a source and drain of each of the transistors MC, ST. A plurality of memory cells MC and select transistors ST whose current paths are connected in series via the diffusion layers 39, 39S form a memory cell unit.

A first inter-layer insulating film 51 is provided on the semiconductor substrate 30. The inter-layer insulating film 51 covers the gate electrode of the memory cell MC and the gate electrode of the select transistor ST. A contact plug CP1 is embedded in a contact hole formed in the inter-layer insulating 51. The contact plug CP1 is connected to the diffusion layer 39S of the select transistor ST. The diffusion layer 39S is connected to a first wiring layer (intermediate interconnect) 59A on the inter-layer insulating 51 via the contact plug CP1. The first wiring layer 59A is provided at a first interconnect level M0.

A second inter-layer insulating 52 is stacked on the first inter-layer insulating film 51. A third inter-layer insulating layer 53 is stacked on the second inter-layer insulating film 52.

If the diffusion layer 39S is shared with the drain-side select transistor STD, a second wiring layer BL provided at a second interconnect level M1 is connected as the bit line BL to the diffusion layer 39S via a via plug VP in the inter-layer insulating film 52, the first wiring layer 59A, and the contact plug CP1. The second wiring layer as the bit line BL extends in the Y direction. The contact plug CP1 connected to each bit line BL is electrically isolated for each memory cell unit arranged in the X direction.

If the diffusion layer 39S is shared with the source-side select transistor STS, the source line SL formed by using a wiring layer at the first interconnect level M0 is connected to the diffusion layer 39S.

As shown in FIGS. 5B and 5C, the control gate electrode 35 as the word line WL extends from in the memory cell array 100 into the leading region 150. Then, in the leading region 150, the word lines WL are separated from each other to ensure independence of each word line WL. The separation location of each word line WL is not limited to the location shown in FIG. 4.

The word line WL is connected to a pad 35P in the leading region 150. The pad 35P and the word line WL form a continuous conductive layer.

A contact plug CP2 is provided on the pad 35P so that the pad 35P and the contact plug CP2 are electrically connected. Accordingly, the word line to which the memory cell MC is connected is connected to the row control circuit.

To connect the word line WL and the row control circuit, for example, a wiring layer 59B at the first interconnect level M0 provided in the leading region 150 is used. The wiring layer 59B extending from the row control circuit is connected to the contact plug CP2 on the pad 35P. Incidentally, the word line WL may be connected to the row control circuit by further using a wiring layer positioned at the second interconnect level M1, which is the same level as that of the bit line BL.

In the leading region 150, as shown in FIG. 5C, an isolation insulating film 31B is provided, for example, in the semiconductor substrate 30. The isolation insulating film 31B is formed in the whole leading region 150. In the leading region 150, the word line WL and the pad 35P are provided on the isolation insulating film 31B.

To clarify the description below, a region 200 in the leading region 150 in which the pad (a fringe or contact portion) 35P and the contact plug CP2 are provided will also be called the contact formation region 200.

The gate electrode (second electrode layer) 35S of the select transistor ST as the select gate line SGL extends, for example, from in the memory cell array 100 into the leading region 150.

In the present embodiment, four (4") word lines WL are led into one of the contact formation regions 200 in the leading region 150 as a group formed by the manufacturing method described later. Among four word lines in one group, two word lines on the outer side (outer circumferential side) surround the word lines on the inner side (inner circumferential side).

The four pads 35P are provided in one of the contact formation regions 200 so as to correspond to one group of the word lines WL.

The pad 35P has, for example, rectangular (quadrangular) planar shape. Each word line WL extends from a vertex (corner) of the corresponding pad 35P. The planar shape of the pad 35P may be a quadrangular shape lacking corners, a quadrangular shape with round corners, a semicircular shape, an elliptic shape, or a circular shape. The side face of the word line WL is connected to the pad 35P.

A plurality of the pads 35P corresponding to the word lines WL of one group in the contact formation region 200 is laid out so that the pads 35P have a symmetric relation with respect to some center line (symmetry axis).

By adjusting the bending position of the word line WL led into the leading region 150, the position and size of the pad 35P and the contact plug CP2, the interval (pitch) between the pads 35P, and the interval between the contact plugs CP2 can be adjusted two-dimensionally (X-Y plane). For example, the layout of a plurality of the contact plugs CP2 and the pads 35P can be set by shifting in the X direction and the Y direction for each group formed by the word lines WL. Thus, the layout of the wiring layer to connect the word line WL and the row control circuit can be simplified.

The word lines WL have a line & space pattern in the memory cell array 100.

The line & space pattern shows a layout in which a line pattern (for example, a linear interconnect pattern, here a word line) and a space pattern (for example, an insulator pattern) between line patterns are alternately arranged in a predetermined period in a direction crossing an extending direction of the line pattern. For example, like the word lines WL, the layout of the active region AA of the memory cell array 100 and the device isolation region STI has a line & space pattern.

The word line WL corresponding to a line pattern in the memory cell array 100 has a certain line width (interconnect width) LW2. A line width LI2 of a space pattern, that is, an interval (interconnect interval, line interval) LI2 between adjacent word lines WL in the memory cell array 100 preferably has a size approximately equal to the line width LW2 of the word line WL in the memory cell array 100. For such a line & space pattern in the memory cell array 100, the half pitch of the word lines WL is substantially equal to the line width LW2 of the word line WL or the interconnect interval LI2 between the word lines WL. However, the size of the interval LI2 between the word lines WL may be different from the size of the line width LW2 of the word line WL.

The dimension of the memory cell MC in a channel length direction is substantially equal to the line width LW2 of the word line WL.

The word line WL is formed by using sidewall transfer technology (a sidewall formation process and a sidewall transfer process) in which patterning of interconnects based on a pattern of a sidewall film is performed. By repeating the formation of a sidewall film and the transfer of a pattern of the sidewall film a plurality of times, the word line WL is formed as a pattern smaller (finer) than a critical dimension (limit dimension) of a resolution of photolithography that is difficult to form accurately by patterning using an exposure device. In the present embodiment, the "critical dimension of the resolution of photolithography" indicates the critical dimension of the resolution of an optical system used to form patterns included in a periodical structure of, for example, a line & space pattern.

For example, the line width LW2 of the word line WL is formed to have a size about ¼ the critical dimension of the resolution of photolithography by the sidewall transfer process executed twice.

However, if the word line WL is formed in a size smaller than the critical dimension of the resolution of photolithography by the sidewall formation process and the sidewall transfer process executed a plurality of times (2n times) in a flash memory according to the present embodiment, the line width LW2 of the word line WL is not limited to the size of ¼ the critical dimension of the resolution of photolithography. In the present embodiment, for example, the line width LW2 of the word line (interconnect) WL may be formed in the range of ½ the critical dimension of the resolution of photolithography to ¼ the critical dimension of the resolution of photolithography or in the range of less than the critical dimension of the resolution of photolithography to ½ the critical dimension of the resolution of photolithography or more. The line width LW2 of the word line WL or the interconnect interval LI2 may be, such as when a word line is formed in a dimension smaller than ¼ the critical dimension of the resolution of photolithography, for example, a word line is formed by the sidewall transfer process executed four times, ¹⁄₁₆ the critical dimension of the resolution of photolithography.

If, as described above, the interval LI2 between the adjacent word lines WL has a dimension substantially the same as the line width LW2 of the word line WL in the memory cell array 100 including the interconnect layout of a line & space pattern, the interval LI2 between the word lines WL is set to a size about ¼ the critical dimension of the resolution of photolithography. If the interval LI2 between the word lines WL has substantially the same dimension as the line width LW2 of the word line WL, the interval LI2 between the word lines WL may be formed in the range of less than the critical dimension of the resolution of photolithography to ¼ less than the critical dimension of the resolution of photolithography or more, or in a dimension less than ¼ the critical dimension of the resolution of photolithography.

A dimension PD1 of the pad 35P in the X direction and a dimension PD2 of the pad 35P in the Y direction in the contact formation region 200 of the leading region 150 are set to a dimension larger than the line width LW2 of the word line WL. With the dimensions PD1, PD2 of the pad 35P set larger than the line width LW2 of the word line WL, contact resistance generated between the contact plug CP2 and the word line WL can be reduced and a contact failure between the contact plug CP2 and the word line WL caused by alignment shifts can be controlled.

A line width LWS of the select gate line SGL is larger than, for example, the line width LW2 of the word line WL. No pad is connected to the select gate line SGL and a contact plug (not shown) is provided on the select gate line SGL in the leading region 150.

In the flash memory according to the present embodiment, intervals D2X, D2Y between the word lines (leading lines) WL in the X direction and the Y direction in the contact formation region 200 of the leading region 150 respectively are larger than the interval LI2 between the word lines WL in the memory cell array 100. The intervals D2X, D2Y between the word lines WL in the X direction and the Y direction in the contact formation region 200 are larger than the line width LW2 of the word line WL. In the present embodiment, the intervals D2X, D2Y between the word lines WL in the X direction and the Y direction in the contact formation region 200 are larger than ¼ the critical dimension of the resolution of photolithography. For example, the intervals D2X, D2Y between the word lines WL in the contact formation region 200 may be ¼ the critical dimension of the resolution of photolithography or more. The intervals D2X, D2Y between the word lines WL in the contact formation region 200 are preferably equal to the critical dimension of the resolution of photolithography or more.

If the interval between the word lines WL near the formation position of the pad 35P is larger than the interval LI2 between the word lines WL in the memory cell array 100, the interval between the word lines WL in the entire leading region 150 (in the contact formation region 200) may not be larger than the interval LI2 between the word lines WL in the memory cell array 100.

For the bit lines BL of a line & space pattern, the relationship between the line width and the interconnect interval of the bit lines BL in the memory cell array 100 and the leading region in the Y direction may have the same relationship as the relationship between the line width LW2 of the word line WL and the interconnect intervals LI2, D2X, D2Y of the word lines WL in the memory cell array 100 and the leading region 150 in the X direction.

In a semiconductor device (for example, a flash memory) according to the present embodiment, interconnects (for example, word lines or bit lines) having a line & space pattern of dimensions smaller than the critical dimension of the resolution of photolithography are formed by the sidewall formation/transfer process executed a plurality of times.

The word line WL having a line & space pattern is formed by repeating a cycle of a process including the formation of a sidewall film for foundation processing and the transfer of a pattern of the sidewall 2n times (n is an integer equal to 1 or greater). The sidewall film formed in the (2n–1)-th cycle becomes a sacrificial film (also called a spacer) to form the 2n-th sidewall film. The pattern corresponding to the sidewall film formed in the 2n-th cycle is used as a pattern to form the word line WL.

Each of a plurality of word lines WL formed by the sidewall formation/transfer process executed a plurality of times (2n times) has, for example, the line width LW2 smaller than the critical dimension of the resolution of photolithography and the interconnect interval LI2 smaller than the critical dimension of the resolution of photolithography to be adjacent to each other in the memory cell array 100.

If the layout of the word line WL and the interconnect interval between the word lines WL in the contact formation region 200 of the leading region 150 are the same as the layout of the word line WL and the interconnect interval LI2 between the word lines WL in the memory cell array 100, it may become difficult to secure a space to form and arrange the pad 35P connected to the word line WL with increasingly finer structures of elements and interconnects.

The position of bending between the X direction and the Y direction of a word line in the leading region 150 and the size of the interval D2X in the X direction between the interconnects WL in the contact formation region 200 are adjusted by the size and formation position of a fringe of a core material (sacrificial film) to form a sidewall film in the (2n–1)-th sidewall formation process. Accordingly, the interval D2X in the X direction between the interconnects WL adjacent to each other in the X direction in the contact formation region 200 is guaranteed to be larger than at least one of the line width LW2 of the interconnect and the interval LI2 between the interconnects WL in the memory cell array 100.

In a semiconductor device according to the present embodiment including an interconnects formed by the sidewall formation/transfer process executed 2n times, a mask is formed by photolithography so as to cover a sidewall film ((2n−1)-th sidewall film) formed by the (2n−1)-th sidewall formation/transfer process in the contact formation region 200 of the leading region 150 during the manufacturing process thereof. The dimension of the mask covering the sidewall film is larger than the dimension (line width) of the sidewall film. While a sidewall film by the 2n-th process is formed on the side face of a pattern corresponding to the sidewall film formed in the (2n−1)-th sidewall formation/transfer process in the memory cell array 100, a sidewall film (2n-th sidewall film) by the 2n-th process is formed on the side face of a pattern corresponding to the mask covering the sidewall film in the contact formation region 200 of the leading region 150. The line width of the 2n-th sidewall film is equal to the line width of the (2n−1)-th sidewall film or less. Accordingly, the interval D2Y in the Y direction between the interconnects WL near the pad formation position of the interconnect WL adjacent to each other in the Y direction (the direction in which the word line is bent, the direction parallel to the boundary side of a block) in the contact formation region 200 is guaranteed to be larger than at least one of line width LW2 of the interconnect and the interval LI2 between the interconnects WL in the memory cell array 100.

Thus, as a result of being able to secure in the leading region 150 the interconnect intervals D2X, D2Y larger than in the memory cell array 100, a semiconductor device according to the present embodiment can secure a space to arrange the pad 35P and a mask to form the pad 35P and a space to increase a processing margin of the pad 35P and the mask in the leading region 150. Also, a semiconductor device according to the present embodiment can secure the intervals D2X, D2Y that prevent the pad 35P connected to each interconnect WL from coming into contact with (short-circuiting) other members in the leading region 150.

Therefore, a semiconductor device according to the present embodiment can make the line width of an interconnect and the interconnect interval (pitch) finer and can also reduce failures caused by the short of the interconnect WL, the pad 35P, or the contact plug CP2.

Moreover, the dimensions PD1, PD2 of the pad 35P connected to the interconnect WL can be increased by being able to increase the intervals D2X, D2Y between the interconnects WL in the leading region 150. As a result, a contact area of the pad 35P and the contact plug CP2 can be increased and contact resistance between the pad 35P and the contact plug CP2 can be reduced.

Therefore, according to a semiconductor device in the first embodiment, the reliability of the semiconductor device including a fine pattern can be improved without using complex manufacturing processes.

(c) Manufacturing Method

The method of manufacturing a semiconductor device (for example, a flash memory) according to the first embodiment will be described with reference to FIGS. 4 to 24B.

Figure 7A:
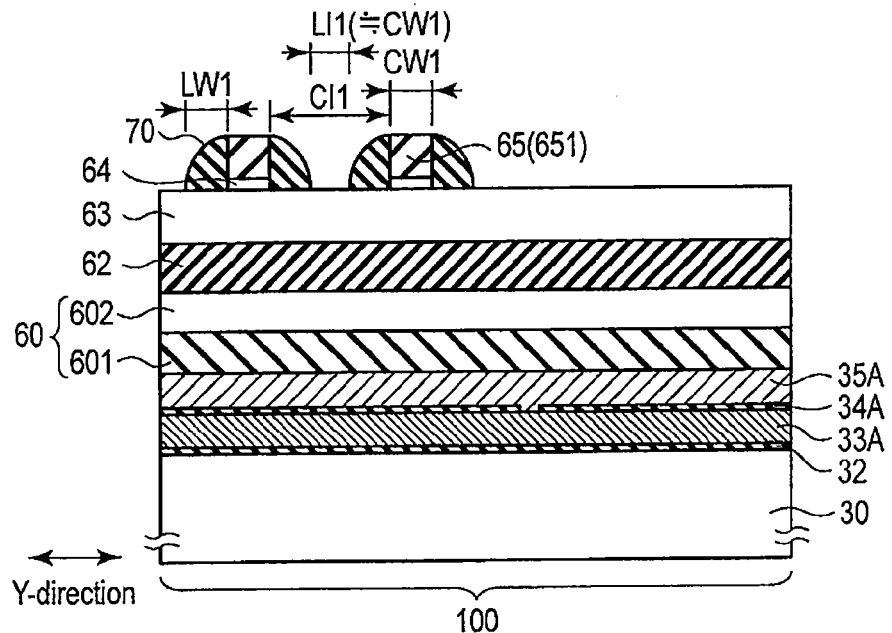
FIGS. 7A and 7B are sectional process drawings showing a process of the method of manufacturing the semiconductor device according to the first embodiment.
Figure 7B:
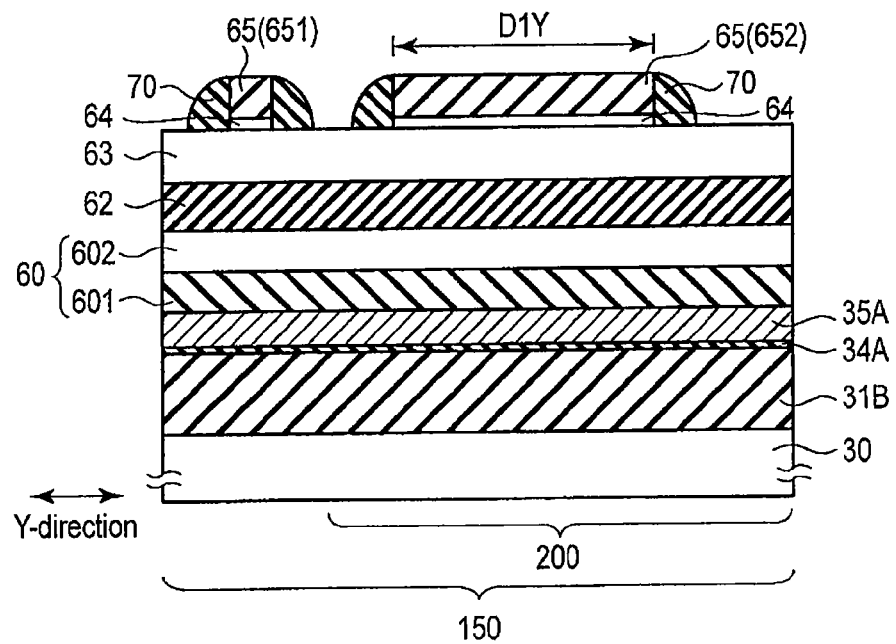
Figure 8:
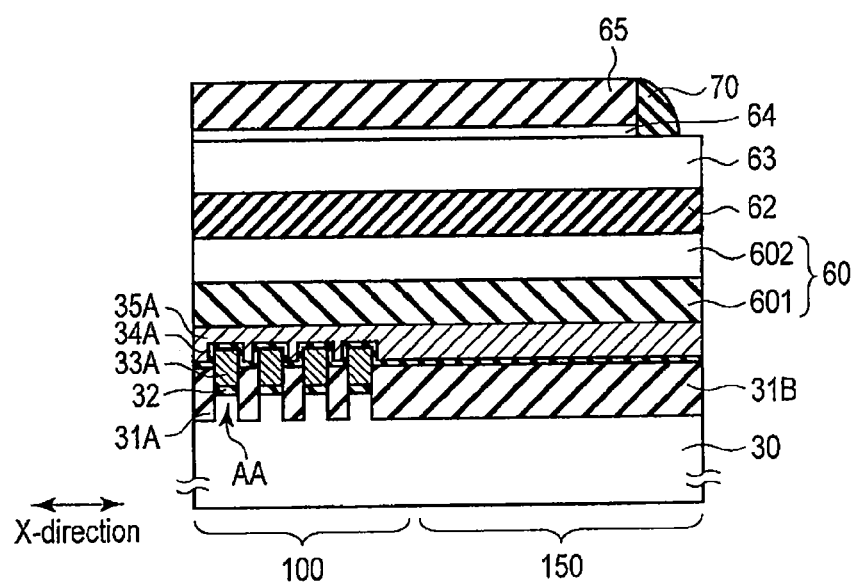
FIG. 8 is a sectional process drawing showing a process of the method of manufacturing the semiconductor device according to the first embodiment.

A process of the method of manufacturing a flash memory according to the present embodiment will be described using FIGS. 6 to 8. FIG. 6 shows a plan view of a portion of a memory cell array and a leading region in a process of the method of manufacturing a flash memory according to the present embodiment. FIGS. 7A and 7B show sectional process drawings corresponding to FIG. 6. FIG. 7A shows a sectional process drawing along a VIIa-VIIa line in FIG. 6. FIG. 7B shows a sectional process drawing along a VIIb-VIIb line in FIG. 6. FIG. 8 shows a sectional process drawing along a VIII-VIII line in FIG. 6.

As shown in FIGS. 6 to 8, the insulating film 32 (for example, silicon oxide) is formed on the semiconductor substrate 30 on which a well region (not shown) is formed in the memory cell array 100. The insulating film 32 is formed by, for example, thermal oxidation of the silicon substrate. The insulating film 32 is used as the gate insulating film (tunnel insulating film) of a memory cell or the gate insulating film of a select transistor. A first conductive layer (for example, polysilicon) 33A is formed on the insulating film 32 by a CVD (Chemical Vapor Deposition) method. The conductive layer 33A on the insulating film 32 is used as the floating gate electrode of a memory cell or the gate electrode (first electrode layer) of a select transistor. Instead of polysilicon, an insulating film including a trap level of charges (electrons) such as silicon nitride may be formed on the insulating film 32.

Then, a mask layer (not shown) is formed on the conductive layer 33A. Subsequently, a predetermined pattern for the mask layer on the conductive layer 33A is formed by photolithography or sidewall transfer technology. The mask layer is processed by, for example, RIE (Reactive Ion Etching). Accordingly, the mask layer (not shown) having a line & space pattern extending in the Y direction is formed on the conductive layer 33A in the memory cell array 100. For example, the mask layer is removed by RIE in the leading region 150 and an upper surface of the conductive layer 33A is exposed.

Based on the mask layer of the line & space pattern, the conductive layer 33A, the insulating film 32, and the semiconductor substrate 30 are processed by, for example, RIE. Accordingly, in the memory cell array 100, an isolation trench extending in the Y direction is formed in the memory cell array 100. The isolation trench in the memory cell array 100 has an STI (Shallow Trench Isolation) structure. The processed conductive layer and a semiconductor region AA below extend in the Y direction. In the leading region 150, the conductive layer and the insulating film are removed by RIE to form a trench (groove).

Then, in the memory cell array 100 and the leading region 150, the insulating films 31A, 31B are formed on the semiconductor substrate 30 in such a way that the trench is filled. Accordingly, in the memory cell array 100, the isolation insulating film 31A is embedded in the isolation trench to partition device formation regions (active regions) AA in which memory cells are arranged. A line & space pattern of the device isolation region (isolation insulating film) STI and the device formation region (semiconductor region) AA is formed on the surface layer of the semiconductor substrate 30 in the memory cell array 100. Also, the trench of the leading region 150 is filled with the isolation insulating film 31B.

As in the interior of the memory cell array 100, the isolation insulating film and semiconductor region in a line and space pattern may also be formed in the leading region 100.

The mask layer on the conductive layer 33A is selectively removed. The mask layer, the conductive layer 33A, and the insulating film 32 may be processed or removed by using wet etching or ashing.

After the mask layer on the conductive layer 33A is removed, the insulator 34 in a single-layer structure or multilayer structure is formed on the conductive layer 33A by, for example, the CVD method, ALD (Atomic Layer Deposition)

method, or chemical reaction treatment (oxidation treatment, nitriding treatment, or radical treatment of the above treatment) of the conductor. The insulator 34 is used as the inter-gate insulating film of memory cells or block insulating film. Openings (slits) are formed in the insulating film 34 in the formation region of the select gate line so that the upper surface of the conductive layer 33A is exposed.

A second conductive layer 35A is formed on the insulator 34. One of silicon (for example, polysilicon), silicide, and polycide (stacked material of polysilicon and silicide) is used for the conductive layer 35A. However, the conductive layer 35A may be a metal (a single element metal or alloy). The conductive layer 35A is used as the control gate electrode (word line WL) of a memory cell or the gate electrode (select gate line) of a select transistor.

Formation members of the memory cell and select transistor are formed, as described above, on the semiconductor substrate 30. A member to form an interconnect (such as a word line, select gate line, and gate electrode) or a device (such as a memory cell and transistor) may also be called a processed layer (a first layer to be processed) below.

A mask layer 60 is formed on the conductive layer 35A. The mask layer 60 has, for example, a stacked structure. The mask layer 60 in a stacked structure includes, for example, an insulating film 601 on the conductive layer 35A and a semiconductor film 602 on the insulating film 601. The insulating film 601 in the mask layer 60 in a stacked structure is formed of, for example, a silicon oxide and the semiconductor film 602 is formed of, for example, a silicon film (more specifically, amorphous silicon film). The mask layer 60 on the conductive layer 35A may have a single-layer structure. As the material of the mask layer 60, silicon nitride, silicon carbide, silicon oxynitride, polysilicon, or silicon containing organic substance may be used depending on the material stacked on the mask layer 60.

A lower-layer core material 62 is stacked on the mask layer 60. The lower-layer core material 62 is formed of, for example, an insulator. The insulator as the lower-layer core material 62 is, for example, a silicon oxide.

An intermediate layer 63 is stacked on the lower-layer core material 62. The intermediate layer 63 is formed of, for example, a silicon nitride.

For example, an antireflection film 64 is deposited on the intermediate layer 63. In the present embodiment, a BARC (Bottom Anti-Reflection Coating) film is used as the antireflection film 64. The antireflection film 64 is formed by using, for example, a film (carbon compound film) containing a carbon or carbon film.

The BARC film 64 may not be deposited on the intermediate layer 63 depending on the layer (for example, an upper-layer core material described later) stacked on the layer below (here, the intermediate layer 63).

A plurality of upper-layer core materials 65 is formed on the BARC film 64. For example, a resist material (resist film) is used as the upper-layer core material 65. However, depending on the material of the layer below and the material a sidewall film formed for the upper-layer core material, the upper-layer core material 65 may be formed of a material selected from silicon, silicon oxide, silicon nitride, and silicon carbide. If the upper-layer core material 65 is formed of a material other than the resist material, the antireflection film 64 may not be used and the upper-layer core material 65 can be formed of the selected material alone. The upper-layer/lower-layer core materials 65, 62 may be called sacrificial layers.

Materials of the layers 60, 62, 63, 64, 65 stacked on the processed layers are not specifically limited if the layers are stacked in a combination according to which a processing selection ratio (hereinafter, also called an etching selection ratio or etching selectivity) allowing members on one side to be preferentially processed (etching or removal) between adjacent layers is secured and the combination of the above materials may be changed and stacked when appropriate.

The upper-layer core material 65 is processed by photolithography and etching so that a plane pattern having a line portion (also called a straight portion) 651 in a straight line and a fringe 652 connected to the line portion 651 is formed. Photolithography is performed by using, for example, immersion exposure technology using an ArF laser. The critical dimension of the resolution of photolithography based on the immersion exposure technology, for example, the minimum half pitch of the formed interconnect is represented by k1× (λ/NA). "λ" is the wavelength (exposure wavelength) of the light source used for photolithography, "NA" is the numerical aperture of a lens of an exposure device, and "K1" is a process parameter (process difficulty) in photolithography.

As shown in FIGS. 6 and 8, the line portion 651 of the upper-layer core material 65 extends from in the memory cell array 100 into the leading region 150 along the X direction.

The fringe (hereinafter, also called a projection portion or projection pattern) 652 of the upper-layer core material 65 is formed in the contact formation region 200 of the leading region 150 so as to project from the side face of the line portion 651 toward the Y direction in a direction parallel to the surface of the semiconductor substrate. For example, the fringe 652 projects toward the boundary side between adjacent blocks. The fringe 652 is patterned to have a rectangular (quadrangular) planar shape. A maximum dimension D1Y of the fringe 652 in a direction (here, the Y direction) parallel to the width direction of the line portion 651 is larger than a line width CW1 of the line portion 651. A dimension D1X of the fringe 652 in the X direction is larger than the line width CW1 of the line portion 651.

The planar shape of the fringe 652 may be a quadrangular shape lacking corners, a quadrangular shape with round corners, an elliptic shape, or a circular shape.

In the present embodiment, a planar structure in which, such as a plane pattern of the upper-layer core material 65, the fringe 652 having a dimension larger than the dimension (line width) of the line portion 651 is connected to the line portion 651 is called a flag structure. The upper-layer core material 65 becomes a base pattern to set the layout of interconnect (for example, word lines) in the memory cell array 100 and the leading region 150. Wires formed from the common core material in a flag structure by subsequent processes forms a group in the contact formation region. In the present embodiment, four word lines are formed as a group by the sidewall formation/transfer process executed twice based on one core material in a flag structure.

After a plurality of the upper-layer core materials 65 in a flag structure being formed, slimming processing (also called trimming processing) is performed on the upper-layer core materials 65. The slimming processing on the upper-layer core materials 65 is performed by, for example, dry etching. The line width CW1 of the line portion 651 is made smaller by the slimming processing than the line width CW1 of the line portion 651 before the slimming processing. For example, the line width CW1 of the line portion 651 after the slimming processing is slimmed to about half the line width CW1 of the line portion 651 before the slimming processing.

If the upper-layer core material 65 is patterned in the critical dimension of the resolution of photolithography, the line width CW1 of the line portion 651 of the upper-layer core material 65 is slimmed to about half (½) the critical dimension of the resolution of photolithography by the slimming processing.

For example, the line width of the line portion 651 of the upper-layer core material 65 and the interval (space) between the line portions 651 before the slimming processing are each set to about 80 nm. The line width CW1 of the line portion 651 is set to about 40 nm and the interval CI1 between the line portions 651 adjacent to each other in the X direction is set to about 120 nm by the slimming processing. The values of the line width and the interval of the upper-layer core material 65 illustrated here are only an example and if a line & space pattern is formed by the line portion 651 of the upper-layer core material, the values of the line width and the interval may be larger than above values or smaller than above values. The line width of the line portion 651 of the core material and the interval between the line portions 651 before the slimming processing of the core material 65 may be set to different sizes.

The fringe 652 of the upper-layer core material 65 is exposed to the same conditions as those for slimming processing on the line portion 651 and thus, the size of the fringe 652 also decreases by a magnitude corresponding to an amount by which the line portion 651 is slimmed. However, the size relation between the line width of the line portion 651 and the dimension of the fringe 652 is also maintained after the slimming processing and the dimension D1Y in the Y direction of the fringe 652 is larger than the line width CW2 of the line portion 651. The dimension of the fringe 652 after the slimming processing is preferably larger than the critical dimension of the resolution of photolithography, but may also be equal to the critical dimension of the resolution of photolithography or less.

For example, the exposed BARC film (carbon film) 64 is exposed to etching conditions for patterning or slimming processing of the upper-layer core material 65 and thus processed (removed) during etching of the upper-layer core material 65.

After the upper-layer core material 65 being slimmed, a material (hereinafter, called a sidewall material) to form a sidewall is deposited on the upper-layer core material 65 (and on the side face of the BARC film 64). A different material from the material of the upper-layer core material is used for the sidewall material so that the etching selectivity (processing selection ratio) is secured and the sidewall material is formed of, for example, a silicon oxide. It is preferable to deposit a film by using the ALD (Atomic Layer Deposition) method to form a film with good coverage. Incidentally, a silicon nitride or other materials may be used for the sidewall material if the etching selectivity of the upper-layer core material 65 and the foundation member can be secured.

Etch-back of the sidewall material is performed in such a way that the sidewall material remains on the side face of the upper-layer core material 65. Accordingly, a sidewall film 70 is self-aligningly formed on the side face of the upper-layer core material 65 in a flag structure. The sidewall film 70 is formed by extending over the memory cell array 100 and the leading region 150 so as to have a closed loop shape surrounding the upper-layer core material 65.

The time and strength of the etch-back of the sidewall material is controlled so that the line width LW1 of the sidewall material remaining on the side face of the upper-layer core material 65 has approximately the same dimension as the line width CW1 of the upper-layer core material 65 in the memory cell array 100. For example, the line width LW1 of the sidewall material 70 is changed to about half (½) the critical dimension of the resolution of photolithography. In the present embodiment, the line width LW1 of the sidewall material 70 is set to about 40 nm. It is assumed below that the line width (film thickness) of the sidewall film is the maximum dimension of the sidewall film or the dimension at the bottom of the sidewall film in a direction parallel to the surface of the semiconductor substrate.

In the memory cell array 100, the interval LI1 between the sidewall materials 70 adjacent in the Y direction without sandwiching the upper-layer core material 65 therebetween is preferably about the same size (here, about 40 nm) as the line width LW1 of the sidewall material 70 or the line width CW1 of the line portion 651 of the upper-layer core material 65.

In the memory cell array 100, the sidewall film 70 has a linear plane pattern (line pattern) extending in the X direction.

In the leading region 150, the plane pattern of the sidewall film 70 changes depending on the shape of the upper-layer core material 65 in a flag structure. In the present embodiment, in the leading region 150, the sidewall film 70 is bent from the X direction to the Y direction (boundary side of blocks) or from the Y direction to the X direction by the fringe 652 connected to the line portion 651.

In the sidewall films 70 in a closed loop shape formed for the one upper-layer core material 65, the interval between the sidewall films 70 opposed across the fringe 652 corresponds to the size of the fringe 652 and is larger than the line width LW1 of the sidewall film 70. A portion of the sidewall films 70 opposed across the fringe 652 in the Y direction has the interval D1Y larger than the intervals LI1, CW1 between the sidewalls 70 in the memory cell array 100. The interval D1Y of the portion of the sidewall films 70 opposed across the fringe 652 is, for example, the critical dimension of the resolution of photolithography or more.

The interval between the sidewall films 70 formed on the respective fringes 652 adjacent to each other in the leading region 150 is preferably equal to the intervals LI1, CW1 between the sidewalls films 70 in the memory cell array 100 or more.

As described above, the sidewall film 70 used for the formation of interconnects is formed on the side face of the upper-layer core material 65 by the sidewall formation process including deposition of the sidewall material on the core material (sacrificial layer) and etch-back of the sidewall material.

The first sidewall film formed by the first sidewall formation process becomes a member to form a pattern of the core material for a sidewall film formed by the second sidewall formation process described later. To clarify the description below, the sidewall film 70 formed by the first sidewall formation process may be called the sidewall spacer 70.

Figure 9:
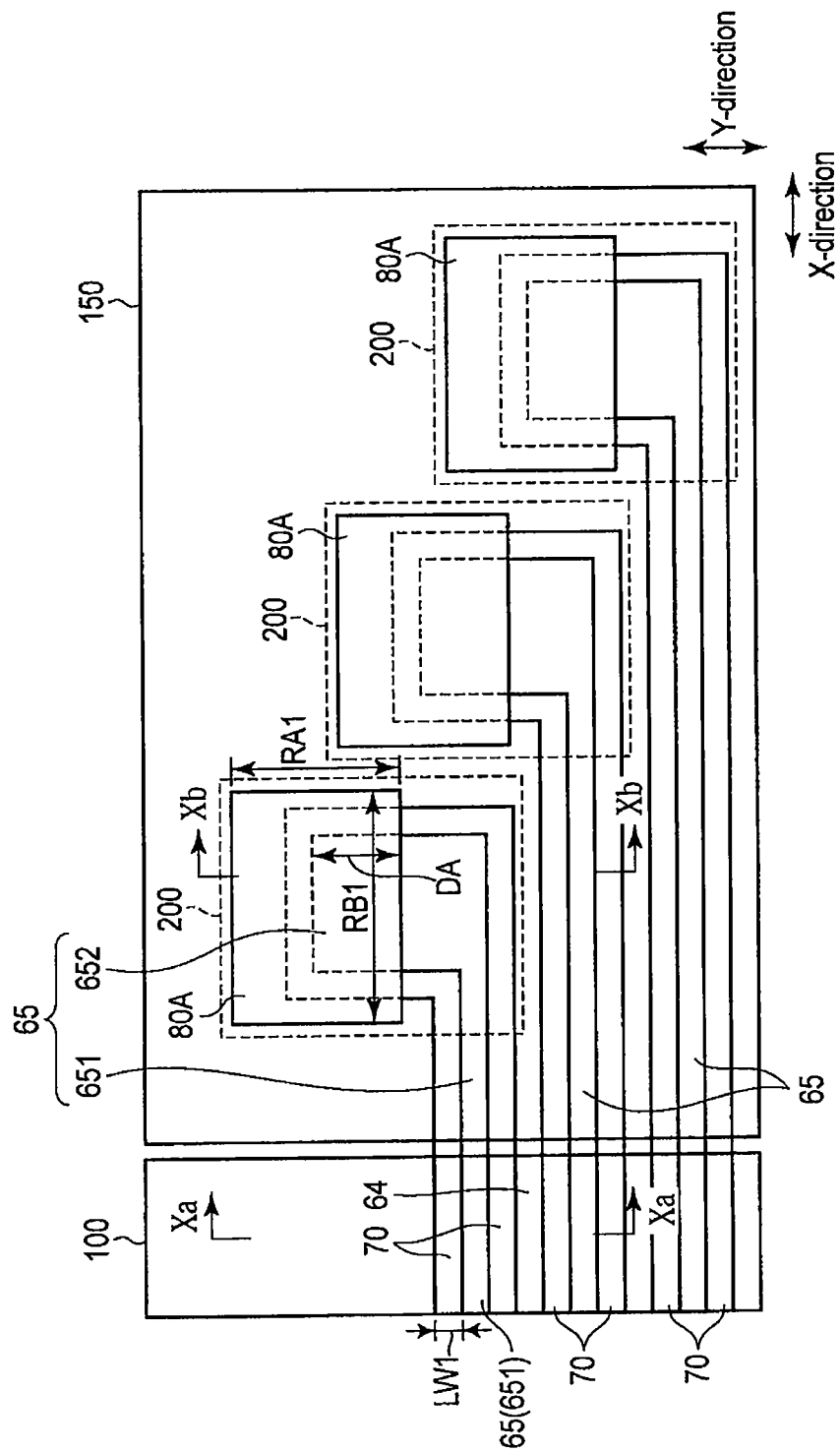
FIG. 9 is a plan view showing a process of the method of manufacturing the semiconductor device according to the first embodiment.
Figure 10A:
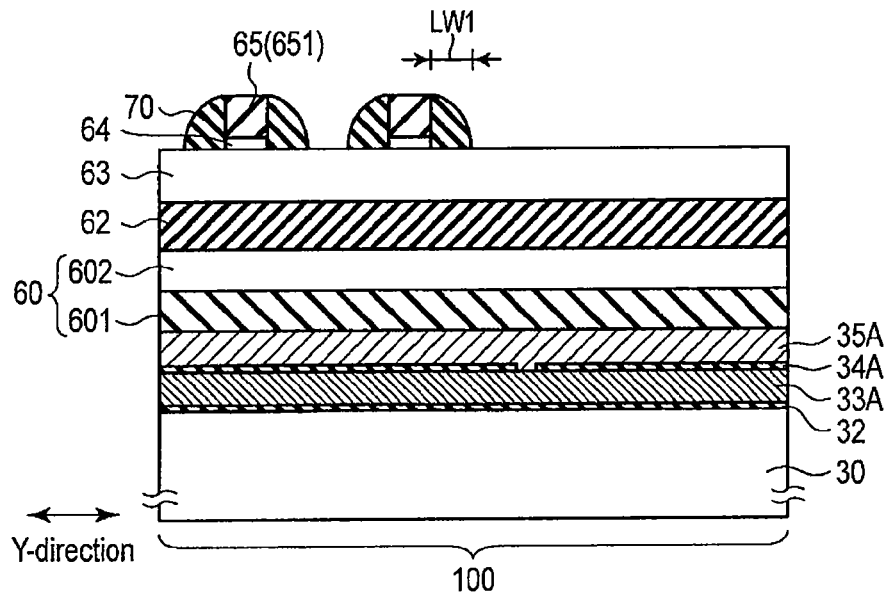
FIGS. 10A and 10B are sectional process drawings illustrating the method of manufacturing the semiconductor device according to the first embodiment.
Figure 10B:
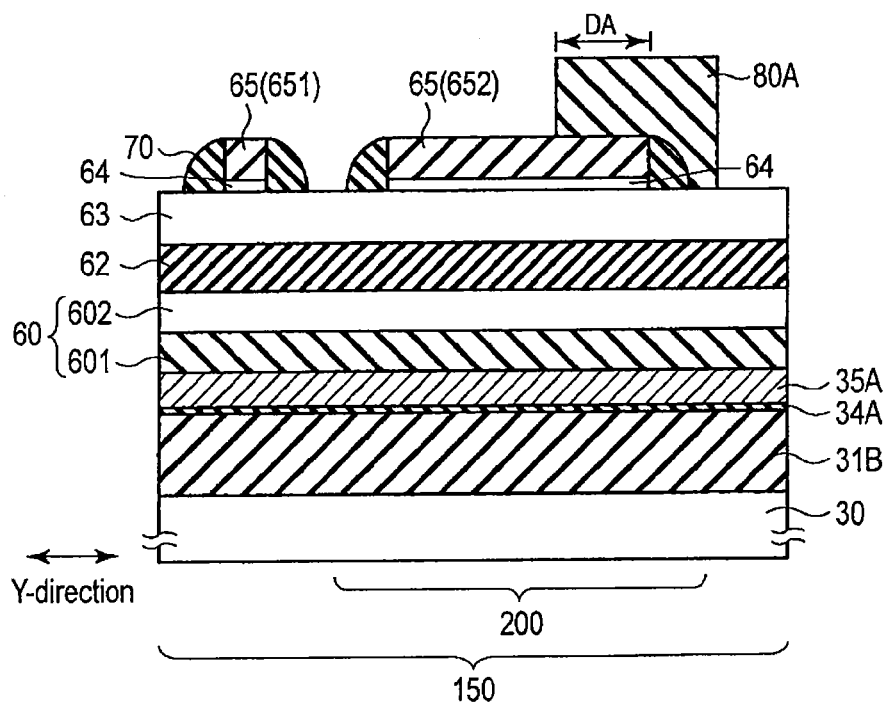

A process of the method of manufacturing a flash memory according to the present embodiment will be described using FIGS. 9 to 10B. FIG. 9 shows a plan view of a portion of the memory cell array and the leading region in a process of the method of manufacturing a flash memory according to the present embodiment. FIGS. 10A and 10B show sectional process drawings corresponding to FIG. 9. FIG. 10A shows a sectional process drawing along a Xa-Xa line in FIG. 9. FIG. 10B shows a sectional process drawing along a Xb-Xb line in FIG. 9.

As shown in FIGS. 9 and 10B, in each of the contact formation regions 200 of the leading region 150, a resist mask 80A is formed by photolithography and etching so that the fringe 652 of the upper-layer core material 65 and the sidewall film 70 are covered. For example, the resist mask 80A is patterned so as not to cover the whole fringe 652. The upper surface of the fringe 652 is exposed without being covered with the resist mask 80A near the connection portion of the line portion 651 and the fringe 652.

As shown in FIGS. 9 and 10A, no resist mask is formed in the memory cell array 100, and the sidewall film 70 and the upper-layer core material 65 are exposed.

Dimensions RA1, RB1 and the formation position of the resist mask 80A are set so that a dimension DA in the Y direction of a portion covered with the resist mask 80A of the fringe 652 becomes larger than the line width or the interconnect interval (half pitch) of the interconnect (word line) to be formed.

For example, the dimension (for example, the length or the maximum dimension) RB1 of the resist mask 80A in the X direction is set to the dimension of the fringe 652 in the X direction or more. The dimension RB1 of the resist mask 80A in the X direction is preferable equal to the total (sum) of double the size of the line width LW1 of the sidewall film 70 and the dimension of the fringe 652 in the X direction or more. The dimension (for example, the width or the minimum dimension) RA1 of the resist mask 80A in the Y direction is adjusted, as described above, in accordance with the size of the fringe 652 and the formation position of the mask 80A and is larger than, for example, the sum of the line width LW1 of the sidewall film 70 and a dimension DA of the portion covered with the resist mask 80A of the fringe 652.

Like an embodiment (for example, the fifth embodiment) described later, the resist mask 80A may be formed on the sidewall material covering the upper-layer core material 65 before etch-back of the sidewall material (here, silicon oxide) is performed. In this case, after the resist mask 80A is formed on a sidewall material, the sidewall is etched back to self-aligningly form the sidewall film 70 on the side face of the upper-layer core material 65.

Figure 11:
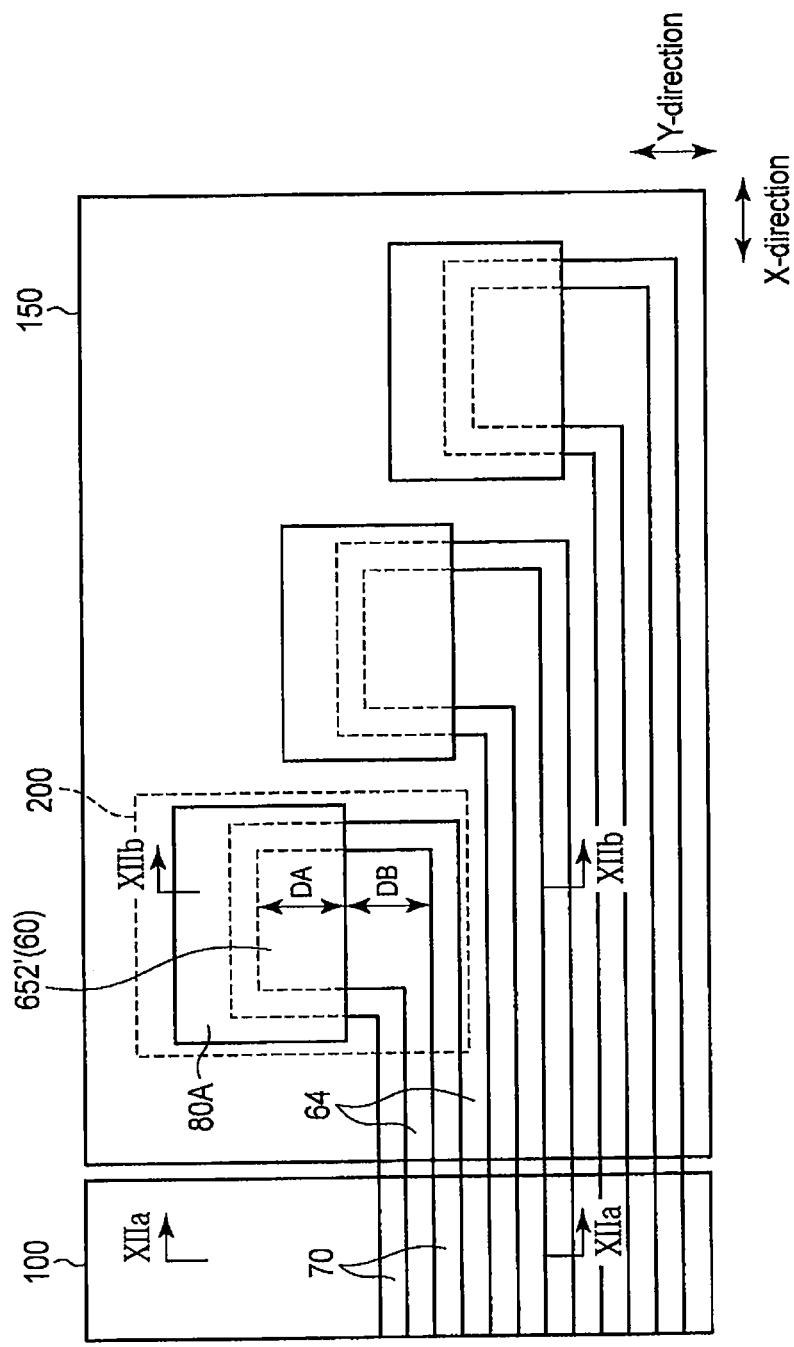
FIG. 11 is a plan view showing a process of the method of manufacturing the semiconductor device according to the first embodiment.
Figure 12A:
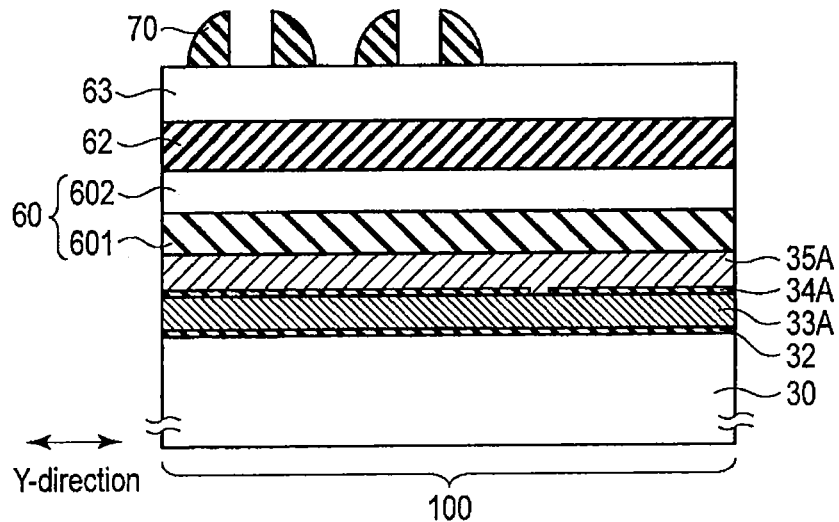
FIGS. 12A and 12B are sectional process drawings illustrating the method of manufacturing the semiconductor device according to the first embodiment.
Figure 12B:
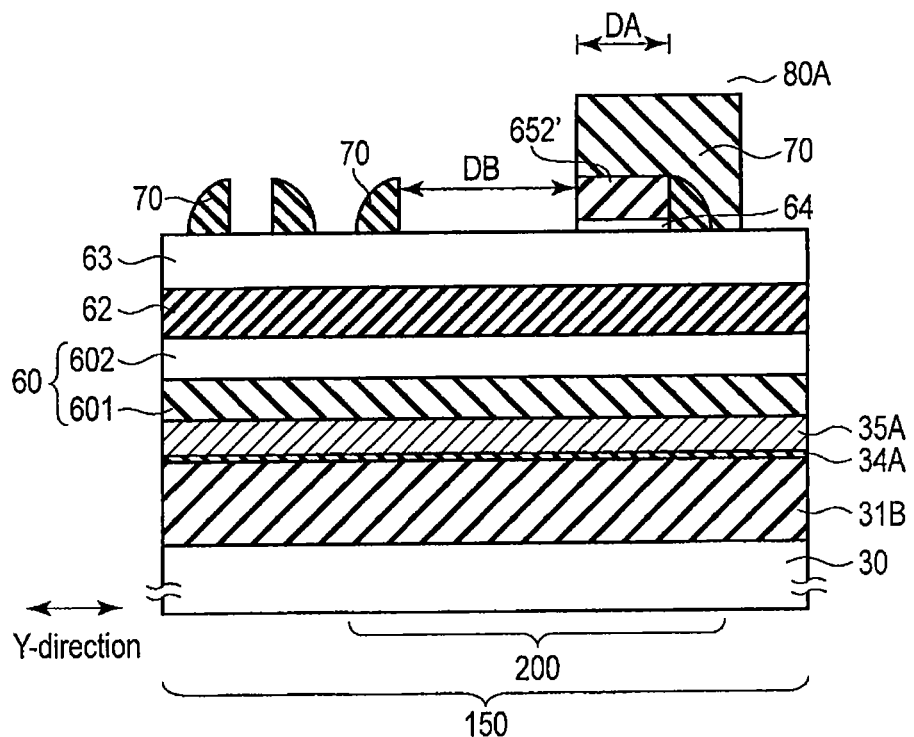

A process of the method of manufacturing a flash memory according to the present embodiment will be described using FIGS. 11 to 13B. FIG. 11 shows a plan view of a portion of the memory cell array and the leading region in a process of the method of manufacturing a flash memory according to the present embodiment. FIGS. 12A and 12B show sectional process drawings corresponding to FIG. 11. FIG. 12A shows a sectional process drawing along a XIIa-XIIa line in FIG. 11. FIG. 12B shows a sectional process drawing along a XIIb-XIIb line in FIG. 11. FIGS. 13A and 13B show sectional process drawings of a process following the manufacturing process shown in FIGS. 12A and 12B. FIG. 13A corresponds to the sectional process drawing subsequent to the process in FIG. 12A and FIG. 13B corresponds to the sectional process drawing subsequent to the process in FIG. 12B.

As shown in FIGS. 11, 12A, and 12B, the upper-layer core material is selectively removed by etching while a portion 652' of the fringe of the upper-layer core material is covered with the resist mask 80A. Etching to remove the upper-layer core material may be dry etching or wet etching. However, ashing is not included in the method of manufacturing a flash memory according to the present embodiment as treatment to remove the upper-layer core material. If the upper-layer core material of a resist material and the BARC film are formed, the removal of the upper-layer core material by ashing is not included in the manufacturing method. If the upper-layer core material is formed of a material selected from silicon, silicon oxide, silicon nitride, and silicon carbide, ashing may be used for removal of the resist mask 80A when the resist mask 80A is removed after the upper-layer core material is selectively removed by etching while the upper-layer core material is covered with the resist mask 80A.

The line portion of the upper-layer core material is removed in a portion not covered with the resist mask 80A in the memory cell array 100 and the leading region 150 and the sidewall film 70 selectively remains. The BARC film below the upper-layer core material is removed by over-etching when etching is performed to remove the upper-layer core material, exposing the upper surface of the intermediate layer 63 below.

A portion (hereinafter, also called a remaining portion or remaining pattern) 652' of the fringe covered with the resist mask 80A remains on the BARC film 64 in the contact formation region 200 of the leading region 150. The dimension DX in the Y direction of the remaining portion 652' of the fringe is, as described above, larger than the line width or the interconnect interval of the formed interconnect (word line). In the rectangular remaining portion 652', three sides of the remaining portion 652' are in contact with the sidewall film 70. In the contact formation region 200, an interval (space) DY between the remaining portion 652' and the sidewall film 70 that is not in contact with the remaining portion 652' in the Y direction is preferably larger than twice the line width of the formed interconnect.

As shown in FIGS. 13A and 13B, after the resist mask in the contact formation region 200 being removed, an intermediate layer is processed by using the sidewall mask (spacer) 70 and the remaining portion 652'. Accordingly, patterns of the sidewall spacer 70 and the remaining portion 652' are transferred to an intermediate layer 63A below. The intermediate layer 63A to which patterns of the sidewall spacer 70 and the remaining portion 652' have been transferred may also be called the upper-layer mask 63A.

The line width of a line portion (straight pattern) 631 of the upper-layer mask 63A to which a pattern of the sidewall film 70 has been transferred has substantially the same size as the line width LW1 of the sidewall film 70. The interval between the line portions (straight portions) 631 of the upper-layer mask 63A has substantially the same size as the line width CW1 of the upper-layer core material or the interval LI1 between the sidewall spacers 70.

In the contact formation region 200, a dimension DA' in the Y direction of a rectangular pattern 632 of the upper-layer mask 63A to which patterns of the sidewall spacer 70 and the remaining portion 652' have been transferred is larger than the line width LW1 of the line portion 631 of the upper-layer mask 63A or the intervals LI1, CW1 and still larger than the line width of an interconnect formed in the memory cell array 100 or the interconnect interval between interconnects. A dimension DA' of the rectangular pattern 632 of the upper-layer mask 63A in the contact formation region 200 is preferably, for example, equal to the critical dimension of the resolution of photolithography or more.

Figure 14:
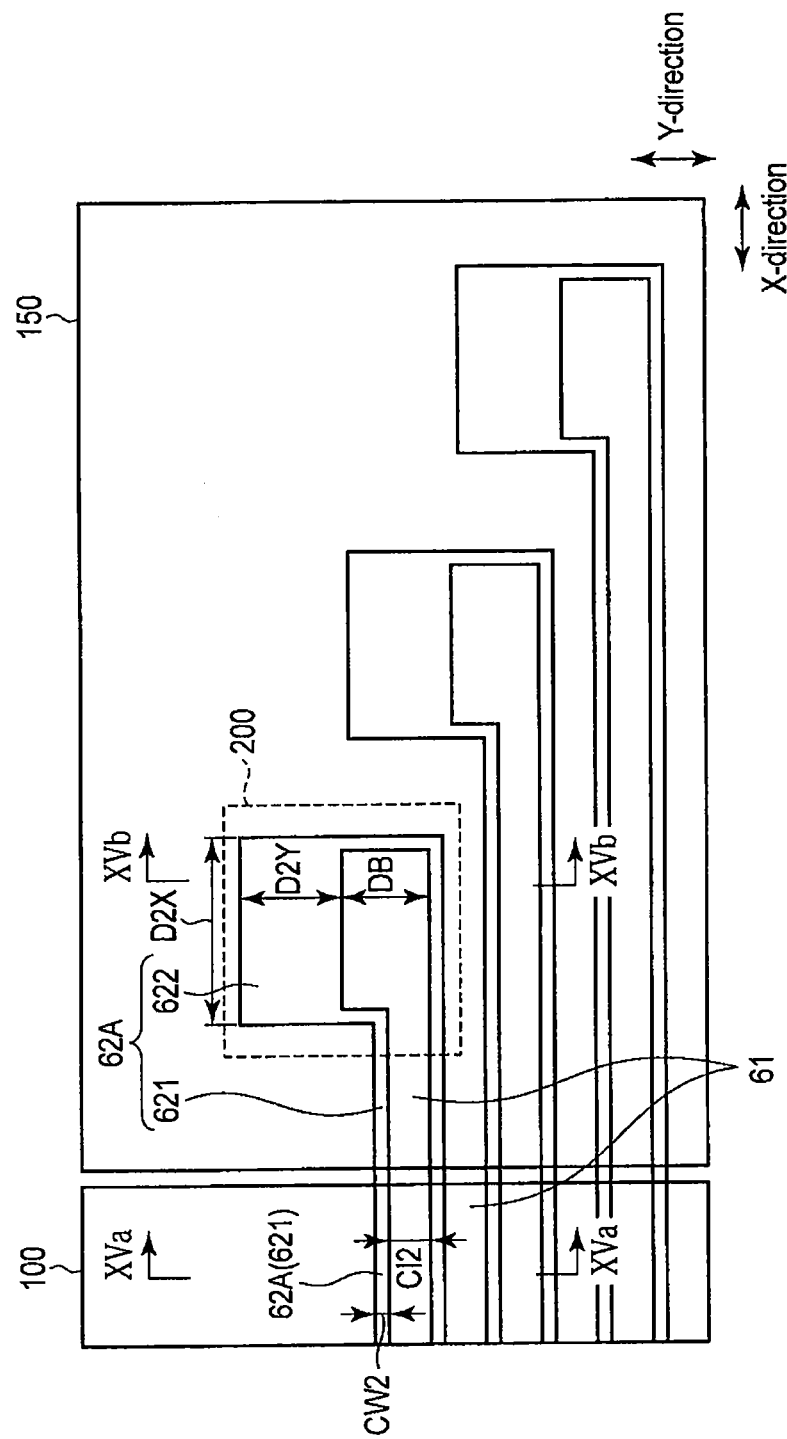
FIG. 14 is a plan view showing a process of the method of manufacturing the semiconductor device according to the first embodiment.

A process of the method of manufacturing a flash memory according to the present embodiment will be described using FIGS. 14 to 15B. FIG. 14 shows a plan view of a portion of the memory cell array and the leading region in a process of the method of manufacturing a flash memory according to the present embodiment. FIGS. 15A and 15B show sectional process drawings corresponding to FIG. 14. FIG. 15A shows a sectional process drawing along a XVa-XVa line in FIG. 14. FIG. 15B shows a sectional process drawing along a XVb-XVb line in FIG. 14.

After the remaining portions of the sidewall mask on the upper-layer mask and the upper-layer core material being removed, the lower-layer core material is processed by, for example, etching by using the upper-layer mask as a mask. Accordingly, a pattern of the upper-layer mask is transferred to the lower-layer core material. After the lower-layer core material being processed, the upper-layer mask is selectively removed by, for example, etching. If, for example, a silicon nitride is used as an intermediate layer, the upper-layer mask can selectively be separated by hot phosphoric acid.

Accordingly, as shown in FIGS. 14 to 15B, patterns of the remaining portions of the sidewall spacer and the fringe are transferred to a lower-layer core material 62A to form the second (2n-th) sidewall film via the upper-layer mask.

The pattern (also called a sacrificial pattern) of the processed lower-layer core material 62A includes a line portion (also called an interconnect spacer pattern) 621 corresponding to the first ((2n−1)-th) sidewall film (sidewall spacer) and a rectangular pattern (contact spacer pattern) 622 corresponding to the remaining portion of the fringe. The processed lower-layer core material 62A has a planar shape in which the two line portions (interconnect spacer patterns) 621 are connected to the one rectangular portion (contact spacer pattern) 622. The line portion 621 of the lower-layer core material 62A extends from the memory cell array 100 into the leading region 150. The line portion 621 has a straight planar shape extending in the X direction in the memory cell array 100. Then, the line portion 621 is bent to the Y direction in the leading region 150. The rectangular portion 622 of the lower-layer core material 62A is formed in the contact formation region 200. Each of the two line portions 621 is connected to one end (corner) of the rectangular portion 622.

Slimming processing is performed on the lower-layer core material 62A to which a pattern has been transferred. As shown in FIG. 15A, the line width CW2 of the line portion 621 of the lower-layer core material 62A after the slimming processing is made by the slimming processing about half the line width LW1 (denoted by a dotted line in FIGS. 15A and 15B) of the line portion 621 before the slimming processing. An interval CI2 between the line portions 621 of the lower-layer core material 62A after the slimming processing has a size about three times the line width CW2 of the line portion 621 after the slimming processing.

For example, slimming processing on the lower-layer core material is performed so that the line width CW1 of the line portion 621 after the slimming processing is set to about 20 nm. In this case, the interval CI2 between the line portions 621 is set to about 60 nm.

As shown in FIG. 15B, the dimension D2Y in the Y direction of the rectangular portion 622 of the lower-layer core material 62A is larger than the line width CW2 of the line portion 621. The dimension D2X in the X direction of the rectangular portion 622 is also larger than the line width CW2 of the line portion 621. The rectangular portion 622 of the lower-layer core material 62A is also slimmed and therefore, the dimensions D2Y, D2X of the rectangular portion after the slimming processing become smaller than the dimension DA' (denoted by a dotted line in FIGS. 15A and 15B) of the rectangular portion 622 before the slimming processing. An interval DB between the line portion 621 of the one core material 62A and the rectangular portion 622 in the Y direction is larger than twice the line width of the formed interconnect.

In the above manufacturing process, an intermediate layer and an antireflection film are stacked on the lower-layer core material 62 (62A) and patterns of the sidewall film (sidewall spacer) and the upper-layer core material are transferred to the intermediate layer and the antireflection film. However, a sidewall spacer and an upper-layer core material may be formed directly on the lower-layer core material 62 (62A) without forming an intermediate layer and an antireflection film to directly transfer patterns 621, 622 of the remaining portions of the sidewall spacer and the upper-layer core material to the lower-layer core material 62A.

Figure 16:
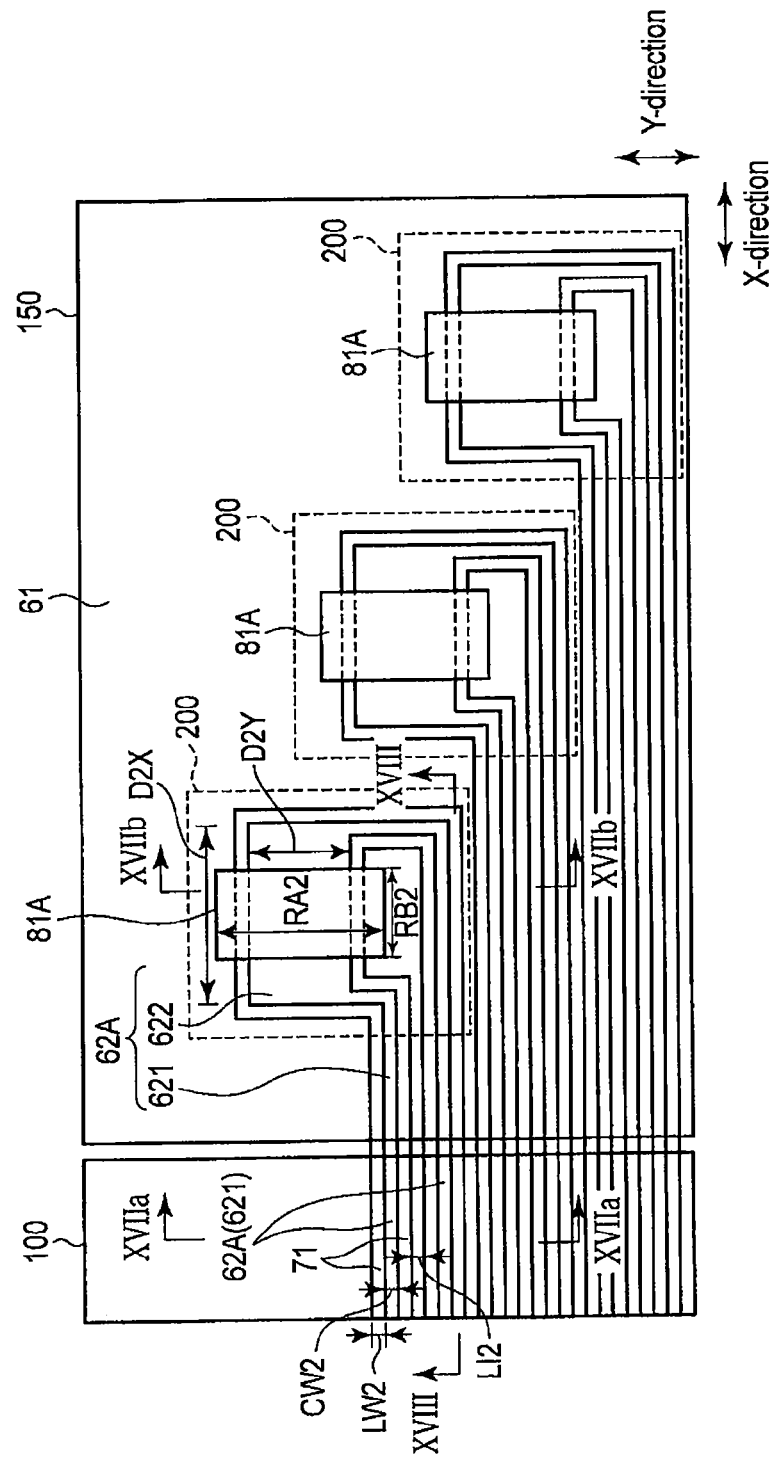
FIG. 16 is a plan view showing a process of the method of manufacturing the semiconductor device according to the first embodiment.
Figure 17A:
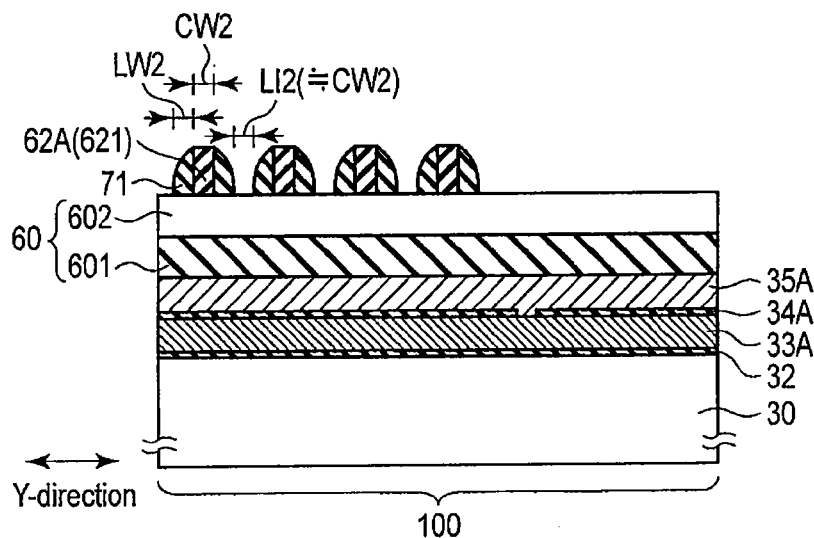
FIGS. 17A and 17B are sectional process drawings illustrating the method of manufacturing the semiconductor device according to the first embodiment.
Figure 17B:
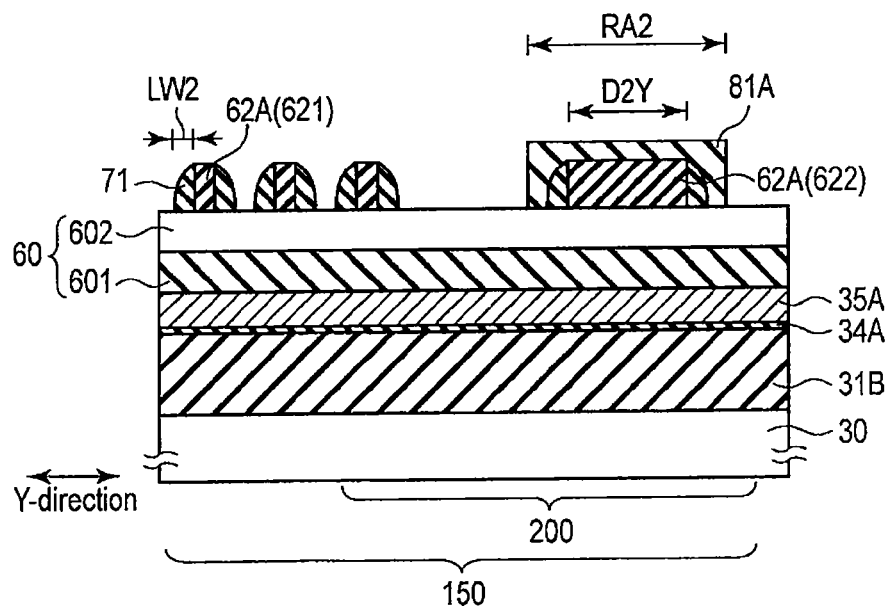
Figure 18:
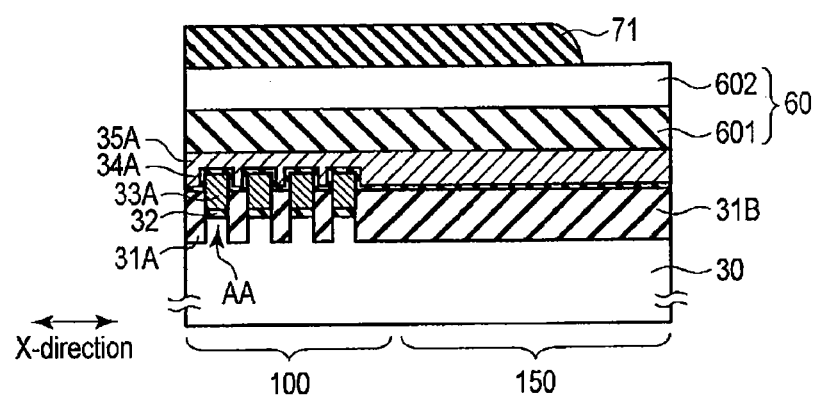
FIG. 18 is a sectional process drawing illustrating the method of manufacturing the semiconductor device according to the first embodiment.
Figure 19A:
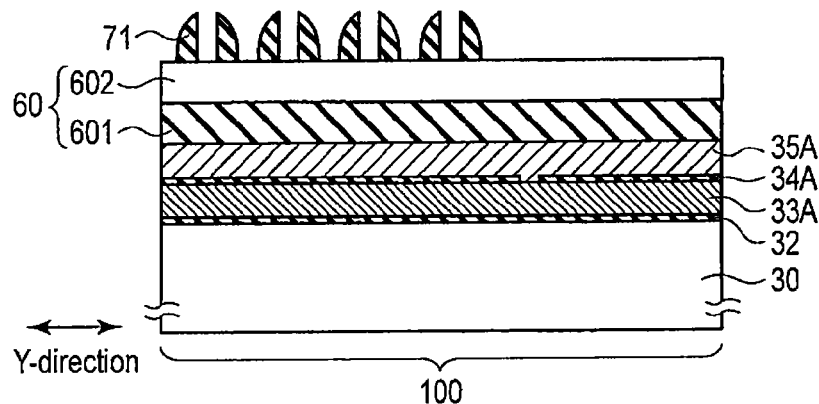
FIGS. 19A and 19B are sectional process drawings illustrating the method of manufacturing the semiconductor device according to the first embodiment.
Figure 19B:
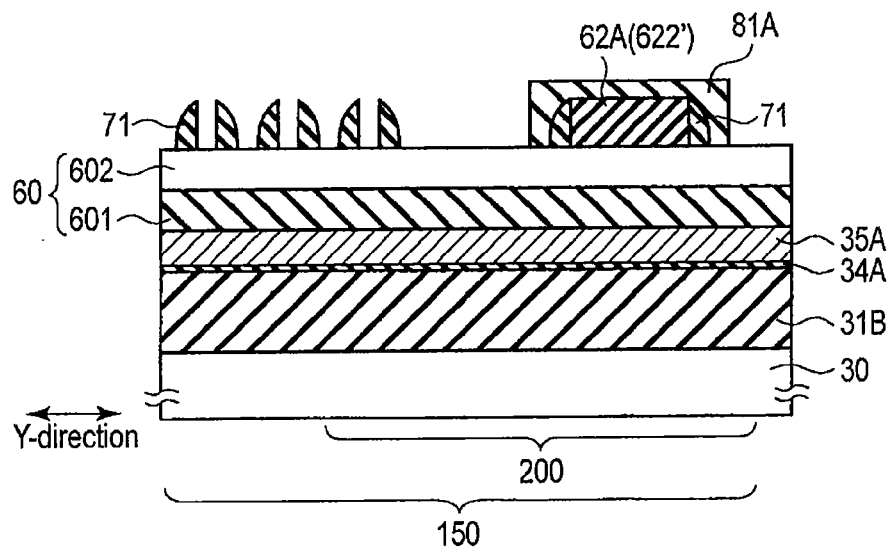

A process of the method of manufacturing a flash memory according to the present embodiment will be described using FIGS. 16 to 19B. FIG. 16 shows a plan view of a portion of the memory cell array and the leading region in a process of the method of manufacturing a flash memory according to the present embodiment. FIGS. 17A to 18 show sectional process drawings corresponding to FIG. 16. FIG. 17A shows a sectional process drawing along an XVIIa-XVIIa line in FIG. 16. FIG. 17B shows a sectional process drawing along an XVIIb-XVIIb line in FIG. 16. FIG. 18 shows a sectional process drawing along an XVIII-XVIII line in FIG. 16. FIGS. 19A and 19B show sectional process drawings of a process following the manufacturing process shown in FIGS. 17A to 18. FIG. 19A corresponds to the sectional process drawing subsequent to the process in FIG. 17A and FIG. 19B corresponds to the sectional process drawing subsequent to the process in FIG. 17B.

As shown in FIGS. 16 to 18, a second sidewall film 71 used for the formation of an interconnect is formed on the side face of the slimmed lower-layer core material 62A by using, for example, the same method (sidewall formation process) as the method shown in FIGS. 6 to 8. The second sidewall film 71 is, for example, a silicon nitride formed by using the ALD method. The thickness of the sidewall film (sidewall material) 71 when deposited and conditions for etching back the sidewall film 71 are set so that the line width LW2 of the sidewall film 71 corresponds to the line width of the an interconnect to be formed. In the present embodiment, the sidewall film 71 formed by the second sidewall formation process corresponds to a mask pattern to form an interconnect (word line). The sidewall film 71 formed by the second sidewall formation process will be called the sidewall mask 71 below.

As shown in FIGS. 16 and 18, the sidewall mask 71 extends from in the memory cell array 100 into the leading region 150 along the shape of the line portion 621 of the lower-layer core material 62A.

In the leading region 150, the sidewall mask 71 is bent in accordance with the shape of the rectangular portion (spacer pattern) 622 of the lower-layer core material 62A. The sidewall mask 71 has a planar shape in a closed loop so as to surround the lower-layer core material 62A. The sidewall mask 71 in a closed loop is formed on the side face on the outer side (outer circumference) and on the side face on the inner side (inner circumference) of the one lower-layer core material 62A. Depending on whether the rectangular portion 622 is provided at both ends in the X direction of the line portion 621 of the patterned lower-layer core material 62A or the rectangular portion 622 is provided at one end in the X direction of the line portion 621, the two separated sidewall masks 71 in a closed loop shape are formed for the one lower-layer core material 62A or the continuous sidewall mask 71 in a closed loop shape is formed for the one lower-layer core material 62A.

As shown in FIG. 17A, the line width LW2 of the sidewall film 71 is set to substantially the same size as the line width CW2 of the line portion 621 as the interconnect spacer pattern of the lower-layer core material 62A in the memory cell array 100. For example, the line width LW2 of the sidewall film 71 has a size about ¼ the critical dimension of the resolution of photolithography. More specifically, the line width LW2 of the sidewall film 71 is set to about 20 nm. In the memory cell array 100, the interval LI2 between the sidewall masks 71 opposed to each other without sandwiching the line portion 621 therebetween has substantially the same size as, for example, the line width LW2 of the sidewall film 71 or the line width CW2 of the line portion 621. The line width LW2 of the sidewall film 71 and the intervals CW2, LI2 may be in the range of ½ to ¼ the critical dimension of the resolution of photolithography.

As shown in FIG. 173, the interval between the sidewall masks 71 opposed to each other in the Y direction across the rectangular portion (contact spacer pattern) 622 of the lower-layer core material 62A in the leading region 150 corresponds to the dimension D2Y in the Y direction of the rectangular portion 622. The interval between the sidewall masks 71 opposed to each other in the X direction across the rectangular portion 622 of the lower-layer core material 62A corresponds to the dimension D2X in the X direction of the rectangular portion 622 as a contact spacer pattern. The intervals D2X, D2Y between the sidewall masks 71 in a closed loop shape on the outer side and the inner side of the core material 62A in the leading region 150 are larger than the intervals CW2, LI2 between the sidewall masks 71 in the memory cell array 100.

The intervals D2X, D2Y between the sidewall masks 71 opposed to each other across the rectangular portion 622 are preferably larger than the critical dimension of the resolution of photolithography. To adjust the sizes D2X, D2Y of the rectangular portion 622 of the lower-layer core material 62A in the contact formation region 200, the sizes of the fringe of the upper-layer core material and the resist mask covering the fringe are adjusted in the above manufacturing process when appropriate.

With the rectangular portion 622 of the lower-layer core material 62A based on an upper-layer pattern being provided between the sidewall masks 71 in the contact formation region 200 as a spacer in the leading region 150, the intervals D2X, D2Y larger than the intervals LI2, CW2 between the sidewall masks 71 of the memory cell array 100 are secured between the sidewall masks 71 in the contact formation region 200. Accordingly, an interval larger than the interval between interconnects formed in the memory cell array 100 can be secured in a position where a pad connected to an interconnect is formed in the contact formation region 200.

With the interval between the line portion 621 and the rectangular portion 622 of the lower-layer core material 62A being set larger than twice the line width LW2 of the formed sidewall mask (interconnect) in the contact formation region 200, the sidewall mask 71 on the side face of the rectangular portion 622 does not come into contact with the sidewall mask 71 on the side face of the line portion 621.

After the sidewall mask 71 corresponding to the interconnect pattern being formed, a resist mask 81A is formed on the rectangular portion 622 and the sidewall mask 71 by photolithography and etching so as to cover the rectangular portion 622 in the contact formation region 200. The resist mask 81A is formed in a region in which a pad of an interconnect (here, a word line) is planned to be formed.

For example, the resist mask 81A has a rectangular planar shape and dimensions RA2, RB2 of each side of the resist mask 81A are set to the critical dimension of the resolution of photolithography or more. The dimension RA2 in the Y direction of the resist mask 81A is larger than the sum of twice the line width LW2 of the sidewall mask 71 and the dimension D2Y in the Y direction of the rectangular portion 622 so that the rectangular portion 622 and the sidewall mask 71 on the side face of the rectangular portion 622 in the Y direction are covered. The dimension RB2 in the X direction of the resist mask 81A is smaller than the dimension D2X in the X direction of the rectangular portion 622 so that the whole of the sidewall mask 71 on the side face of the rectangular portion 622 in the Y direction and the whole of rectangular portion 622 is not covered.

Etching to remove the lower-layer core material 62A is performed while a portion of the rectangular portion 622 of the lower-layer core material 62A is covered with the resist mask 81A. The etching to remove the lower-layer core material 62A may be wet etching or dry etching. However, ashing is not used here as a method of removing the lower-layer core material.

Accordingly, as shown in FIGS. 19A and 19B, the lower-layer core material between the sidewall masks 71 is selectively removed.

As shown in FIGS. 19A and 19B, the line portion of the lower-layer core material is removed and the upper surface of the mask layer 60 is exposed in the memory cell array 100 and the leading region 150. On the other hand, as shown in FIG. 19B, a portion 622' of the rectangular portion of the lower-layer core material 62A covered with the resist mask 81A is hardly etched and remains on the mask layer 60. Like the line portion of the lower-layer core material 62A, the portion of the rectangular portion not covered with the resist mask 81A is removed by etching.

In the above manufacturing process, patterns of the first sidewall film (sidewall spacer) and the remaining portion of the upper-layer core material are transferred to the lower-layer core material and the second sidewall film (sidewall mask) is formed on the side face of the lower-layer core material to which patterns have been transferred. However, the second sidewall film 71 may directly be formed on the first sidewall film and the side face of the remaining upper-layer core material (or the resist mask) without using the lower-layer core material after the upper-layer core material is removed. In this case, the lower-layer core material may not be formed on the mask layer or processed layer.

A process of the method of manufacturing a flash memory according to the present embodiment will be described using FIGS. 20 to 22B. FIG. 20 shows a plan view of a portion of the memory cell array and the leading region in a process of the method of manufacturing a flash memory according to the present embodiment. FIGS. 21A and 21B show sectional process drawings corresponding to FIG. 20. FIG. 21A shows a sectional process drawing along a XXIa-XXIa line in FIG. 20. FIG. 21B shows a sectional process drawing along a XXIb-XXIb line in FIG. 20. FIGS. 22A and 22B show sectional process drawings of a process following the manufacturing process shown in FIGS. 21A and 21B. FIG. 22A corresponds to the sectional process drawing subsequent to the process in FIG. 21A. FIG. 22B corresponds to the sectional process drawing subsequent to the process in FIG. 21B.

As shown in FIGS. 20, 21A, and 21B, after the resist mask on the remaining core material 622' being removed, a resist mask 82 is formed by photolithography and etching in a region in which a select gate line (select transistor) is formed. The line width LWS of the resist mask 82 to form a select gate line is larger than, for example, the critical dimension of the resolution of photolithography and is set to the size in which a select transistor of a predetermined channel length is formed.

The resist mask 82 to form a select gate line may be formed simultaneously with a resist mask to retain the lower-layer core material 622' in the contact formation region 200. In this case, the pattern of the resist mask 82 is transferred to the lower-layer core material and the lower-layer core material corresponding to the pattern of the select gate line remains in the formation region of the select gate line. Accordingly, the formation process of a mask to form a select gate line and the formation process of a mask to form a pad can be executed simultaneously, simplifying the manufacturing process of a flash memory.

A lower-layer mask layer (hereinafter, called a lower-layer mask) 60A is processed by, for example, etching using patterns of the sidewall mask 71, the remaining rectangular portion 622', and the resist mask (or the remaining core material) 82 as masks.

In the memory cell array 100, the pattern corresponding to the sidewall mask 71 is transferred to each of an amorphous silicon film 602A and a silicon oxide 601A included in the lower-layer mask 60A of a stacked structure. Accordingly, the lower-layer mask 60A having a pattern to form an interconnect is formed. If the semiconductor device formed by the manufacturing method according to the present embodiment is a NAND flash memory, the mask pattern formed based on the sidewall mask 71 corresponds to a pattern to form a word line and a memory cell connected to the word line.

The pattern of the sidewall mask 71 is transferred to the mask layer 60A in the leading region 150 and also the pattern corresponding to the remaining rectangular portion 622' is transferred to each of the amorphous silicon film 602A and the silicon oxide 601A in the contact formation region 200. Accordingly, a mask layer 60C having the dimension D2Y larger than the line width LW2 of the sidewall mask 71 is formed in the contact formation region 200 of the leading region 150. The pattern of the mask layer 60C corresponds to a pattern to form a pad connected to an interconnect.

In the memory cell array 100, the pattern of the resist mask 82 is transferred to an amorphous silicon film 602B and a silicon oxide 601B. The mask layers 60A, 60C corresponding to the sidewall mask 71 and the rectangular portion 622' are formed respectively and at the same time, a mask layer 60B to form a select gate line and a select transistor is formed.

Thus, the mask layers 60A, 60B, 60C having mutually different dimensions are formed by substantially the common process.

After sidewall mask and the remaining core material and resist mask being removed from the mask layers 60A, 60B, 60C to which patterns have been transferred, as shown in FIG. 22, the mask layers 60A, 60B, 60C to which patterns have been transferred are used to sequentially process a conductive layer 35B, the insulator 34, the charge storage layer 33, and the gate insulating film 32 as processed layers.

Accordingly, a line & space pattern including the conductive layer 35B of a line pattern and a space pattern between the line patterns is formed in the memory cell array 100. At this stage, the conductive layer 35B having a line pattern has a planar shape in a closed loop shape.

A memory cell is formed at an intersection of the linear conductive layer 35B and the active region AA. The memory cell is a field effect transistor having the charge storage layer 33 and a control gate electrode. The conductive layer 35B as the formed line pattern becomes a word line and is also used as a control gate electrode of a memory cell.

A conductive layer 35C in a rectangular planar shape is formed in the contact formation region 200. The line pattern (conductive layer) 35B in a closed loop shape is connected to an end of the rectangular conductive layer 35C in the X direction or the Y direction. The rectangular conductive layer 35C has the dimension D2Y larger than the line width LW2 of the line pattern (conductive layer) 35B and the interval LI2 between the adjacent line patterns 35A in the memory cell array 100. For example, the rectangular conductive layer 35C preferably has a dimension equal to the critical dimension of the resolution of photolithography or more.

The select gate lines 35S, 33S are formed below the mask layer 60B processed based on a resist mask (or a pattern corresponding thereto) in the memory cell array 100. A select transistor is formed at an intersection of the select gate line 35S and the active region AA.

For example, the processed conductive layers 35B, 35S are used as masks for ion implantation. Accordingly, the diffusion layers 39, 39S as the source/drain of a transistor are formed self-aligningly for the gate electrode of the transistor in the semiconductor substrate 30.

Figure 23:
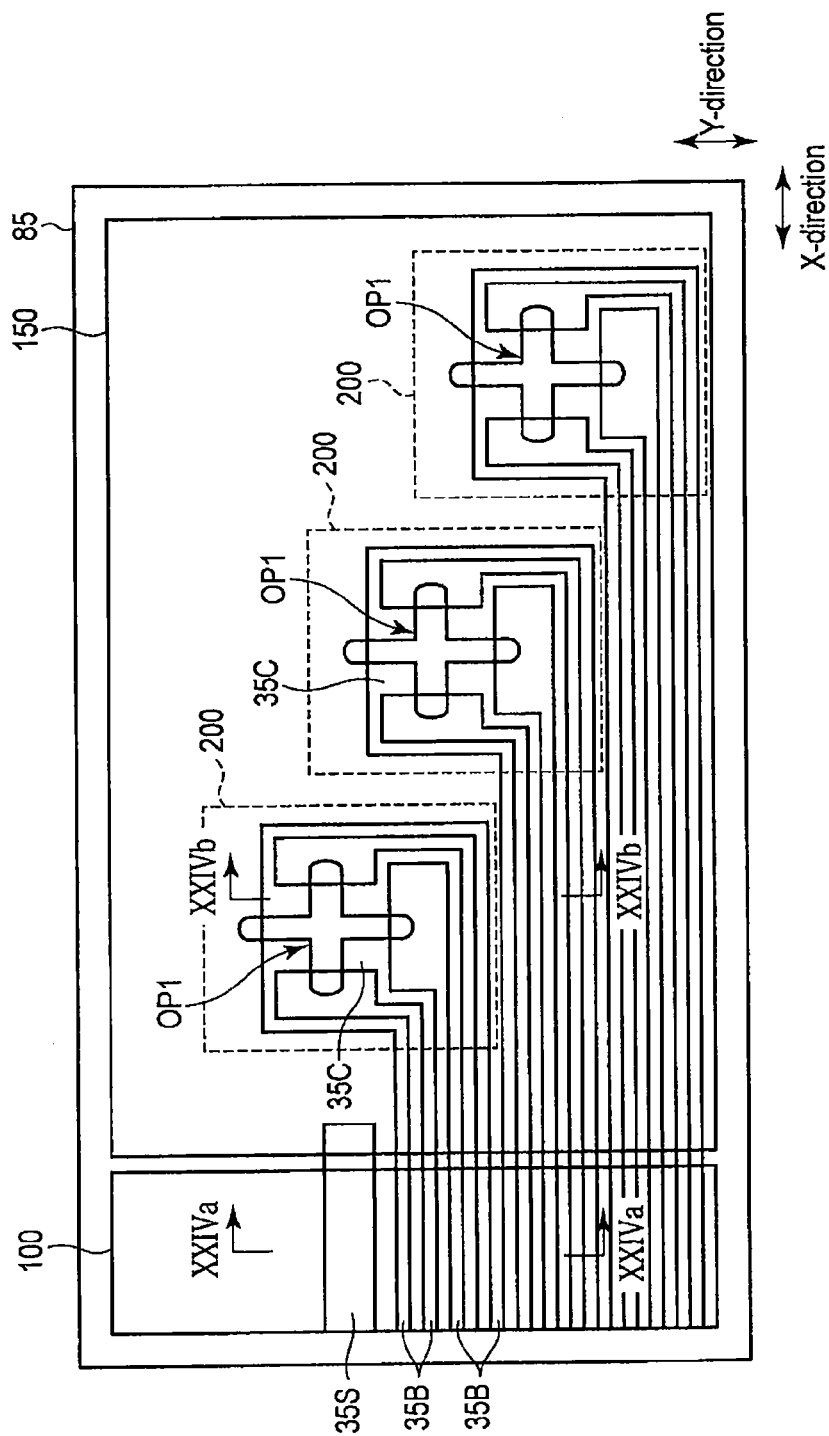
FIG. 23 is a plan view showing a process of the method of manufacturing the semiconductor device according to the first embodiment.

A process of the method of manufacturing a flash memory according to the present embodiment will be described using FIGS. 23 to 24B. FIG. 23 shows a plan view of a portion of the memory cell array and the leading region in a process of the method of manufacturing a flash memory according to the present embodiment. FIGS. 24A and 24B show sectional process drawings corresponding to FIG. 23. FIG. 24A shows a sectional process drawing along an XXIVa-XXIVa line in FIG. 23. FIG. 24B shows a sectional process drawing along an XXIVb-XXIVb line in FIG. 23.

As shown in FIGS. 23 to 24B, the conductive layer 35B of a line & space pattern in the memory cell array 100 and the rectangular conductive layer 35C in the contact formation region are formed. After the mask layers to form the conductive layers being removed by etching, a resist mask 85 is formed on the semiconductor substrate 30 so as to cover the conductive layers 35B, 35C in the memory cell array 100 and the leading region 150. For example, a cross opening OP1 is formed in the resist mask 85 by photolithography and etching above the rectangular conductive layer 35C in the contact formation region 200. A portion of the conductive layer 35C in the contact formation region 200 is exposed via the cross opening OP1.

The conductive layer 35C in the contact formation region 200 is etched by using the resist mask 85 having the opening OP1 as a mask.

Accordingly, the conductive layer 35B in a closed loop shape is loop-cut and, as shown in FIGS. 4 to 6, interconnects (here, word lines) independent of each other are formed. Independence of interconnects is secured by the loop-cut process and at the same time, the rectangular conductive layer 35C connected to line patterns is divided into four portions corresponding to the cross opening to form the pad 35P connected to each interconnect WL.

The formed word line WL is bent from the X direction to the Y direction (or from the Y direction to the X direction) in the leading region 150. The position where the word line WL is bent is set in accordance with the formation position and size of the fringe of the core material in a flag structure to form the first sidewall film (sidewall spacer). The interconnect interval D2X in the X direction of the formed word line WL is set in accordance with the size (dimension in the X direction) of the fringe of the core material in a flag structure.

The word line WL is formed so as to extend from a vertex (corner) of the pad (fringe) 35P. Four word lines WL are formed together as a group in each of the contact formation regions 200 of the leading region 150. In the contact formation region 200, the word line WL and the pad connected to the word line WL are formed so as to have a symmetric layout with respect to the X direction and the Y direction.

The numbers of the word lines WL formed together in the one contact formation region 200 and the pads 35P change in accordance with the number of times of transferring patterns of a plurality of sidewall films (or the number of times of forming sidewall films) used to form word lines. If, for example, the number of times of transferring sidewall films to form word lines is represented by 2n, the numbers of the word lines WL formed together in the one contact formation region 200 and the pads 35P are represented by "4$^n$".

While the process in which the conductive layer 35C in a closed loop shape is loop-cut regarding one end side of the memory cell array 100 in the X direction is illustrated in the method of manufacturing a semiconductor device, the conductive layer 35C is also loop-cut by the common process regarding the other end side of the memory cell array 100 in the X direction. If the pattern (conductive layer) 35B in a closed loop shape is divided in such a way that independence of interconnects is secured on the other end side of the memory cell array 100 in the X direction, like the process shown in FIGS. 23 to 24B, the pad 35P may be formed by the loop-cut process or the pad 35P may not be formed on the other end side of the memory cell array 100.

Before the conductive layer 35 as a processed layer is processed, the loop-cut process may be executed on the mask layers 60A, 60C in a closed loop shape. In this case, the conductive layer 35 is processed based on mask layers independent of each other including patterns corresponding to the interconnect and the pad connected to the interconnect. Further, a loop-cut process may be executed between a process of processing the amorphous silicon layer 602 and a process of processing the silicon oxide 601 in the transfer process of a pattern to the mask layer 60 including the silicon oxide 601 and the amorphous silicon layer 602 on the processed layer 35. In this case, patterns of the sidewall mask 71 and a resist mask 90 are transferred to the amorphous silicon layer 602 and the amorphous silicon layer 602 patterned in a closed loop shape is loop-cut before the patterns are transferred to the silicon oxide 601 below the amorphous silicon layer 602. Then, the silicon layer 602 and the conductive layer 35 are sequentially processed by using the amorphous silicon layer 602 of independent patterns corresponding to an interconnect and a pad connected to the interconnect as a mask.

After the word line WL and the pad 35P being formed by loop-cutting the pattern (conductive layer) in a closed loop shape, as shown in FIGS. 4 to 5C, a first inter-layer insulating film 51 is formed on the semiconductor substrate 30.

A contact hole is formed in the first inter-layer insulating film 51 in a formation position of a contact plug such as the diffusion layer 39S of a drain-side select transistor, a source diffusion layer of a source-side select transistor, and the pad 35P. A conductor such as tungsten (W) and molybdenum (Mo) is self-alignedly embedded in the contact hole to form the contact plugs CP1, CP2.

At the first interconnect level M0, a metallic film of copper (Cu), aluminum (Al) or the like is deposited on the first inter-layer insulating 51 and the contact plugs CP1, CP2. The deposited metallic film is processed into a predetermined shape by photolithography and etching to form wiring layers (intermediate interconnects) 59A, 59B connected to the contact plugs CP1, CP2.

The second inter-layer insulating film 52 is formed on the first inter-layer insulating film 51 and the wiring layers 59A, 59B. Then, the via plug VP connected to the wiring layer 59A is embedded in a via hole formed in the second inter-layer insulating film 52.

At the second interconnect level M1, the bit line BL and a third inter-layer insulating film 53 are formed on the second inter-layer insulating film 52. The bit line BL may be formed by patterning using the sidewall transfer process executed at least once or by using photolithography and etching.

The bit line BL may also be formed by using the damascene method. For example, a damascene recess in which the bit line BL is embedded can be formed in the third inter-layer insulating film 53 by the sidewall transfer process executed at least once. The sidewall transfer process to form the bit line BL may be the sidewall transfer process used to form a word line described in the present embodiment.

With the above processes, a semiconductor device (flash memory) according to the present embodiment is formed.

As described above, an interconnect (here, a word line) of a flash memory is formed by using the sidewall formation process and the sidewall transfer process executed a plurality (2n) of times. The word line WL and the memory cell MC connected to the word line WL are formed by the above manufacturing method in such a way that the line width LW2 of the word line WL and the interval LI2 between the word lines WL become less than the critical dimension of the resolution of photolithography. If, for example, a pattern of the word line WL is formed by the sidewall transfer process (and the sidewall formation process) executed twice, the line width LW2 of the word line WL has a dimension equal to half the critical dimension of the resolution of photolithography or less and about ¼ the critical dimension of the resolution of photolithography.

Therefore, the method of manufacturing a flash memory according to the present embodiment can provide a semiconductor device including a line & space pattern (interconnect pattern) smaller than the half pitch as the limit that can be formed by photolithography by executing the sidewall formation/transfer process executed a plurality of times.

If the dimension (line width) of a sacrificial layer for the sidewall mask 71 formed by the second sidewall formation process in the contact formation region 200 of the leading region 150 is a fine line width (dimension smaller than the critical dimension of the resolution of photolithography) such as the sacrificial layer in the memory cell array 100 in a flash memory in which an interconnect is formed by the sidewall formation/transfer process executed a plurality of times, the interval between the sidewall masks 71 in the contact formation region 200 becomes smaller like the interval LI2 between the sidewall masks 71 in the memory cell array 100 and therefore, it may become difficult to secure a space to form and arrange the pad 35P connected to the word line WL with the development of finer devices and interconnects.

According to the method of manufacturing a semiconductor device including an interconnect formed by the sidewall formation/transfer process executed a plurality (2n) of times, such as the method of manufacturing a flash memory according to the present embodiment, before the core material (upper-layer core material) 65 for the sidewall film (sidewall spacer) 70 of the first ((2n−1)-th) sidewall formation process is removed, the mask 80A covering the core material is formed in the region (contact formation region 200) in which a pad connected to an interconnect is formed. Processing to remove the core material 65 is performed while a portion of the core material is covered with the mask 80A. While the core material in the memory cell array 100 is removed, the core material 652' covered with the mask 80A remains in the contact formation region 200.

The sidewall film (sidewall mask) 71 in the second (2n-th) sidewall formation process is formed on the side face of the pattern corresponding to the retained core material 652'.

By controlling the size of the retained core material 652', the interval (interconnect interval in the Y direction) D2Y of the interconnects WL in the contact formation region 200 of the leading region 150 for the interconnect WL extending from in the memory cell array 100 into the leading region 150 can be made larger than the interval LI2 of the interconnects WL in the memory cell array 100.

Therefore, according to the method of manufacturing a flash memory in the present embodiment, a space for arranging a pad of an interconnect and the resist mask 81A to form the pad or a space for processing margin of a pad and a mask can be secured in the leading region 150 (in the contact formation region 200) by using the process substantially common (simultaneous) to patterning and processing on members in the memory cell array 100.

Therefore, the method of manufacturing a flash memory according to the present embodiment can prevent a short (short circuit) that may arise between the pad, interconnect, and contact caused by an ever finer line and a finer interconnect interval (pitch) in the contact formation region 200 and device failures caused by the short can be reduced.

As a result, the method of manufacturing a flash memory according to the present embodiment can control reduced manufacturing yields of semiconductor devices caused by ever finer structures of devices and interconnects. The method of manufacturing a flash memory according to the present embodiment can also form an interconnect including different dimensions (the line width or interconnect interval), a pad connected to the interconnect, and a contact plug without adding complex manufacturing processes.

Therefore, according to the method of manufacturing a semiconductor device in the present embodiment, a semiconductor device including a fine pattern whose reliability is high can be provided.

(2) Second Embodiment

The structure of a semiconductor device (for example, a flash memory) according to the second embodiment and the method of manufacturing the semiconductor device will be described with reference to FIGS. 25 to 31. In the present embodiment, substantially the same members and functions as structural elements included in a semiconductor device in the first embodiment will be described when necessary. Also in the present embodiment, substantially the same processes as manufacturing processes included in the method of manufacturing a semiconductor device in the first embodiment will be described when necessary.

(a) Structure

Figure 25:
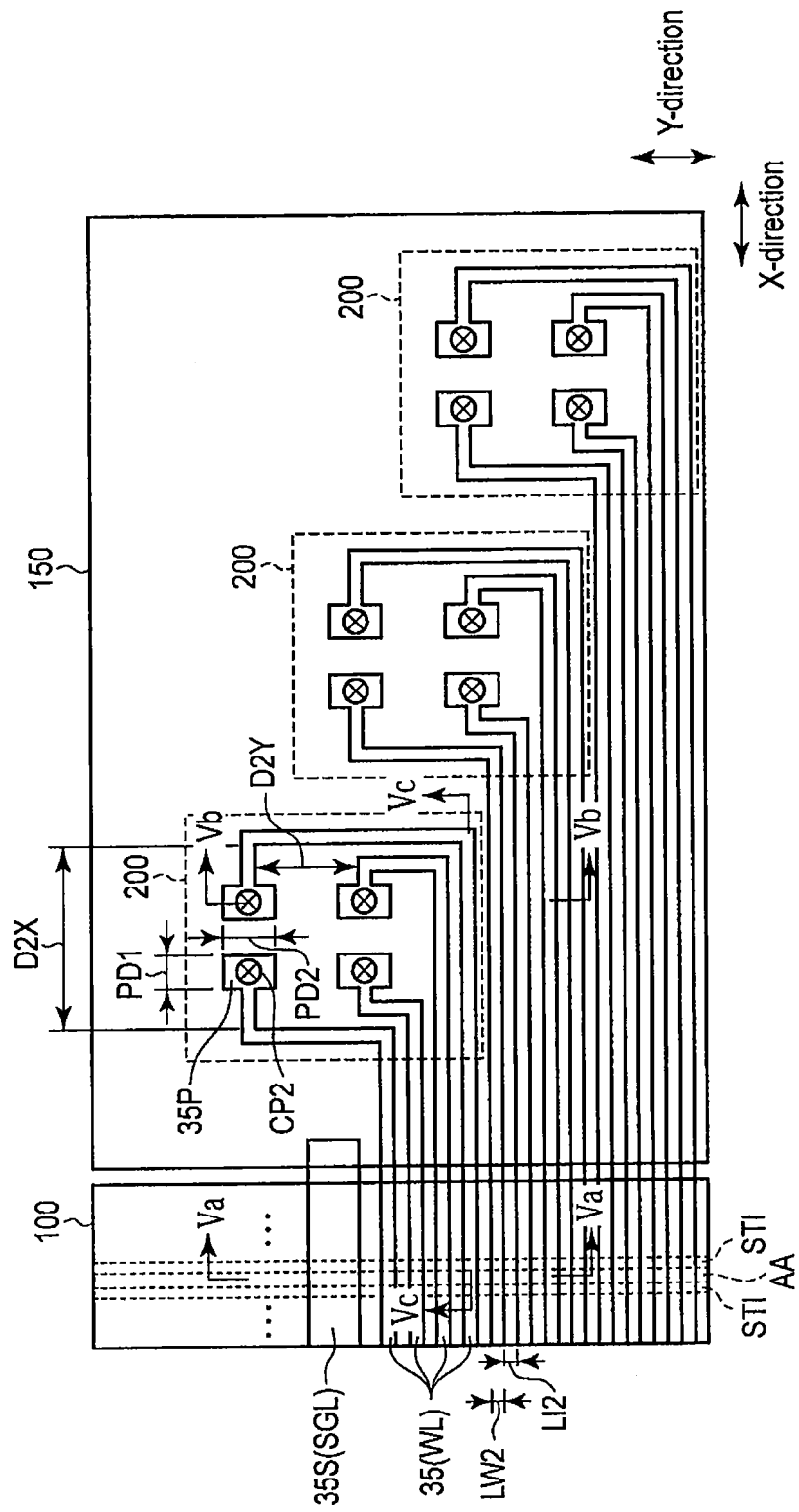
FIG. 25 is a plan view illustrating the structure of a semiconductor device according to a second embodiment.

The structure of a flash memory according to the present embodiment will be described using FIG. 25. FIG. 25 is a plan view showing a planar structure of the present embodiment. Section structures along a Va-Va line, a Vb-Vb line, and a Vc-Vc line in FIG. 25 are substantially the same as structures shown in FIGS. 5A, 5B, and 5C respectively and thus, a description thereof is omitted.

Like in the first embodiment, the semiconductor device in the present embodiment is a flash memory. Like in the first embodiment, a word line of a flash memory according to the present embodiment is formed by a sidewall transfer process (sidewall formation process) executed 2n times (n=1 in the present embodiment). A word line WL to which a memory cell MC is connected extends from a memory cell array 100 into a leading region 150. A pad 35P is connected to the word line WL in a contact formation region 200 of the leading region 150.

In a flash memory according to the present embodiment, like in the first embodiment, four (4") word lines WL and the pads 35P corresponding thereto are arranged together as a group in the one contact formation region 200.

In a flash memory according to the present embodiment, in contrast to the first embodiment, the word line WL extends from a spot (side) that is not a vertex (corner) of the pad 35P. For example, the tip of the word line WL is connected to the pad 35P.

In the contact formation region 200, the layout of the pad 35P is symmetric with respect to a line along the Y direction as a center line (symmetry axis). In the contact formation region 200, the layout of the pad 35P may be symmetric with respect to a center line along the X direction or may be asymmetric.

In a flash memory according to the second embodiment, like in the first embodiment, an interval between the interconnects (word lines) WL in the Y direction in the contact formation region 200 of the leading region 150 is larger than at least one of a line width LW2 of the interconnect and an interval Ll2 between the interconnects (word lines) WL in the memory cell array 100.

Accordingly, like in the first embodiment, a flash memory according to the present embodiment can secure a large space for arrangement of pads and a processing margin to be able to inhibit a short (short circuit) that may arise between the pad, interconnect, and contact.

The present embodiment is different from the first embodiment in, like the manufacturing method described later, a pattern to form a pad and a process to form a mask therefor.

According to a semiconductor device in the second embodiment, as described above, like in the first embodiment, the reliability of the semiconductor device including a fine pattern can be improved.

(b) Manufacturing Method

The method of manufacturing a semiconductor device according to the second embodiment will be described using FIGS. 25 to 31B. In the present embodiment, processes substantially the same as manufacturing processes of a semiconductor device according to the first embodiment will be described when necessary.

Figure 26:
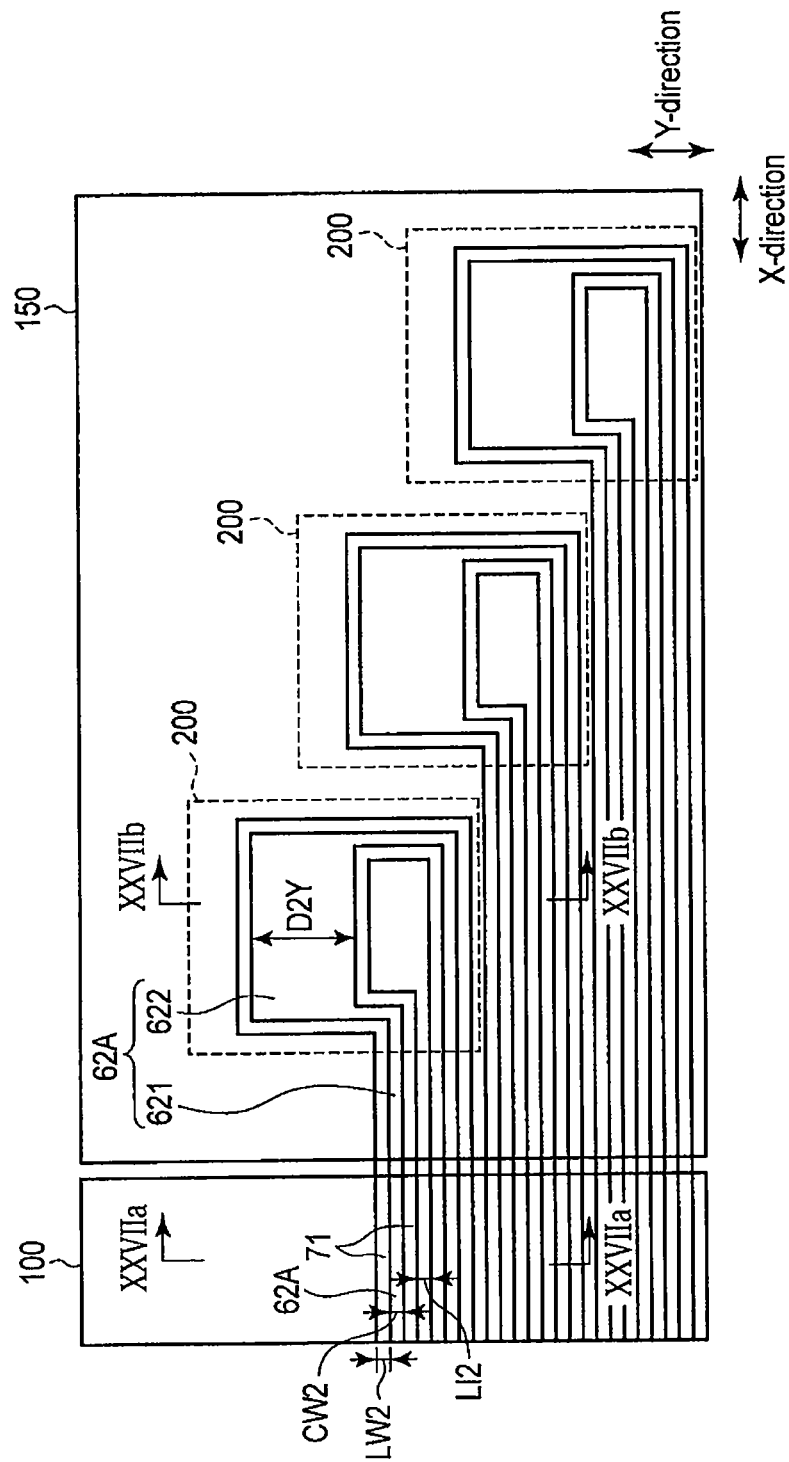
FIG. 26 is a plan view showing a process of the method of manufacturing the semiconductor device according to the second embodiment.

A process of the method of manufacturing a flash memory according to the present embodiment will be described using FIGS. 26 to 27B. FIG. 26 shows a plan view of a portion of the memory cell array and the leading region in a process of the method of manufacturing a flash memory according to the present embodiment. FIGS. 27A and 27B show sectional process drawings corresponding to FIG. 26. FIG. 27A shows a sectional process drawing along an XXVIIa-XXVIIa line in FIG. 26. FIG. 27B shows a sectional process drawing along an XXVIIb-XXVIIb line in FIG. 26.

A sidewall film (sidewall spacer) by the first sidewall formation process, which is substantially the same process as the manufacturing process shown in FIGS. 6 to 15B of the method of manufacturing a flash memory according to the first embodiment, is formed on the side face of an upper-layer core material. The upper-layer core material is removed while a portion of the fringe of the upper-layer core material is covered with a resist mask in the contact formation region 200 in the leading region 150 and a portion of the fringe remains in the contact formation region 200. Then, after a pattern corresponding to the sidewall spacer and a remaining portion of the fringe being transferred to a lower-layer core material, slimming processing of the lower-layer core material to which a pattern has been transferred is performed.

As shown in FIGS. 26 and 27B, a second sidewall film (sidewall mask) 71 by the second sidewall formation process is formed on the side face of the slimmed lower-layer core material.

In the method of manufacturing a flash memory according to the present embodiment, in contrast to the first embodiment, after the sidewall mask 71 is formed, the lower-layer core material is selectively etched without a resist mask covering the lower-layer core material being formed in the contact formation region 200. Thus, only the sidewall mask 71 remains on a mask layer 60. In the present embodiment, the lower-layer core material may be removed by ashing.

As described above, the line width LW2 of the sidewall mask 71 is equal to the line width of the sidewall spacer or less and is set to a size ranging from about ½ to about ¼ the critical dimension of the resolution of photolithography. In the memory cell array 100 shown in FIGS. 26 and 27A, intervals CW2, LI2 of the sidewall mask 71 are set to the size about the line width LW2 of the sidewall mask 71.

By retaining a portion of the fringe in the contact formation region 200 like the process shown in FIGS. 9 to 13B, the sidewall mask 71 is formed in the contact formation region 200 on the side face of a contact spacer pattern (not shown) having a dimension D2Y larger than the intervals CW2, LI2 between the sidewall films 71 in the memory cell array 100. Thus, as shown in FIGS. 26 and 27B, a space is secured in the contact formation region 200 in such a way that the interval D2Y between the mutually different sidewall masks 71 in a closed loop shape in the contact formation region 200 becomes larger than the intervals CW2, LI2 between the sidewall films 71 in the memory cell array 100.

Figure 28:
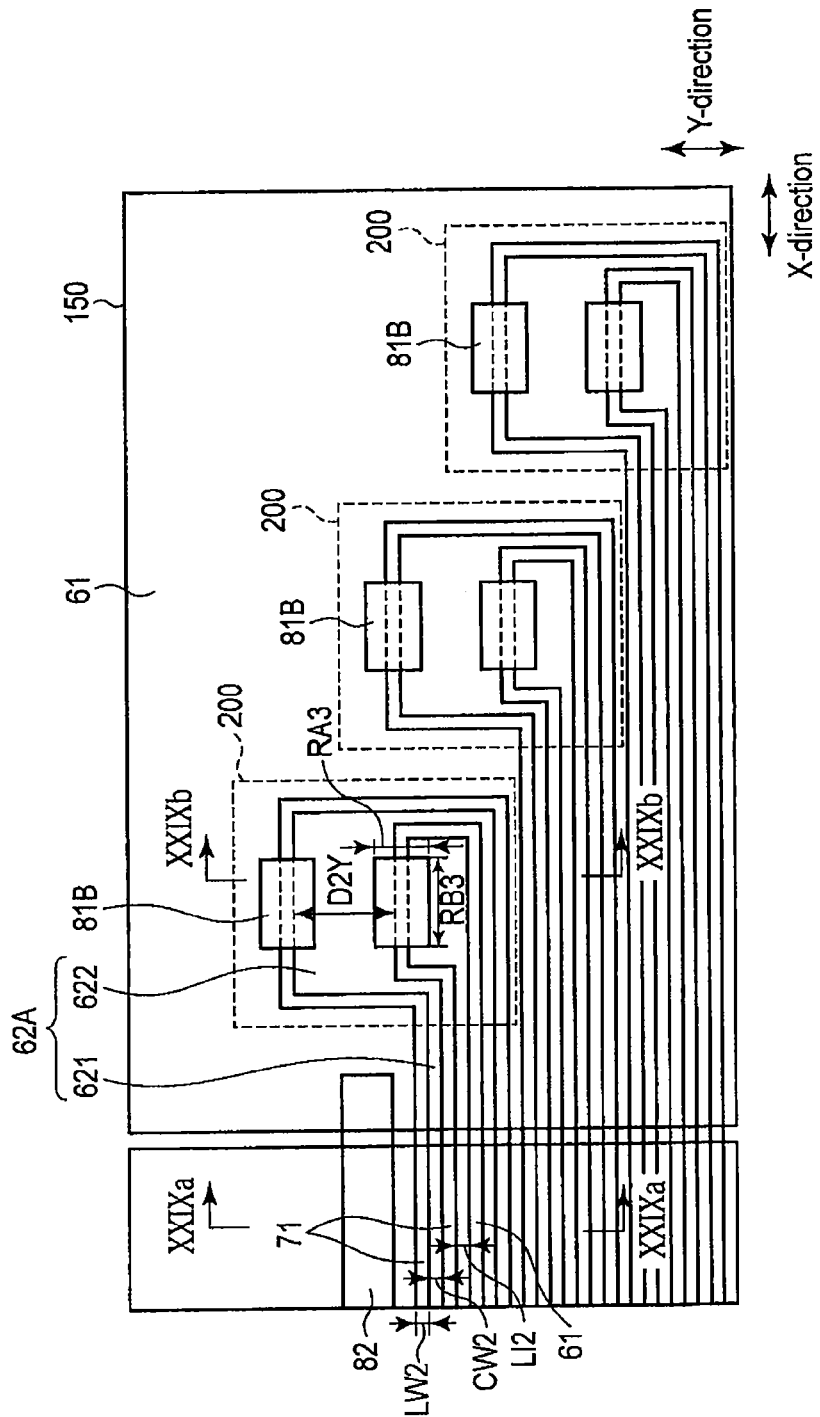
FIG. 28 is a plan view showing a process of the method of manufacturing the semiconductor device according to the second embodiment.

A process of the method of manufacturing a flash memory according to the present embodiment will be described using FIGS. 28 to 29B. FIG. 28 shows a plan view of a portion of the memory cell array and the leading region in a process of the method of manufacturing a flash memory according to the present embodiment. FIGS. 29A and 29B show sectional process drawings corresponding to FIG. 28. FIG. 29A shows a sectional process drawing along an XXIXa-XXIXa line in FIG. 28. FIG. 29B shows a sectional process drawing along an XXIXb-XXIXb line in FIG. 28.

As shown in FIGS. 28 to 29B, after the lower-layer core material to form the sidewall mask 71 being removed, a resist mask 81B is formed on the sidewall mask 71 in the contact formation region 200 by photolithography and etching. Dimensions RA3, RB3 of the resist mask 81B in the X direction and the Y direction are larger than the critical dimension of the resolution of photolithography. Slimming processing may selectively be performed on the resist mask 81B.

As shown in FIGS. 28 and 29B, the resist mask 81B in the contact formation region 200 is formed on the mask layer 60 and the sidewall mask 71 so as to cover the sidewall mask 71 in a pad formation position of interconnect. For example, the resist mask 81B is arranged so as to cover an intermediate portion between one end and the other end of a bent portion of the sidewall mask 71 in a closed loop shape.

The resist mask 81B covering the sidewall mask 71 is formed in a process common to a resist mask B2 to form a select gate line (select transistor) as shown, for example, in FIGS. 28 and 29A. Manufacturing processes of a flash memory can be prevented from excessively increasing by making the formation process of a mask to pattern a pad and the formation process of a mask to pattern a select gate line common.

For example, the resist mask 81B is patterned in such a way that the mask 81B thereof does not extend over and cover a plurality of the sidewall masks 71 in a closed loop shape. Each of the independent resist masks 81B is formed in a parallel layout to correspond to the one sidewall mask 71 in a closed loop shape. However, the resist mask 81B may be formed so as to extend over and cover the plurality of the sidewall masks 71 by controlling a pattern in an opening of a resist mask in the loop-cut process described later. The resist masks 81B, 82 may also be formed immediately before the lower-layer core material is removed.

As described above, the interval D2Y between the sidewall masks 71 along the Y direction in the contact formation region 200 is set to a dimension larger than the intervals LI2, CW2 between the sidewall films 71 in the memory cell array 100 by the size of the retained upper-layer core material being adjusted so that a space and a margin to form the resist mask 81B are secured. Thus, even if a plurality of the resist masks 81B is formed adjacent to each other in the one contact formation region 200, contact between the resist masks 81B is inhibited.

Then, in substantially the same manner as the manufacturing process shown in FIGS. 20 to 22, patterns of the sidewall film 71 and the resist mask 818 are transferred to the mask layer 60 in a stacked structure below and processed layers 35A, 34A, 33A below are sequentially processed based on the mask 60.

Figure 30:
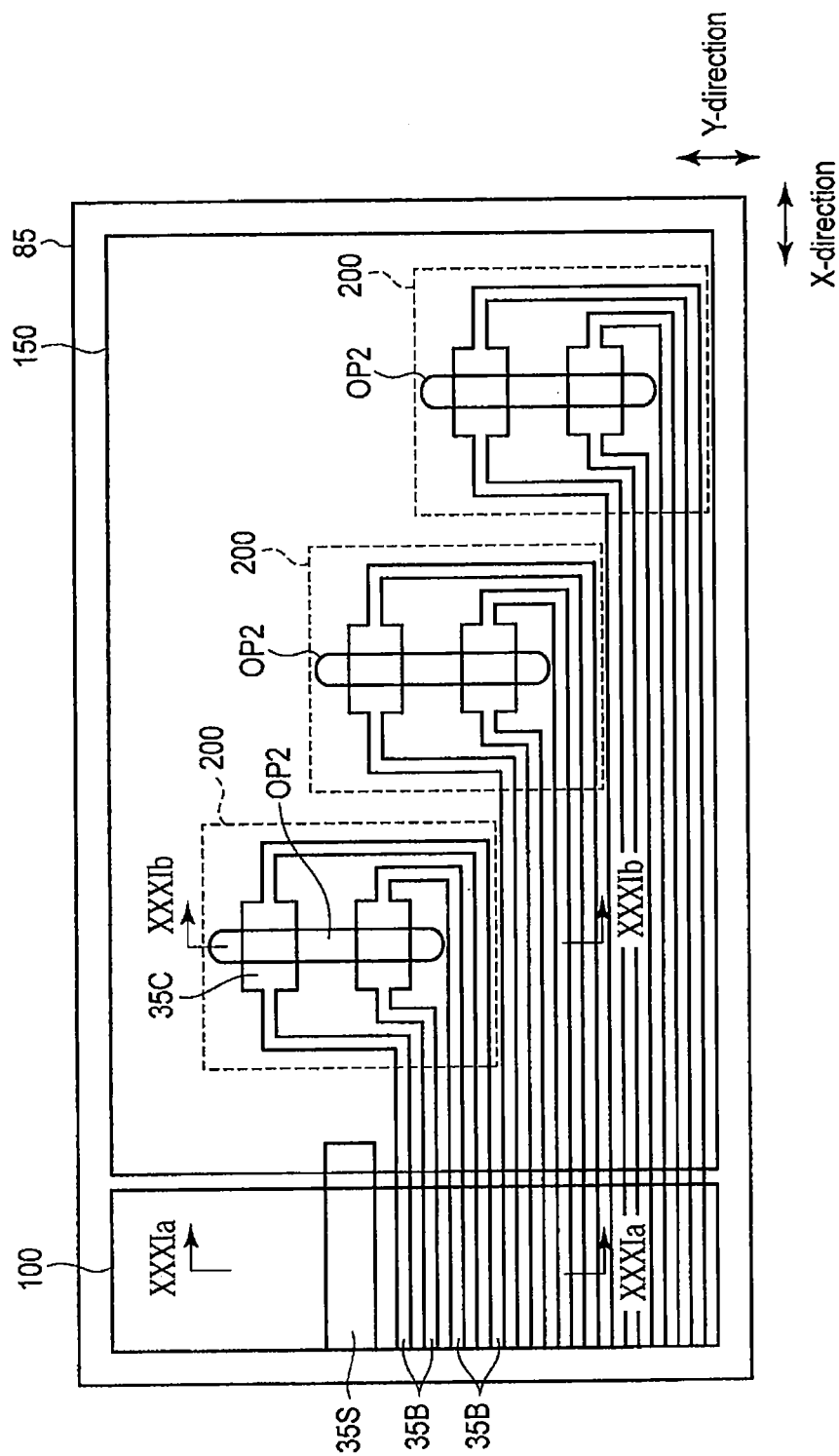
FIG. 30 is a plan view showing a process of the method of manufacturing the semiconductor device according to the second embodiment.

A process of the method of manufacturing a flash memory according to the present embodiment will be described using FIGS. 30 to 31B. FIG. 30 shows a plan view of a portion of the memory cell array and the leading region in a process of the method of manufacturing a flash memory according to the present embodiment. FIGS. 31A and 31B show sectional process drawings corresponding to FIG. 30. FIG. 31A shows a sectional process drawing along an XXXIa-XXXIa line in FIG. 30. FIG. 31B shows a sectional process drawing along an XXXIb-XXXIb line in FIG. 30.

As shown in FIGS. 30 to 31B, after a conductive layer 35B in a closed loop shape and a memory cell being formed and the mask layer being removed, a resist mask 85 for loop-cutting is formed on a semiconductor substrate 30 so as to cover the conductive layer 35B and the memory cell.

In the present embodiment, as shown in FIGS. 30, 31A, 31B, a rectangular conductive layer 35C to form a pad is formed so as to correspond to each of conductive layers (patterns) 35B in a closed loop shape. In the two conductive layers 35B in a closed loop shape in the contact formation region 200, for example, each of the conductive layers 35C to form a pad is formed so as to be adjacent to each other in the Y direction. Thus, a linear opening OP2 extending in the Y direction is formed in the resist mask 85 so as to extend over the conductive layers 35C accompanying the two patterns (conductive layers) 35B in a closed loop shape. Accordingly, a portion (for example, near a center section) of the conductive layers 35C to form a pad is exposed via the opening OP2 of the resist mask 85.

Based on the resist mask 85 having the opening OP2, the conductive layer 35C is etched to divide the conductive layer 35C. Accordingly, as shown in FIGS. 25, 5A, 5B, and 5C, word lines WL independent of the conductive layer in a closed loop shape and the pads 35P to be connected to the word lines WL are formed along with the division of a pattern in the contact formation region 200.

Then, like in the first embodiment, the inter-layer insulating film, contact plug/via plug, and intermediate wiring layer/bit line are sequentially formed.

With the above manufacturing processes, a flash memory according to the present embodiment is formed.

In the method of manufacturing a flash memory according to the present embodiment, like in the first embodiment, the mask layer and the processed layers are patterned and processed by using the sidewall formation/transfer process executed twice so that the line width LW2 of the word line WL and the interconnect interval between the word lines have a size about ¼ the critical dimension of the resolution of photolithography.

In the method of manufacturing a flash memory according to the present embodiment, in contrast to the first embodiment, after the second sidewall film (sidewall mask) 71 is formed, the whole lower-layer core material is removed and the mask 81B to form a pad is formed so as to cover the sidewall film 71.

If a pattern to form a pad is formed in the order of the process, each pattern is formed by using a process substantially simultaneous (common) with the manufacturing process of a memory cell array so that the interval D2Y between the sidewall films 71 and the interconnect WL in the contact formation region 200 becomes larger than the interval LI2 between the sidewall film 71 and the interconnect WL in the memory cell array 100. As a result, the interval D2Y of the interconnects WL formed in the contact formation region is larger than at least one of the line width LW2 of the interconnect WL and the interconnect interval LI2 of the interconnects WL in the memory cell array 100.

Therefore, the method of manufacturing a flash memory according to the present embodiment can, like in the first embodiment, secure a space for pad arrangement and a processing margin in the contact formation region 200 of the leading region 150. Therefore, the method of manufacturing a flash memory according to the present embodiment can, like in the first embodiment, prevent a short (short circuit) that may arise between the pad, interconnect, and contact in the contact formation region 200 and device failures caused by the short can be reduced.

Therefore, according to the method of manufacturing a semiconductor device in the second embodiment, like the first embodiment, a semiconductor device including a fine pattern whose reliability is improved can be provided.

(3) Third Embodiment

The structure of a semiconductor device (for example, a flash memory) according to the third embodiment and the method of manufacturing the semiconductor device will be described with reference to FIGS. 32 to 41B. In the present embodiment, substantially the same members and functions as structural elements included in a semiconductor device in the first or second embodiment will be described when necessary. Also in the present embodiment, substantially the same processes as manufacturing processes included in the method of manufacturing a semiconductor device in the first or second embodiment will be described when necessary.

(a) Structure

The structure of a flash memory according to the third embodiment will be described using FIGS. 32 and 33. FIG. 32 is a plan view showing a planar structure of a flash memory according to the present embodiment. FIG. 33 shows a section structure along an XXXIII-XXXIII line in FIG. 32. Section structures along a Va-Va line and a Vc-Vc line in FIG. 32 are substantially the same as structures shown in FIGS. 5A and 5C shown by the Va-Va line and the Vc-Vc line in FIG. 4 respectively and thus, a description thereof is omitted.

A flash memory according to the present embodiment has, like in the first and second embodiments, an interconnect (for example, a word line) WL of a line width LW2 smaller than the critical dimension of the resolution of photolithography formed by using a sidewall transfer process (sidewall formation process) executed 2n times (n=1 in the present embodiment).

In a flash memory according to the present embodiment, 4" (n=1 in the present embodiment) word lines WL as a group extend from in a memory cell array 100 into one contact formation region 200. In the contact formation region 200, each word line WL is led from, for example, a spot (side) that is not a vertex of a pad 35P. However, each word line WL may be led from a vertex (corner) of the pad 35P.

A plurality of the pads 35P in the contact formation region 200 is symmetric with respect to a center line (symmetry axis) along the Y direction and is arranged zigzag along the X direction.

Regarding the word lines WL and the pads 35P belonging to one group in the contact formation region 200, the pads 35P connected to the two word lines WL on the outer side project to the side opposite to the pads 35P connected to the two word lines WL on the inner side with respect to the Y direction.

In a flash memory according to the present embodiment, like in the first and second embodiments, an interval (minimum interval) D2W between the word lines WL in the contact formation region 200 is larger than at least one of a line width LW2 of the word line WL and an interval LI2 between the word lines WL in the memory cell array 100.

In the present embodiment, as will be shown by a manufacturing method described later, the interval D2W between the word lines WL in the contact formation region 200 is controlled by the thickness of a sidewall film (sidewall spacer) formed by the first sidewall formation process.

Also in a flash memory according to the present, like in the first and second embodiments, a space for pad arrangement and a processing margin in the contact formation region 200 can be secured so that device failures caused by a short between the pad, interconnect, and contact can be reduced.

Therefore, according to a flash memory in the present embodiment, like in the first and second embodiments, the reliability of the semiconductor device including a fine pattern can be improved.

(b) Manufacturing Method

The method of manufacturing a semiconductor device according to the third embodiment will be described using FIGS. 34 to 41B.

A process of the method of manufacturing a flash memory according to the present embodiment will be described using FIGS. 34 to 35B. FIG. 34 shows a plan view of a portion of the memory cell array and the leading region in a process of the method of manufacturing a flash memory according to the present embodiment. FIGS. 35A and 35B show sectional process drawings corresponding to FIG. 34. FIG. 35A shows a sectional process drawing along an XXXVa-XXXVa line in FIG. 34. FIG. 35B shows a sectional process drawing along an XXXVb-XXXVb line in FIG. 34.

A sidewall film (sidewall spacer) is formed by the first sidewall formation process, which is substantially the same as the manufacturing process shown in FIGS. 6 to 8 of the method of manufacturing a flash memory according to the first embodiment, on the side face of an upper-layer core material having a fringe.

In the method of manufacturing a flash memory according to the third embodiment, in contrast to the first embodiment, the upper-layer core material is selectively removed without a resist mask covering the fringe of the upper-layer core material being formed and a sidewall spacer in a closed loop shape remains on an intermediate layer. The upper-layer core material is removed by wet or dry etching. In the present embodiment, ashing may be used as a method of removing the upper-layer core material.

The intermediate layer is processed by using the sidewall spacer as a mask. After the sidewall spacer being removed, a lower-layer core material is processed by using the processed intermediate layer as a mask. After the lower-layer core material being processed, the intermediate layer as an upper-layer mask is selectively removed.

Thus, a pattern of the sidewall spacer in a closed loop shape is transferred to the lower-layer core material by the first sidewall transfer process and, as shown in FIGS. 34 to 35B, a lower-layer core material 62B having a pattern of a closed loop shape is formed.

In the method of manufacturing a flash memory according to the present embodiment, a BARC layer and an intermediate layer may not be formed between the upper-layer core material and lower-layer core material. In this case, the sidewall spacer by the first sidewall formation process is formed on the lower-layer core material and the side face of the upper-layer core material stacked directly on the lower-layer core material. Then, a pattern of the sidewall spacer is transferred to the lower-layer core material immediately below. However, depending on the material of the upper-layer core material, the BARC film may be formed between the upper-layer core material and lower-layer core material.

After the pattern of the upper layer (sidewall spacer) being transferred to the lower-layer core material 62B, slimming processing to make the line width of the lower-layer core material 62B slimmer is performed.

In the method of manufacturing a flash memory according to the present embodiment, a resist mask 86 is formed by photolithography and etching in the contact formation region 200 before the slimming processing is performed on the lower-layer core material 62B in a closed loop shape so as to cover a portion to which a pad is planned to be connected, for example, a bent portion (also called a refraction portion or loop portion) 625 of the lower-layer core material 62B corresponding to the shape of the fringe of the upper-layer core material. The slimming processing on the lower-layer core material 62B is performed while the refraction portion 625 of the lower-layer core material 62B in the contact formation region 200 is covered with the resist mask 86.

Before the slimming processing on the lower-layer core material 62B, a line width CW3 of the lower-layer core material 62B corresponds to a line width LW1 of the sidewall spacer of the first sidewall formation process and is set to, for example, a dimension about half the critical dimension of the resolution of photolithography.

As shown in FIGS. 34 and 35A, a line width CW2 of a line portion 621 of the lower-layer core material 628 that is not covered with the resist mask 86 like the line portion 621 of the lower-layer core material 62B in the memory cell array 100 is made by the slimming processing to have a dimension about half the line width LW1 of the core material before the slimming processing.

On the other hand, as shown in FIGS. 34 and 35B, the portion 625 of the lower-layer core material 628 covered with the resist mask 86 in the contact formation region 200 is not slimmed and the line width LW1 of the core material before the slimming processing is retained.

As a result, the portion 621 of the slimmed lower-layer core material 628 and the portion 625 of the lower-layer core material 62B covered with the resist mask 86 have a difference of about twice the dimension (line width).

In the manufacturing process according to the present embodiment, the portion 625 of the lower-layer core material 62B that is not slimmed is formed by covering the portion 625 of the lower-layer core material 62B in the contact formation region 200 with a resist mask before performing the slimming processing on the lower-layer core material 62B. However, like the pattern (layout) shown in FIG. 34, after the slimming processing being performed on the sidewall spacer (first sidewall film) while the portion of the sidewall spacer in the contact formation region 200 is covered with a resist mask, the pattern of the sidewall spacer including a slimmed portion and a non-slimmed portion may be transferred to the lower-layer core material 62B. Also in this case, a pattern similar to the pattern shown in FIGS. 36 to 41 is obtained.

A process of the method of manufacturing a flash memory according to the present embodiment will be described using FIGS. 36 to 37. FIG. 36 shows a plan view of a portion of the memory cell array and the leading region in a process of the method of manufacturing a flash memory according to the present embodiment. FIGS. 37A and 37B show sectional process drawings corresponding to FIG. 36. FIG. 37A shows a sectional process drawing along an XXXVIIa-XXXVIIa line in FIG. 36. FIG. 37B shows a sectional process drawing along an XXXVIIb-XXXVIIb line in FIG. 36.

As shown in FIGS. 36 to 37B, after the resist mask covering the lower-layer core material being removed from in the contact formation region 200, a sidewall film (sidewall mask) 71 is formed on the side face of the lower-layer core material 62B by the second sidewall formation process in substantially the same manner as in the first and second embodiments. The line width LW2 of the sidewall mask 71 is formed so as to have a dimension about ¼ the critical dimension of the resolution of photolithography.

As described above, as shown in FIGS. 36 and 37A, the line portion 621 of the lower-layer core material 62B in the memory cell array 100 is slimmed to have a line width about ¼ the critical dimension of the resolution of photolithography. Thus, the interval CW2 between the sidewall masks 71 across the line portion 621 in the memory cell array 100 is set to about ¼ the critical dimension of the resolution of photolithography.

On the other hand, as shown in FIGS. 36 and 37B, the line width CW3 of the portion 625 covered with a resist mask is not slimmed in a leading region 150 by, as described above, the portion 625 of the lower-layer core material 62B in the contact formation region 200 being covered with the resist mask during slimming processing. Thus, the line width CW3 (=LW1) of the portion 625 of the lower-layer core material 62B in the contact formation region 200 is larger than the line width CW2 of the portion 621 of the lower-layer core material 62B in the memory cell array 100.

Therefore, the interval LW1 between the sidewall masks 71 across the portion (a spacer portion, contact spacer pattern) 625 of the lower-layer core material 62B that is not slimmed in the contact formation region 200 is larger than the interval CW2 between the sidewall masks 71 across the portion (an interconnect spacer pattern) 621 of the lower-layer core material 62B that is slimmed.

The line width LW1 of the portion 625 of the lower-layer core material 62B in the contact formation region 200 has, for example, a size about half (½) the critical dimension of the resolution of photolithography. Thus, the sidewall masks 71 across the portion 625 of the lower-layer core material 62B are adjacent to each other with the interval D2W about ½ the critical dimension of the resolution of photolithography.

Therefore, the interval D2W (CW3, LW1) lager than about twice the interval CW2 between the sidewall masks 71 opposite to each other across the core material 62 in the memory cell array 100 is secured between the sidewall masks 71 opposite to each other across the core material 62B in the contact formation region 200 of the leading region 150.

Figure 38:
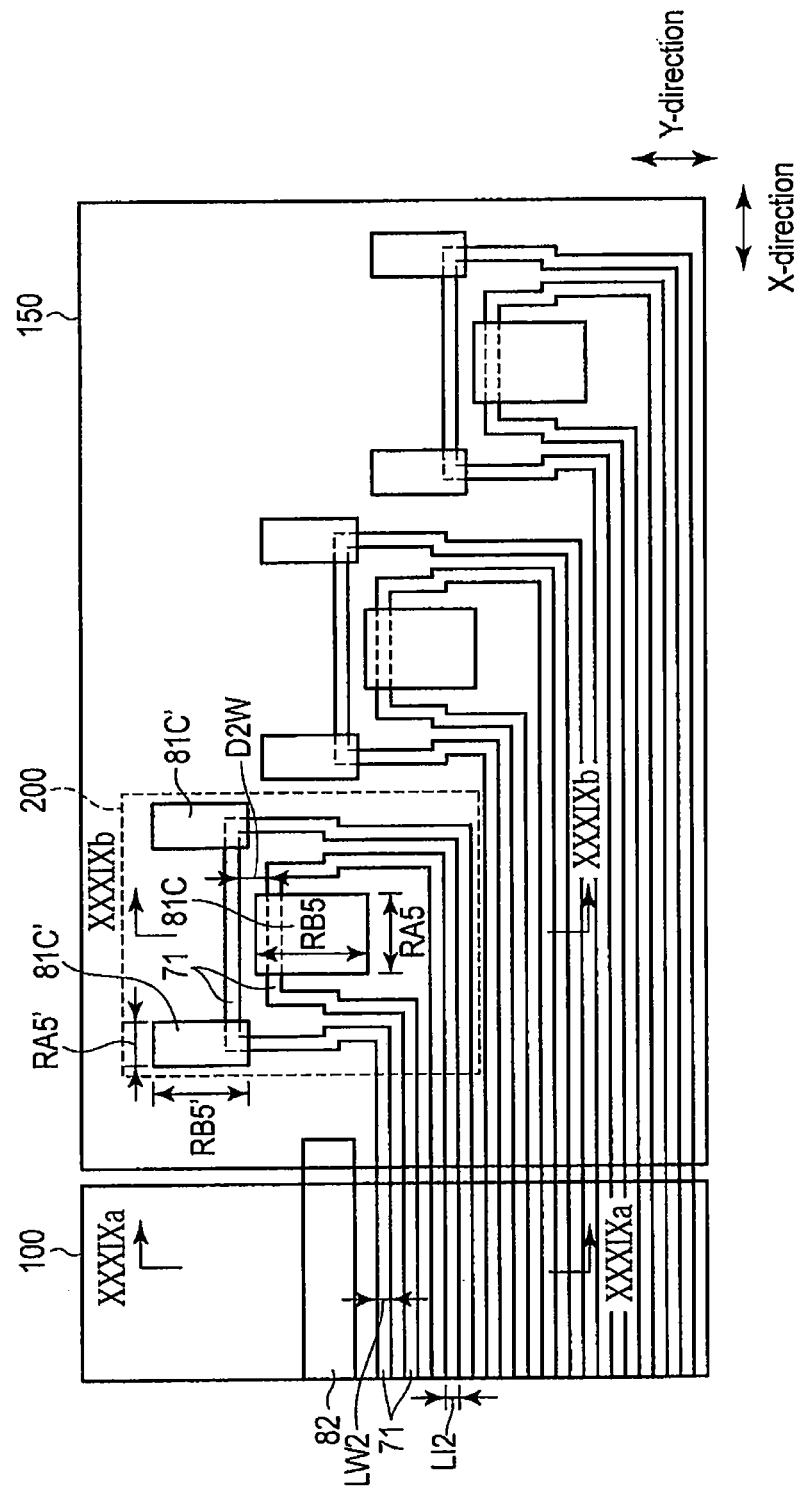
FIG. 38 is a plan view showing a process of the method of manufacturing the semiconductor device according to the third embodiment.

A process of the method of Manufacturing a flash memory according to the present embodiment will be described using FIGS. 38 to 39B. FIG. 38 shows a plan view of a-portion of the memory cell array and the leading region in a process of the method of manufacturing a flash memory according to the present embodiment. FIGS. 39A and 39B show sectional process drawings corresponding to FIG. 38. FIG. 39A shows a sectional process drawing along an XXXIXa-XXXIXa line in FIG. 38. FIG. 39B shows a sectional process drawing along an XXXIXb-XXXIXb line in FIG. 38.

As shown in FIGS. 38, 39A, and 39B, the lower-layer core material is selectively removed and the sidewall mask 71 remains on a mask layer 60.

Then, as shown in FIGS. 38 and 39B, resist masks 81C, 81C' are formed by photolithography and etching in the formation positions of pads in the contact formation region 200 so as to cover a portion of the sidewall mask 71. For example, the resist masks 81C, 81C' provided in the formation positions of pads are formed by a process common to a resist mask 82 to form a select gate line to suppress an increase of manufacturing processes.

For example, the resist masks 81C, 81C' are formed so as not to be aligned on the same straight line in the direction (here, the Y direction) in which the sidewall masks 71 are adjacent to each other in the contact formation region 200. In the sidewall masks 71 formed by using the common core material, a resist mask 81C' for the sidewall mask 71 on the outer side (outer circumferential side of the core material) and a resist mask 81C for the sidewall mask 71 on the inner side (inner circumferential side of the core material) are drawn out from the sidewall masks 71 in the opposite directions. In the sidewall mask 71 on the outer side, one resist mask 81C' is provided at one end and the other end (corner, nook) of a bent portion of the sidewall mask. In the sidewall mask 71 on the inner side, on the other hand, the resist mask 81C is provided in an intermediate position between the one end and the other end of the bent portion. Sizes RA5, RB5 of the resist mask 81C are larger than sizes RA5', RB5' of the resist mask 81C'.

The interval D2W between the sidewall masks 71 in the contact formation region 200 is larger than the interval LI2 between the sidewall masks 71 in the memory cell array 100. The interval D2W between the sidewall masks 71 in the contact formation region 200 depends on the line width LW1 of the sidewall spacer to pattern the lower-layer core material. For example, the interval D2W in the contact formation region 200 is set to a size about twice the interval LI2 between the sidewall masks 71 in the memory cell array 100. As a result, in the method of manufacturing a flash memory according to the present embodiment, a space to arrange the resist masks 81C, 81C' to form a pad and a space in consideration of a processing margin are secured for the sidewall masks 71 formed by using some common lower-layer core material and the resist masks 81C, 81C' can be inhibited from coming into contact with the other adjacent resist masks 81C, 81O' or the adjacent sidewall mask 71.

Figure 40:
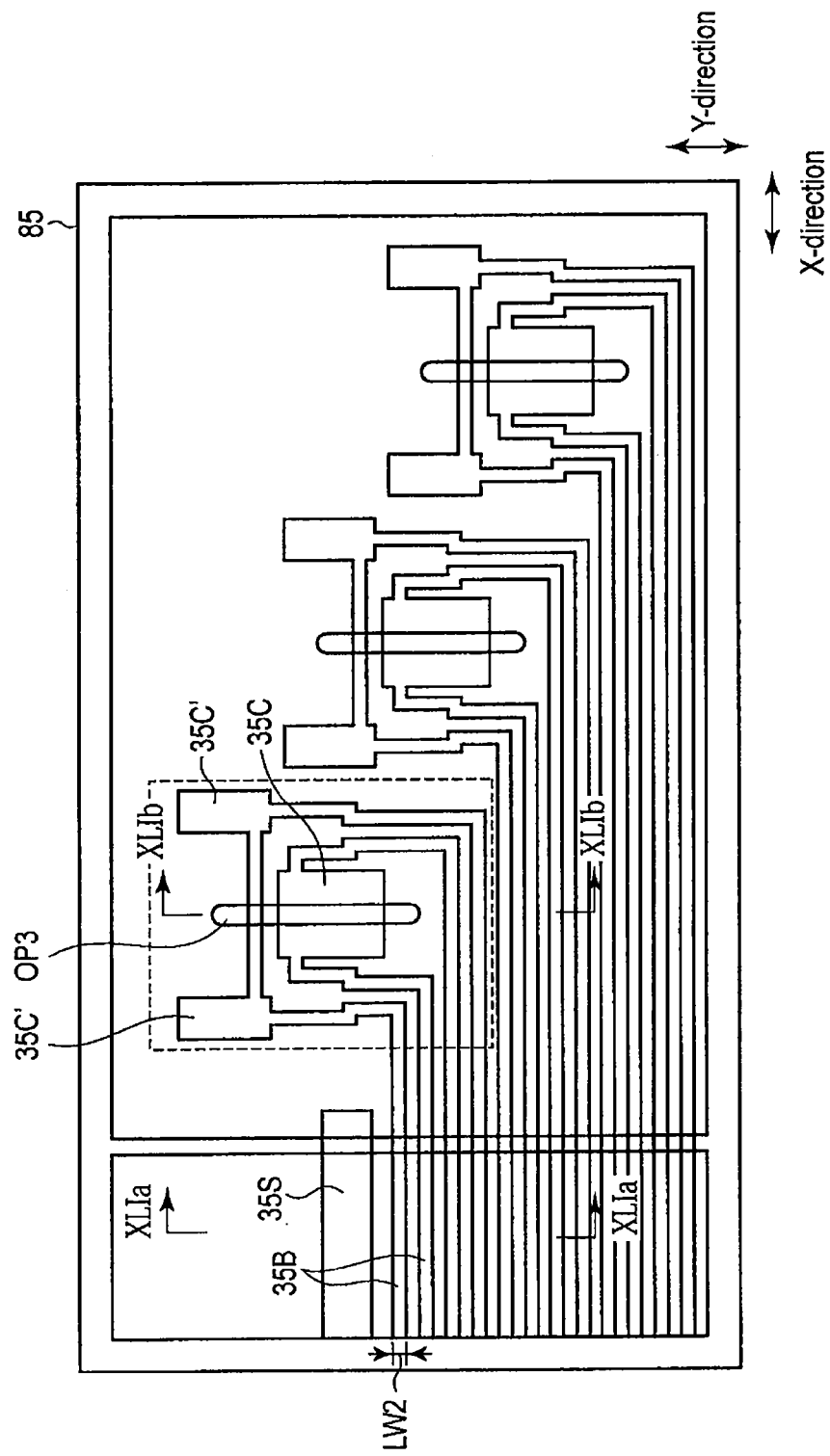
FIG. 40 is a plan view showing a process of the method of manufacturing the semiconductor device according to the third embodiment.
Figure 41A:
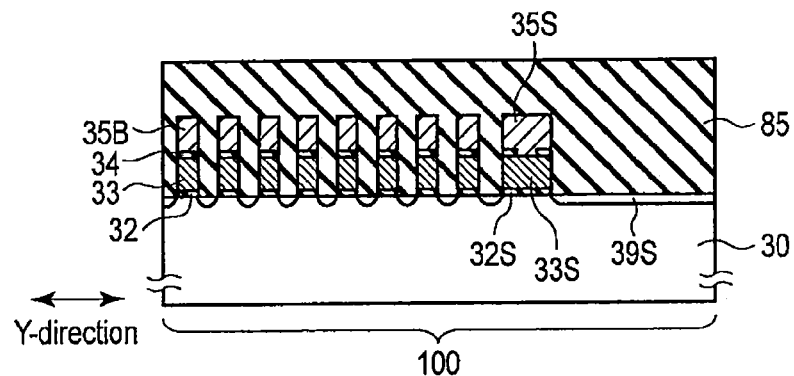
FIGS. 41A and 41B are sectional views showing a process of the method of manufacturing the semiconductor device according to the third embodiment.
Figure 41B:
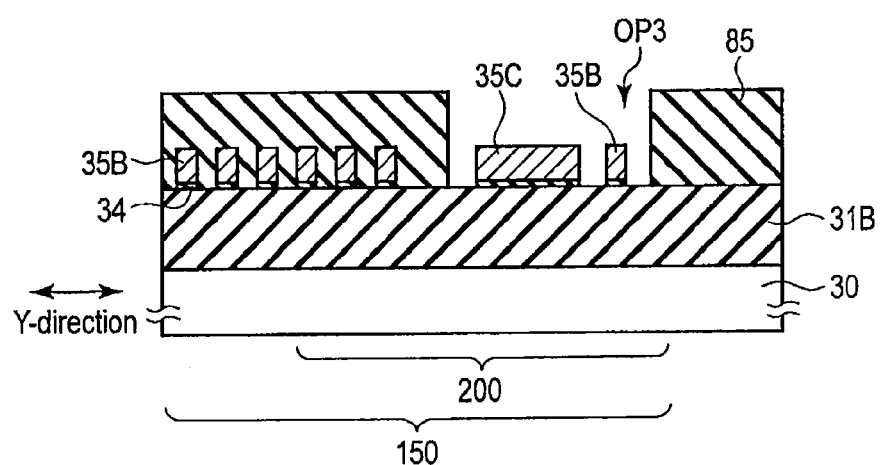

A process of the method of manufacturing a flash memory according to the present embodiment will be described using FIGS. 40 to 41B. FIG. 40 shows a plan view of a portion of the memory cell array and the leading region in a process of the method of manufacturing a flash memory according to the present embodiment. FIGS. 41A and 41B show sectional process drawings corresponding to FIG. 40. FIG. 41A shows a sectional process drawing along a XXXIXa-XXXIXa line in FIG. 40. FIG. 41B shows a sectional process drawing along a XXXIXb-XXXIXb line in FIG. 40.

As shown in FIGS. 40, 41A, and 41B, the mask layer is processed based on the sidewall mask and resist mask by a process (for example, the process shown in FIGS. 20 to 22) substantially the same as the method of manufacturing a flash memory according to the first and second embodiments. The mask layer to which patterns of the sidewall mask and the resist mask are transferred is used as a mask to process the processed layer below the mask layer. Accordingly, a conductive layer 35B in a closed loop shape and a memory cell are formed in the memory cell array 100 and the leading region 150 respectively. A rectangular conductive layer (rectangular portion) 35C to form a pad is connected to the conductive layer 35B in a closed loop shape. The rectangular portion 35C is a layer that is continuous to the conductive layer 35B in a closed loop shape.

After the mask layer to form the conductive layer 35B in a closed loop shape and the memory cell being removed, a loop-cut process is executed on the conductive layer 35B in a closed loop shape.

A resist mask 85 having a pattern to divide the conductive layer 35B in a closed loop shape is formed in the memory cell array 100 and the leading region 150. A straight opening OP3 is formed in the resist mask 85 in the contact formation region 200. The line portion of the conductive layer 35B in a closed loop shape on the outer side in the contact formation region 200 is divided and also the rectangular portion 35C of the conductive layer in a closed loop shape on the inner side is divided in the X direction based on the resist mask 85.

As shown in FIGS. 32 and 33, word lines WL independent of each other and the pad 35P connected to each word line WL are formed by the loop-cut process on the conductive layer 35B in a closed loop shape. Thereafter, like in the first and second embodiments, the inter-layer insulating film, contact plug/via plug, and intermediate wiring layer/bit line are sequentially formed.

With the above manufacturing processes, a flash memory according to the present embodiment is formed.

In the method of manufacturing a flash memory according to the present embodiment, as described above, like in the first and second embodiments, the mask layer and the processed layers are sequentially patterned and processed by using the sidewall transfer process (or the sidewall formation process) executed twice so that the line width LW2 of the word line WL and the interconnect interval LI2 between the word lines WL have a size about ¼ the critical dimension of the resolution of photolithography.

In the present embodiment, when slimming processing on the lower-layer core material (or the sidewall spacer) to form the sidewall mask 71 corresponding to the pattern of the word line WL is performed, the line width CW2 of the core material 62B in the memory cell array 100 is made selectively slimmer without the line width LW1 of the core material 62B in the contact formation region 200 being made slimmer by covering the core material in the contact formation region 200 with a mask. Thus, the interval D2W (=LW1) between the sidewall masks 71 in the contact formation region 200 is made larger than the interval CW2 between the sidewall masks 71 in the memory cell array 100 by forming the sidewall mask 71 on the core material 62B having different line widths LW1, CW2 in the contact formation region 200 and the memory cell array 100.

For example, regarding the sidewall mask 71 formed by using core materials having different line widths LW1, CW2 in the contact formation region 200 and the memory cell array 100, the interval D2W between the sidewall masks 71 in the contact formation region 200 can be adjusted by controlling the line width (film thickness) LW1 of the sidewall spacer to pattern the core material 623. Accordingly, the method of manufacturing a flash memory according to the present embodiment can make the interval D2W between the sidewall masks 71 and between the interconnects WL in the contact formation region 200 larger than the interval LI2 between the sidewall masks 71 and between the interconnects WL in the memory cell array 100 by a relatively simple process. The interval D2W between the sidewall masks 71 and between the interconnects WL in the contact formation region 200 becomes larger than the line width LW2 of the sidewall mask 71 and the interconnect WL formed based on the mask 71.

Therefore, the method of manufacturing a flash memory according to the present embodiment can, like in the first and second embodiments, secure a space for pad arrangement and a processing margin in the contact formation region 200 of the leading region 150. Then, the method of manufacturing a flash memory according to the present embodiment can, like in the first and second embodiments, prevent a short (short circuit) that may arise between the pad, interconnect, and contact in the contact formation region 200 and device failures caused by the short can be reduced.

Therefore, according to the method of manufacturing a semiconductor device in the third embodiment, like the first and second embodiments, a semiconductor device including a fine pattern whose reliability is improved can be provided.

(4) Fourth Embodiment

The structure of a semiconductor device (for example, a flash memory) according to the fourth embodiment and the method of manufacturing the semiconductor device will be described with reference to FIGS. 42 to 48. In the present embodiment, substantially the same members and functions as structural elements included in a semiconductor device in the first to third embodiments will be described when necessary. Also in the present embodiment, substantially the same processes as processes included in the method of manufacturing a semiconductor device in the first to third embodiments will be described when necessary.

(a) Structure

Figure 42:
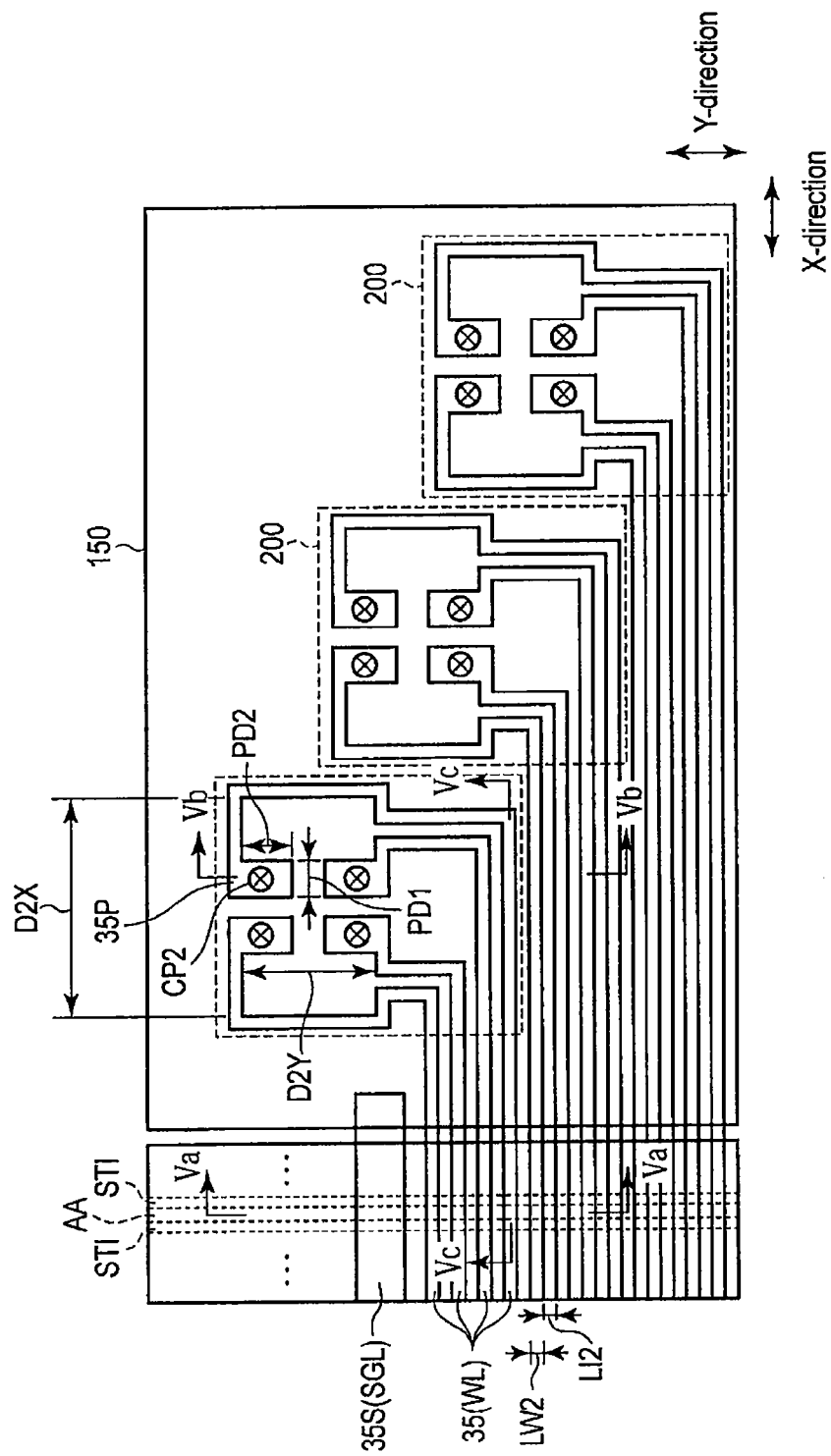
FIG. 42 is a plan view showing the structure of a semiconductor device according to a fourth embodiment.

The structure of a flash memory according to the fourth embodiment will be described using FIG. 42. FIG. 42 is a plan view showing a planar structure of a flash memory according to the present embodiment.

Section structures along a Va-Va line, a Vb-Vb line, and a Vc-Vc line in FIG. 42 are substantially the same as structures shown in FIGS. 5A, 5B, and 5C shown above respectively and thus, a description thereof is omitted.

A flash memory according to the present embodiment has, like in the first to third embodiments, an interconnect (for example, a word line) WL of a line width LW2 smaller than the critical dimension of the resolution of photolithography formed by using a sidewall formation/transfer process executed 2 times (2n times, n=1 in the present embodiment). In a flash memory according to the present embodiment, four (4", n=1 in the present embodiment) word lines WL as a group extend from in a memory cell array 100 into one contact formation region 200. In the contact formation region 200, each word line WL is connected to, for example, the vertex (corner) of the pad 35P.

Each of the pads 35P corresponding to the word line WL in one group in the contact formation region 200 is laid out to be symmetric with respect to center lines (symmetry axes) along the X direction and the Y direction. Among the word lines WL on the outer side (outer circumferential side) and the word lines WL on the inner side (inner circumferential side), the word lines WL on the outer side have a shape swollen to the outer side near the connection position of the pad 35P of the word line WL on the inner side.

In a flash memory according to the present embodiment, like in the first to third embodiments, an interval D2Y between the word lines WL in the Y direction in the contact formation region 200 is larger than at least one of a line width LW2 of the word line WL and an interval LI2 between the word lines WL in the memory cell array 100. Thus, also in a flash memory according to the present embodiment, like in the first to third embodiments, a space for pad arrangement and a processing margin in the contact formation region 200 can be secured so that device failures caused by a short between the pad, interconnect, and contact can be reduced.

In a flash memory according to the present embodiment, such as a manufacturing method described later, the sidewall spacer is formed so that the line width of the first sidewall film (sidewall spacer) becomes the line width (for example, ¼ the critical dimension of the resolution of photolithography) of the formed interconnect. A sidewall film (sidewall mask) as a mask to form a word line is formed on the side face of a pattern corresponding to the sidewall spacer and a mask formed by photolithography.

Also according to a semiconductor device in the fourth embodiment, like in the first to third embodiments, the reliability of the semiconductor device including a fine pattern can be improved.

(b) Manufacturing Method

The method of manufacturing a semiconductor device (for example, a flash memory) according to the fourth embodiment will be described by using FIGS. 42 to 48.

Figure 43:
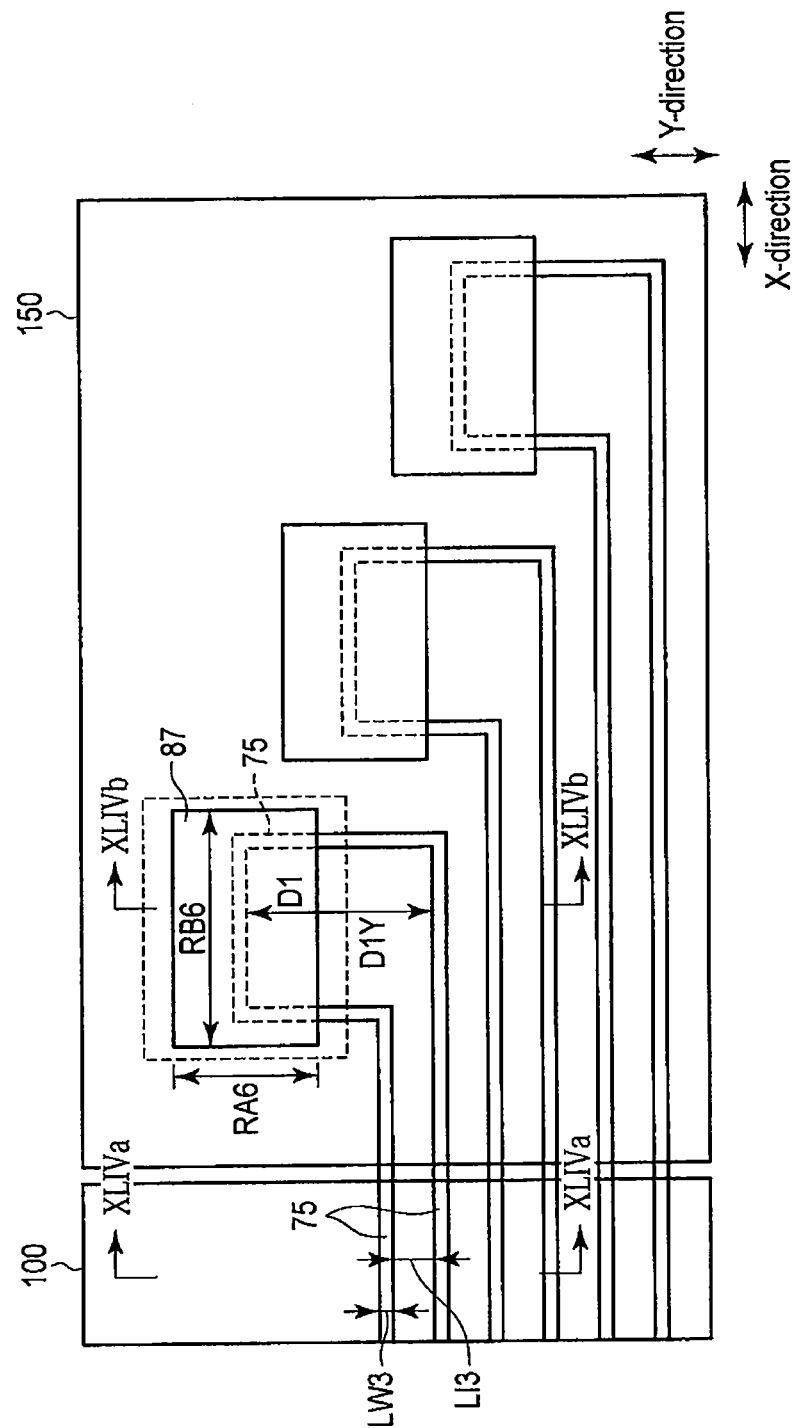
FIG. 43 is a plan view showing a process of the method of manufacturing the semiconductor device according to the fourth embodiment.

A process of the method of manufacturing a flash memory according to the present embodiment will be described using FIGS. 43 to 44B. FIG. 43 shows a plan view of a portion of the memory cell array and the leading region in a process of the method of manufacturing a flash memory according to the present embodiment. FIGS. 44A and 44B show sectional process drawings corresponding to FIG. 43. FIG. 44A shows a sectional process drawing along an XLIVa-XLIVa line in FIG. 43. FIG. 44B shows a sectional process drawing along an XLIVb-XLIVb line in FIG. 43.

After the line width of an upper-layer core material having a fringe being made to a size about ½ the critical dimension of the resolution of photolithography by the process substantially the same as the process shown in FIGS. 6 to 8, a sidewall spacer having the line width about ½ the critical dimension of the resolution of photolithography is formed on the side face of the upper-layer core material by the first sidewall formation process.

As shown in FIGS. 43 to 44B, after a sidewall spacer 75 being formed on the side face of the upper-layer core material, the upper-layer core material is selectively removed by wet etching, dry etching, or ashing.

Then, slimming processing is performed on the sidewall spacer 75. Accordingly, a line width LW3 of the sidewall spacer 75 is slimmed to a size about ¼ the critical dimension of the resolution of photolithography.

As shown in FIGS. 43 and 44A, an interval LI3 of the sidewall spacer 75 in the Y direction corresponds to the dimension of a line & space pattern formed by the line portion of the upper-layer core material and the etched dimension of the sidewall spacer 75 and the interval LI3 is set to, for example, a size about ¾ the critical dimension of the resolution of photolithography, that is, a size three times the line width LW3 of the sidewall spacer 75.

As shown in FIGS. 43 and 44B, an interval D1Y between the sidewall spacers 75 in the Y direction in a pad formation region in the contact formation region 200 corresponds to the size of the fringe of the upper-layer core material and is set to a size larger than, for example, the critical dimension of the resolution of photolithography.

A resist mask 87 is formed in the contact formation region 200 so as to cover the slimmed sidewall spacer 75. For example, dimensions RA6, RB6 of the resist mask 87 in the X direction and the Y direction are larger than the critical dimension of the resolution of photolithography.

The line width LW3 of the sidewall spacer 75 may be set to about ¼ the critical dimension of the resolution of photolithography and the interval between the sidewall spacers 75 may be set to about ¾ the critical dimension of the resolution of photolithography by performing slimming processing on the sidewall spacer 75 without removing the upper-layer core material by adjusting the line width of the upper-layer core material and the interval between upper-layer core materials.

Figure 45:
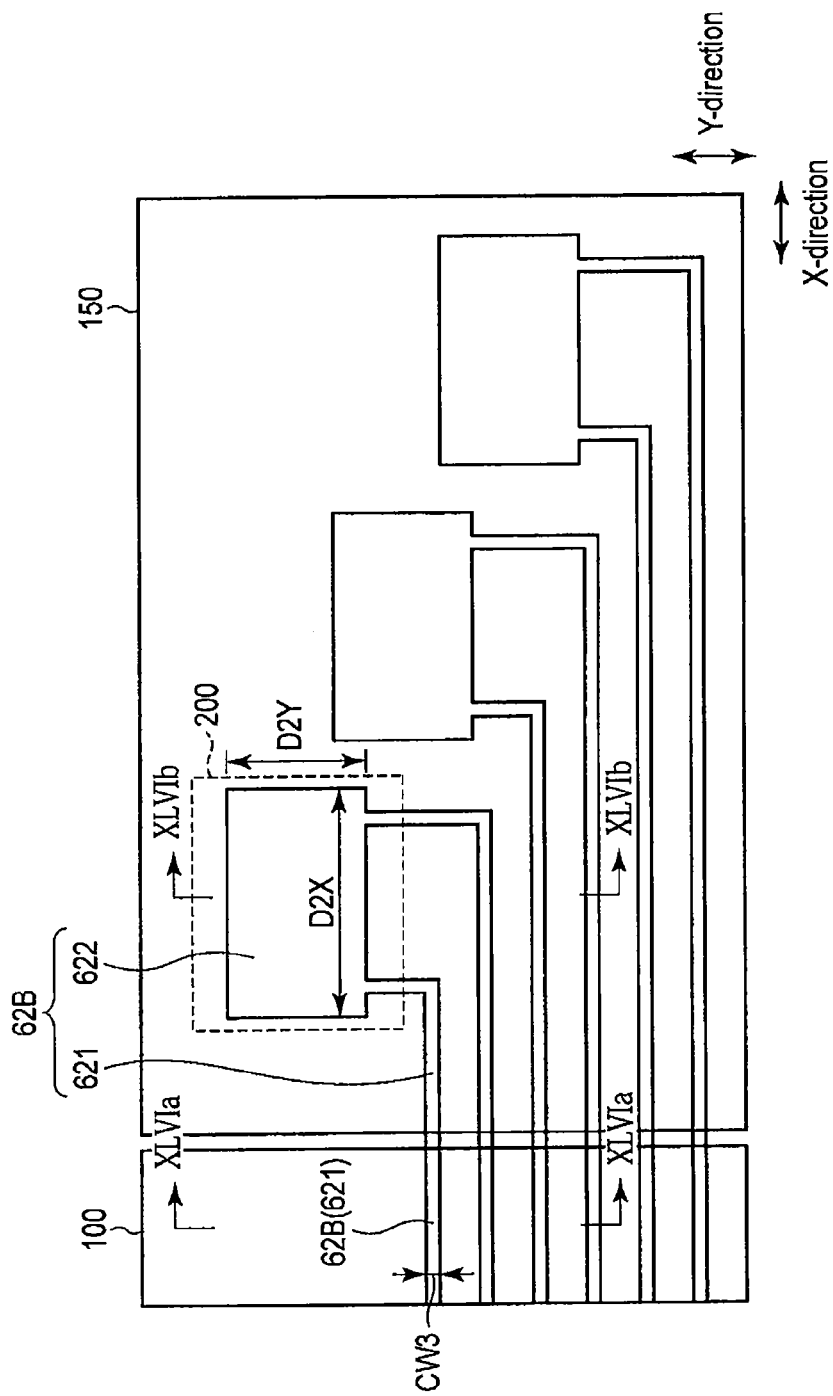
FIG. 45 is a plan view showing a process of the method of manufacturing the semiconductor device according to the fourth embodiment.

A process of the method of manufacturing a flash memory according to the present embodiment will be described using FIGS. 45 to 46B. FIG. 45 shows a plan view of a portion of the memory cell array and the leading region in a process of the method of manufacturing a flash memory according to the present embodiment. FIGS. 46A and 46B show sectional process drawings corresponding to FIG. 45. FIG. 46A shows a sectional process drawing along a XLVIa-XLVIa line in FIG. 45. FIG. 46B shows a sectional process drawing along a XLVIb-XLVIb line in FIG. 45.

As shown in FIGS. 45 to 46B, an intermediate layer is processed based on a slimmed sidewall spacer and a resist mask covering the sidewall spacer by the process substantially the same as the manufacturing process of each of the above embodiments and patterns of the sidewall spacer and the resist mask are transferred to the intermediate layer. After the sidewall spacer and the resist mask being removed, an intermediate layer 63B to which patterns have been transferred is used as a mask to process a lower-layer core material 62B.

Accordingly, a pattern of the sidewall spacer slimmed to a dimension smaller than ½ the critical dimension of the resolution of photolithography and a pattern of the resist mask are transferred to the lower-layer core material 62B.

In the present embodiment, the sidewall spacer and the resist mask in FIGS. 43 to 44B may be formed directly on the lower-layer core material without forming a BARC film and an intermediate layer to transfer patterns of the sidewall spacer and the resist mask directly to the lower-layer core material.

As shown in FIGS. 45 and 46A, a line portion 621 of the lower-layer core material 62B is formed in the memory cell array 100. The line portion (interconnect spacer pattern) 621 of the lower-layer core material 62B in the memory cell array 100 is formed so as to correspond to the sidewall spacer pattern by the first sidewall formation process. A line width CW4 of the line portion 621 of the lower-layer core material 62B in the memory cell array 100 has a size, substantially like the line width LW3 of the sidewall spacer, about ¼ the critical dimension of the resolution of photolithography. An interval CI3 between the line portions 621 of the lower-layer core material 62B in the memory cell array 100 is set to about three times the line width CW4 of the line portion 621.

As shown in FIGS. 45 and 46B, a rectangular portion (contact spacer pattern) 622 of the lower-layer core material 62B is formed so as to be connected to the line portion 621 extending from in the memory cell array 100 in the contact formation region 200 of a leading region 150. For example, the line portion (interconnect spacer pattern) 621 is formed so as to be connected to a spot that is not a vertex of the rectangular portion 622.

The rectangular portion 622 of the lower-layer core material 62B is formed to correspond to the pattern and size of a resist mask covering the sidewall spacer. In the patterned lower-layer core material 62B, a dimension D2X of the rectangular portion 622 in the X direction and a dimension D2Y of the rectangular portion 622 in the Y direction are equal to the critical dimension of the resolution of photolithography or more.

Figure 47:
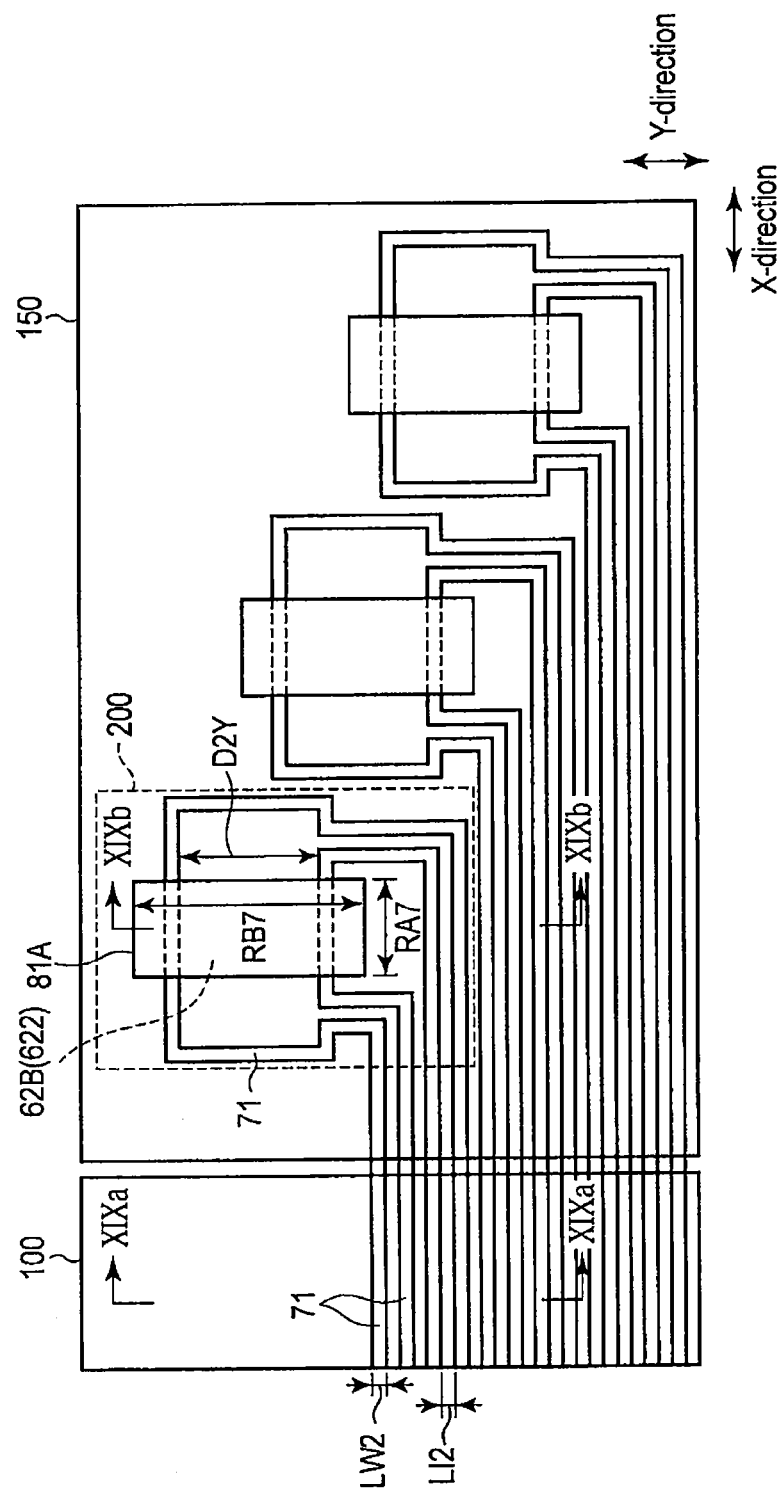
FIG. 47 is a plan view showing a process of the method of manufacturing the semiconductor device according to the fourth embodiment.

A process of the method of manufacturing a flash memory according to the present embodiment will be described using FIGS. 47. FIG. 47 shows a plan view of a portion of the memory cell array and the leading region in a process of the method of manufacturing a flash memory according to the present embodiment. The sectional process drawing along a XVIIa-XVIIa line in FIG. 47 corresponds to FIG. 17A or FIG. 19A and the sectional process drawing along a XVIIb-XVIIb line in FIG. 47 corresponds to FIG. 17B or FIG. 19B.

As shown in FIGS. 47, 17A and 17B, a sidewall mask 71 by the second sidewall formation process is formed on the side face of a lower-layer core material (not shown) by substantially the same method as the manufacturing process shown in FIGS. 16 to 18.

The line width LW2 of the sidewall mask 71 has, for example, a size about ¼ the critical dimension of the resolution of photolithography.

As shown in FIGS. 47 and 17A, an interval LI2 between the sidewall masks 71 in the memory cell array 100 has, for example, a size about ¼ the critical dimension of the resolution of photolithography.

As shown in FIGS. 47 and 17B, the sidewall mask 71 in the contact formation region 200 is bended in accordance with the shape of the rectangular portion of the lower-layer core material 62B. The sidewall masks 71 formed on the side face of the common rectangular portion are spaced with a dimension larger than the line width LW2 of the sidewall mask 71 or the interval LI2 between the sidewall masks 71 in the memory cell array 100, for example, with the dimension D2Y equal to the critical dimension of the resolution of photolithography or more.

After the sidewall mask 71 being formed in substantially the same manner as the manufacturing process shown in FIGS. 16 to 18, a resist mask 81A is formed by photolithography and etching so as to cover the portion 622 of the lower-layer core material in the contact formation region 200 and the sidewall mask 71 on the side face of the portion 622. Dimensions RA7, RB7 of the resist mask 81A in the X direction and the Y direction are equal to the critical dimension of the resolution of photolithography or more. For example, the dimension RB7 of the resist mask 81A in the Y direction is set to a size equal to the sum of twice the line width LW2 of the sidewall mask 71 and the interval D2Y between the sidewall masks 71 in the Y direction in the contact formation region 200 or more.

Then, selective wet etching or dry etching of the lower-layer core material 62B is performed while a portion 622' of the lower-layer core material 62B in the contact formation region 200 is covered with the resist mask 81A. In the present embodiment, for example, ashing is not used as a method of removing the lower-layer core material.

Accordingly, as shown in FIGS. 47 and 19A, the lower-layer core material in the memory cell array 100 is removed. On the other hand, as shown in FIGS. 47 and 19B, the portion 622' of the lower-layer core material 62B covered with the resist mask 81A in the contact formation region 200 remains.

Figure 48:
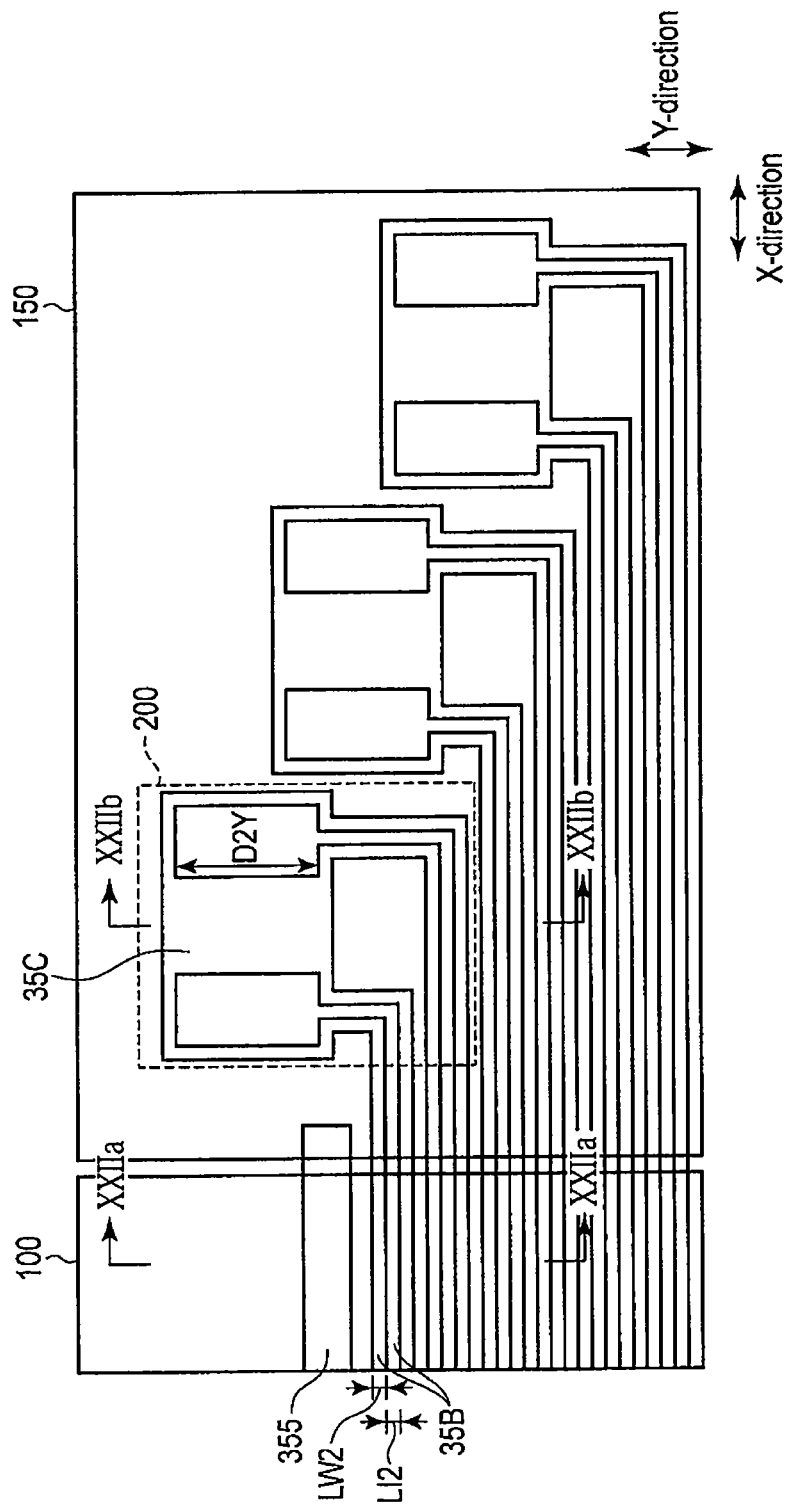
FIG. 48 is a plan view showing a process of the method of manufacturing the semiconductor device according to the fourth embodiment.

A process of the method of manufacturing a flash memory according to the present embodiment will be described using FIGS. 48. FIG. 48 shows a plan view of a portion of the memory cell array and the leading region in a process of the method of manufacturing a flash memory according to the present embodiment. The sectional process drawing along an XXIIa-XXIIa line in FIG. 48 corresponds to FIG. 22A and the sectional process drawing along an XXIIb-XXIIb line in FIG. 48 corresponds to FIG. 22B.

As shown in FIGS. 48, 22A, and 22B, after the resist mask being removed by using the method substantially the same as the manufacturing process shown in FIGS. 20 to 21B, a mask layer on the processed layer is processed by using the sidewall mask and a remaining lower-layer core material portion as masks to form a mask layer (lower-layer mask) 60A to which patterns of the sidewall mask and the remaining lower-layer core material are transferred.

For example, like in the first embodiment, a mask (resist mask) to form a pattern of a select gate line may be formed between the process of removing the resist mask covering the retained lower-layer core material and the process to process the lower-layer mask 60A.

After the sidewall mask and the remaining lower-layer core material being removed by the process substantially the same as the manufacturing process shown in FIGS. 22A and 22B, the processed layers (the conductive layer and the insulating layer) below the mask layer 60A are processed by using the patterned mask layer (lower-layer mask) 60A as a mask. A conductive layer 35B in a closed loop shape and a floating gate electrode 33 are formed in the memory cell array 100 and the leading region 150.

As shown in FIGS. 48 and 22B, a rectangular pattern (rectangular conductive layer) 35C of a dimension larger than the line width LW3 of the conductive layer 35B or the interval LI2 between the conductive layers 35B in the memory cell array 100 (for example, equal to the critical dimension of the resolution of photolithography or more) is formed in the contact formation region 200 in accordance with the shape of the remaining lower-layer core material in the process shown in FIGS. 47, 19A, and 19B.

After the mask layer 60 being removed, a resist mask having a cross opening is formed in the memory cell array 100 and the leading region 150 in substantially the same manner as the process shown in FIGS. 23 to 24B. The upper surface of the rectangular pattern 35C in the contact formation region 200 is exposed via the cross opening. Then, etching processing of the exposed rectangular conductive layer 35C is performed. As shown in FIG. 42, like in the first embodiment, the one rectangular conductive layer 35C is divided into the four pads 35P by the loop-cut process and also the word lines WL independent of each other are formed.

Then, like in the first to third embodiments, the inter-layer insulating film, contact plug/via plug, and intermediate wiring layer/bit line are sequentially formed.

With the above manufacturing processes, a flash memory according to the present embodiment is formed.

In the method of manufacturing a flash memory according to the present embodiment, when a mask pattern to process a core material for the second sidewall film (sidewall mask) is formed, a resist mask 87 is formed in the contact formation region 200 so as to cover the first sidewall film (sidewall spacer of the line width LW2) 75 having the line width of the interconnect (word line) to be formed. The pattern 75 of the sidewall spacer set to the line width (film thickness) in accordance with the line width of the resist mask 87 and the word line WL is transferred to the core material to form the sidewall mask 71.

Then, the sidewall mask 71 is formed on the side face of the core material by the second sidewall formation process. Accordingly, the sidewall mask 71 has the line width LW2 of the word line WL to be formed and also the interval D2Y between the second sidewall films 71 in the contact formation region 200 becomes larger than the interval between the second sidewall films 71 in the memory cell array 100 in accordance with the size of the resist mask 87 covering the first sidewall spacer 75.

In a flash memory according to the present embodiment, the resist mask 87 is formed so as to cover the core material in the contact formation region 200 before the core material to form the sidewall mask 71 is removed. A pattern to form a pad is formed based on the mask 87.

In this manner, the interval D2Y between the interconnects WL (or the sidewall masks) in the contact formation region 200 can be made larger than the line width LW2 of the interconnect WL (or the sidewall mask) and the interval LI2 between the interconnects WL (or the sidewall masks) in the memory cell array 100.

Therefore, according to the method of manufacturing a flash memory in the present embodiment, like in the first to third embodiments, a large space for pad arrangement and a processing margin can be secured in the contact formation region 200 of the leading region 150. As a result, according to the method of manufacturing a flash memory in the present embodiment, like in the first to third embodiments, a short (short circuit) that may arise between the pad, interconnect, and contact in the contact formation region 200 can be prevented and device failures caused by the short can be reduced.

Therefore, according to the method of manufacturing a semiconductor device in the fourth embodiment, like the first and third embodiments, a semiconductor device including a fine pattern whose reliability is improved can be provided.

(5) Fifth Embodiment

The structure of a semiconductor device according to the fifth embodiment and the method of manufacturing the semiconductor device will be described with reference to FIGS. 44 to 61B. In the present embodiment, substantially the same members and functions as structural elements included in a semiconductor device in the first to fourth embodiments will be described when necessary. Also in the present embodiment, substantially the same processes as processes included in the method of manufacturing a semiconductor device in the first to fourth embodiments will be described when necessary.

(a) Structure

The structure of a semiconductor device (for example, a flash memory) according to the fifth embodiment will be described using FIGS. 49 and 50.

Figure 49:
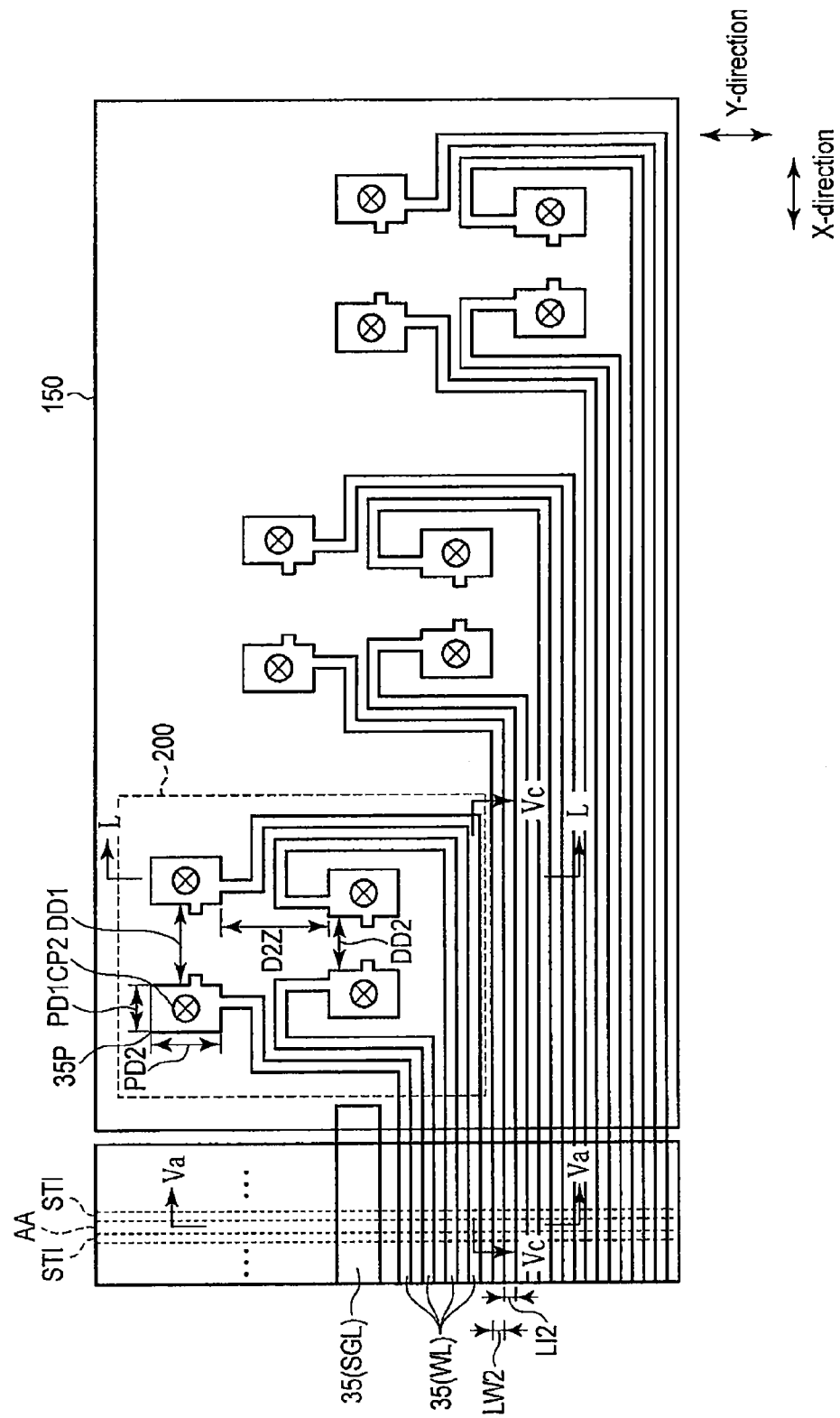
FIG. 49 is a plan view showing the structure of a semiconductor device according to a fifth embodiment.

FIG. 49 shows a planar structure of a flash memory according to the present embodiment. FIG. 50 shows a section structure along an L-L line in FIG. 49. Section structures along a Va-Va line and a Vc-Vc line in FIG. 49 are substantially the same as structures shown in FIGS. 5A and 5C respectively and thus, a description thereof is omitted.

Figure 50:
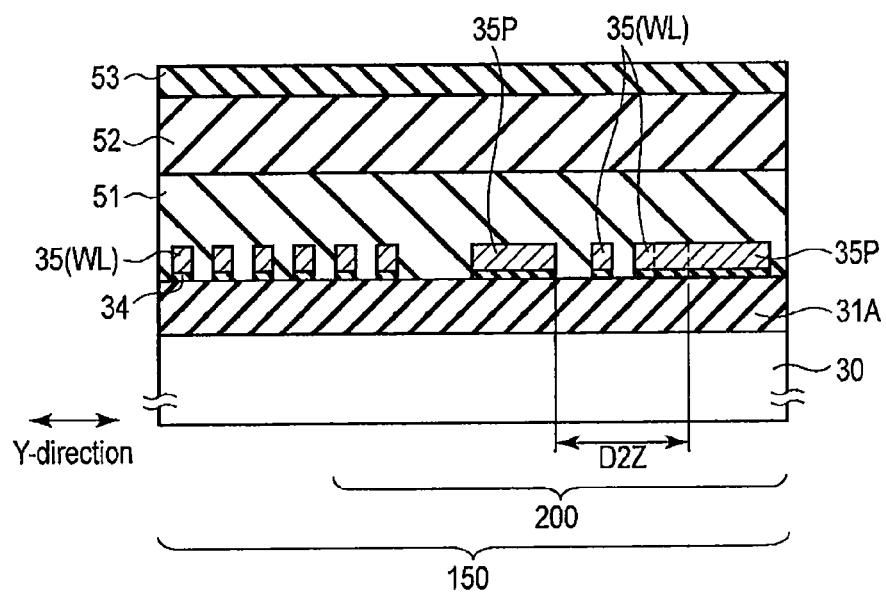
FIG. 50 is a sectional view showing the structure of the semiconductor device according to the fifth embodiment.

As shown in FIGS. 49 and 50, like in the first to fourth embodiments, four word lines WL as a group are led from in a memory cell array 100 into a contact formation region 200 of a leading region 150. In the contact formation region 200, a pad 35P connected to each word line WL is laid out to be symmetric with respect to a center line (symmetry axis) along the Y direction.

Also in a flash memory according to the present embodiment, a line width LW2 of the word line WL and an interval LI2 between the word lines WL in the memory cell array 100 are set to a size about ¼ the critical dimension of the resolution of photolithography.

In the contact formation region 200, the word line WL formed on the outer side (outer circumferential side) and the pad 35P of the word line WL are drawn out (projected) to the side opposite to the side (projecting side) to which the word line WL formed on the inner side (inner circumferential side) and the pad 35P of the word line WL are drawn out.

Intervals DD1, DD2 between the pads 35P connected to the word lines WL in the X direction are larger than at least one of the line width LW2 of the word line WL and the interval LI2 between the word lines WL in the memory cell array 100. For example, the interval DD1 in the X direction between the pads 35P of the word lines WL on the outer side is larger than the interval DD2 in the X direction between the pads 35P of the word lines WL on the inner side.

In a flash memory according to the present embodiment, like in the first to fourth embodiments, an interval D2Z between the word line WL and the pad 35P in the contact formation region 200 is larger than at least one of the line width LW2 of the word line WL and the interval LI2 between the word lines WL in the memory cell array 100.

In the first to fourth embodiments, when some member is selectively removed in accordance with the combination of materials used for the mask and core material to prevent losses and defects of the pattern (for example, a contact spacer pattern) to be retained, wet etching or dry etching may be used because ashing cannot be used.

However, it may be preferable to remove (or process) the member by ashing due to restrictions of materials used for members to form a pattern of the mask or core material or restrictions of processes executed successively or to make the processes more efficient.

In the method of manufacturing a flash memory according to the present embodiment described later, the plane pattern of a fringe formed in a core material is set to a concave plane pattern and a depressed portion of the concave plane pattern is covered with a resist mask. For example, a sidewall material before being etched back is formed between the fringe (carbon compound) and resist mask and between the resist mask and a foundation layer (for example, a BARC film). Accordingly, the area of the fringe overlapping with the resist mask vertically is reduced so that when the core material below the resist mask covering the fringe is selectively removed by ashing, losses and defects of a predetermined pattern (for example, a pattern to secure a large interval between interconnects) can be prevented. Therefore, According to a flash memory in the present embodiment and the manufacturing method described later, the predetermined pattern can be retained and an occurrence of a defect or failure of a flash memory resulting from processes can be prevented. Also according to a flash memory in the present embodiment, flexibility of processes can be increased.

Therefore, according to a semiconductor device in the fifth embodiment, like in the first to fourth embodiments, the reliability of the semiconductor device including a fine pattern can be improved.

(b) Manufacturing Method

The method of manufacturing a semiconductor device (for example, a flash memory) according to the fifth embodiment will be described by using FIGS. 49 to 61B.

A process of the method of manufacturing a flash memory according to the present embodiment will be described using FIGS. 51 to 52B. FIG. 51 shows a plan view of a portion of the memory cell array and the leading region in a process of the method of manufacturing a flash memory according to the present embodiment. FIGS. 52A and 52B show sectional process drawings corresponding to FIG. 51. FIG. 52A shows a sectional process drawing along an LIIa-LIIa line in FIG. 51. FIG. 52B shows a sectional process drawing along an LIIb-LIIb line in FIG. 51.

As shown in FIGS. 51 to 52B, like in the first to fourth embodiments, a mask layer 60 in a stacked structure is formed on a conductive layer 35A on a semiconductor substrate 30.

A silicon oxide 601 of the mask layer 60 is deposited on the conductive layer 35A. An amorphous silicon film 602 of the mask layer 60 is deposited on the silicon oxide 601.

As a lower-layer core material 62, the silicon oxide 62 is deposited on the amorphous silicon film 602. By interposing the amorphous silicon film 602 between the silicon oxides 601, 62, the etching selectivity (processing selection ratio, etching selection ratio) of the silicon oxide 62 as the lower-layer core material 62 and the silicon oxide 601 including in the mask layer 60 is secured.

A silicon nitride 63 as the intermediate layer 63 is deposited on the lower-layer core material 62. A BARC film (anti-reflection film) 64 is deposited on the intermediate layer 63. The BARC film 64 is formed by using, for example, a carbon film or a film (carbon compound film) containing carbon.

Materials forming each layer are appropriately selected so that the etching selectivity is secured in this manner and each layer is stacked on the conductive layer 35A as a processed layer (a first layer to be processed). The thickness of each layer stacked on the conductive layer is set based on the processing selection ratio of materials forming each layer. Materials of each layer are not limited to the above materials as long as the processing selection ratio can be secured.

An upper-layer core material 65 is formed on the BARC film 64 and the upper-layer core material 65 is patterned by photolithography and etching so as to have a predetermined shape. For example, the upper-layer core material 65 is formed by using a resist material. The thickness of the resist material as the upper-layer core material 65 is set to, for example, about 200 nm.

As shown in FIGS. 51 and 52A, a line portion 651 of the upper-layer core material 65 is patterned so as to have the layout of a line & space pattern in the memory cell array 100.

As shown in FIGS. 51 and 52B, a fringe 659 of the upper-layer core material 65 is formed in the contact formation region 200 of the leading region 150. In the method of manufacturing a flash memory according to the present embodiment, the shape (plane shape) of the fringe 659 when viewed from the direction perpendicular to the surface (X-Y plane) of the semiconductor substrate is a concave shape. A depression (region between two projections of concave) 99 of the concave fringe 659 is formed on the side face (side face in the Y direction) of the fringe 659 on the side (opposite side of the line portion 651 side) on which the fringe 659 projects.

Slimming processing is performed on the upper-layer core material 65. A line width (dimension in a direction parallel to the Y direction) CW1 of the line portion 651 of the upper-layer core material 65 is slimmed to a size about half the critical dimension of the resolution of photolithography. For example, as described above, the line width of the line portion 651 of the upper-layer core material 65 and the interval (space) between the line portions 651 before the slimming processing are each set to about 80 nm. The line width CW1 of the line portion 651 is set to 40 nm and the interval between the line portions 651 is set to about 120 nm by the slimming processing. After the slimming processing on the upper-layer core material, a maximum dimension D1Y of the fringe 659 in a concave structure and a dimension D1Y' of the fringe corresponding to the depression 99 in the Y direction are larger than the line width CW1 of the line portion 651 and larger than, for example, the critical dimension of the resolution of photolithography.

If the slimming processing is performed on the resist material 65 as the upper-layer core material, the dimension of the resist material 65 can be made smaller after pattern development by making the exposure time of photolithography longer than the normal exposure time (for patterning). The dimension of the resist material as the upper-layer core material 65 may be made smaller by dry etching based on plasma treatment using an $O^2$ gas. If the upper-layer core material (resist material) 65 is slimmed by dry etching, the BARC film 64 is also processed simultaneously and the upper-layer core material 65 and the BARC film 64 that have been processed forms one sacrificial layer.

A silicon oxide (sidewall material) 79 to form the first sidewall film (sidewall spacer) is deposited on the BARC film 64 and the slimmed upper-layer core material 65 by using, for example, the ALD method. The silicon oxide 79 is formed so as to have a thickness approximately the same as the line width CW1 of the line pattern portion 621 of the upper-layer core material 65. The thickness of the silicon oxide 79 is the dimension (maximum dimension) of the silicon oxide 79 on the side face of the core material 65 in a direction parallel to the substrate surface. Incidentally, depending on the material used for the foundation layer, a silicon nitride may be deposited, instead of the silicon oxide, as a film to form the sidewall film.

A dimension D5 in the X direction of the depression 99 of the fringe 659 in a concave structure is larger than twice the thickness of the sidewall film 79 so that the depression 99 is not buried by the sidewall film 79.

Figure 53:
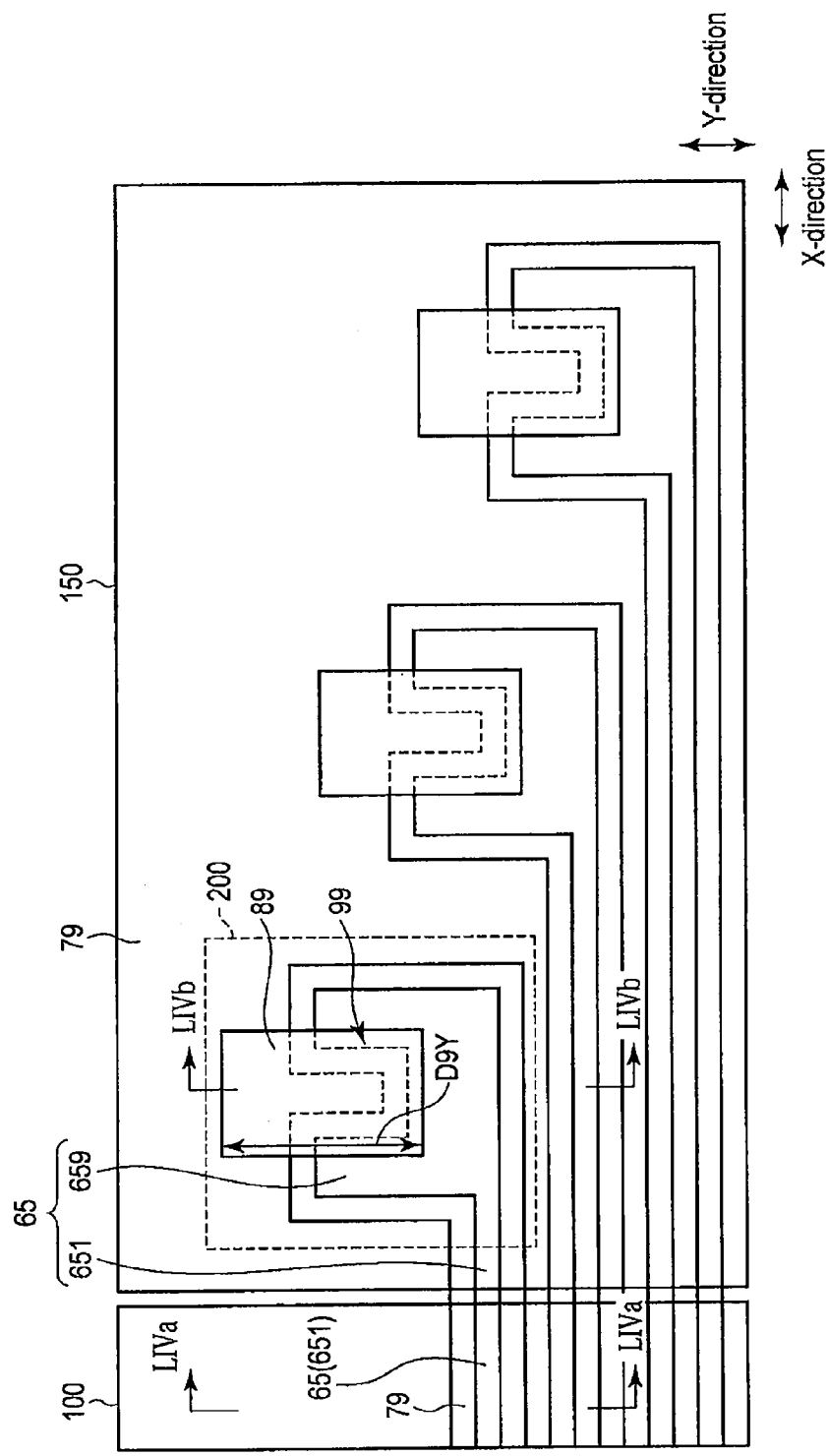
FIG. 53 is a plan view showing a process of the method of manufacturing the semiconductor device according to the fifth embodiment.

A process of the method of manufacturing a flash memory according to the present embodiment will be described using FIGS. 53 to 55B. FIG. 53 shows a plan view of a portion of the memory cell array and the leading region in a process of the method of manufacturing a flash memory according to the present embodiment. FIGS. 54A and 54B show sectional process drawings corresponding to FIG. 53. FIG. 54A shows a sectional process drawing along an LIVa-LIVa line in FIG. 53. FIG. 54B shows a sectional process drawing along an LIVb-LIVb line in FIG. 53. FIGS. 55A and 55B show sectional process drawings of a process following the manufacturing process shown in FIGS. 54A and 54B. FIG. 55A corresponds to the sectional process drawing subsequent to the process in FIG. 54A. FIG. 55B corresponds to the sectional process drawing subsequent to the process in FIG. 54B.

As shown in FIGS. 53 to 54B, before etch-back to selectively retain the sidewall spacer on the side face of the upper-layer core material 65 is performed on the sidewall film 79, a resist mask 89 is formed on the sidewall material 79 covering the fringe 659 of the upper-layer core material 65 in the contact formation region 200 of the leading region 150 by photolithography and etching. The resist mask 89 is a mask to form a pattern (contact spacer pattern) to widen the interval between interconnects (pads) formed in the contact formation region 200.

As shown in FIGS. 53 and 54B, the resist mask 89 has a rectangular planar shape and is patterned so as to cover the depression (region between two projections of concave) 99 formed in the fringe 659 of the upper-layer core material 65. To secure symmetry of the layout of interconnects formed in subsequent processes, it is preferable to set the dimension in the Y direction of the resist mask 89 of a portion covering the depression 99 of the fringe 659 to the size half a dimension D9Y of the whole resist mask 89 in the Y direction. The dimension of the resist mask 89 in the X direction is preferably larger than the dimension of the depression 99 of the fringe 659 in the X direction. For example, the resist mask 89 may not overlap with the upper-layer core material 65 if the resist mask 89 covers the sidewall material 79 on the foundation layer (here, the BARC film 64) in the contact formation region 200.

As shown in FIGS. 55A and 55B, the etch-back of the sidewall material is performed while the depression 99 of the concave fringe 659 is covered with the resist mask 89. The etch-back of the silicon oxide (sidewall material) covering the upper-layer core material 65 is performed to form a sidewall spacer 70 on the side face of the upper-layer core material 65. A mixed gas of a fluorocarbon etching gas including, for example, $C_4F_8$, $CF_4$, or $CHF_3$ and a gas such as oxygen ($O_2$) and/or argon (Ar) is used for etching of the silicon oxide as a sidewall material.

As shown in FIG. 55A, the sidewall spacer 70 of the line width LW1 is formed in the memory cell array 100. Like the line width CW1 of the line portion 651 of the upper-layer core material 65, the line width LW1 of the sidewall spacer 70 is set to, for example, about ½ the critical dimension of the resolution of photolithography. A sidewall spacer having the line width about ¼ the critical dimension of the resolution of photolithography may be formed by controlling the line width of the upper-layer core material and the interval between the upper-layer core materials so that a predetermined line & space pattern is formed.

As shown in FIG. 55B, a silicon oxide 70D remains on the BARC film 64 in accordance with the shape of the resist mask 89 in a portion covered with the resist mask 89 in the contact formation region 200. The remaining film 70D is called the dummy layer (a remaining portion or remaining pattern) 70D.

After the sidewall spacer 70 of the predetermined line width and the dummy layer 70D being formed, the upper-layer core material is selectively removed while, for example, the resist mask 89 covers the dummy layer 70D. The upper-layer core material is removed by, for example, ashing. For example, the thickness of the resist mask 89 is also made thinner by ashing to remove the core material. For example, the upper surface of the BARC film 64 may be etched by the formation of the sidewall spacer 70 and the removal of the upper-layer core material.

With the depression 99 in the concave fringe 659 formed in the upper-layer core material being covered with a mask like in the present embodiment, as shown in FIGS. 54 and 55, the size of the upper-layer core material 65 below the resist mask 89 becomes sufficiently smaller than the sizes of the patterns 70, 70D of the resist mask 89 and the sidewall material below the resist mask 89. As a result, when the upper-layer core material (resist material) 65 is removed, even if a cavity arises in a position corresponding to the upper-layer core material (fringe) below the resist mask 89 due to radicals (reactive species) of ashing (or etching) turning around, the size of the cavity 98 is relatively small. Further, a sidewall material of a larger size (area) remains in the contact formation region 200 below the resist mask 89. Therefore, according to the method of manufacturing a flash memory in the present embodiment, if, for example, the upper-layer core material formed of a resist material (carbon compound) is removed by ashing, controllability of the formation of a pattern (contact spacer pattern) to secure the region to form a pad is secured and a pattern (here, a pattern of the sidewall material) of a large size can be secured in the contact formation region 200. When the upper-layer core material below the resist mask is removed by etching, just like when the core material is removed by ashing, controllability to form a pattern to increase the interconnect interval can be improved in accordance with the combination of materials.

Compared with a case when the size and formation position of the resist mask 89 are controlled to reduce the area in which the mask 89 and the rectangular fringe overlap, pattern defects resulting from mis-alignment of the resist mask can be reduced and a margin for the arrangement space of a pattern to form a pad can be improved by adopting a concave pattern as the planar shape of the fringe 659 of the upper-layer core material 65 in the present embodiment.

It is preferable to use different materials or different thicknesses for the resist material forming the resist mask 89 covering the upper-layer core material 65 (fringe 659) and the resist material forming the upper-layer core material 65 so that the resist materials have different processing selection ratio (etching selectivity).

Figure 56:
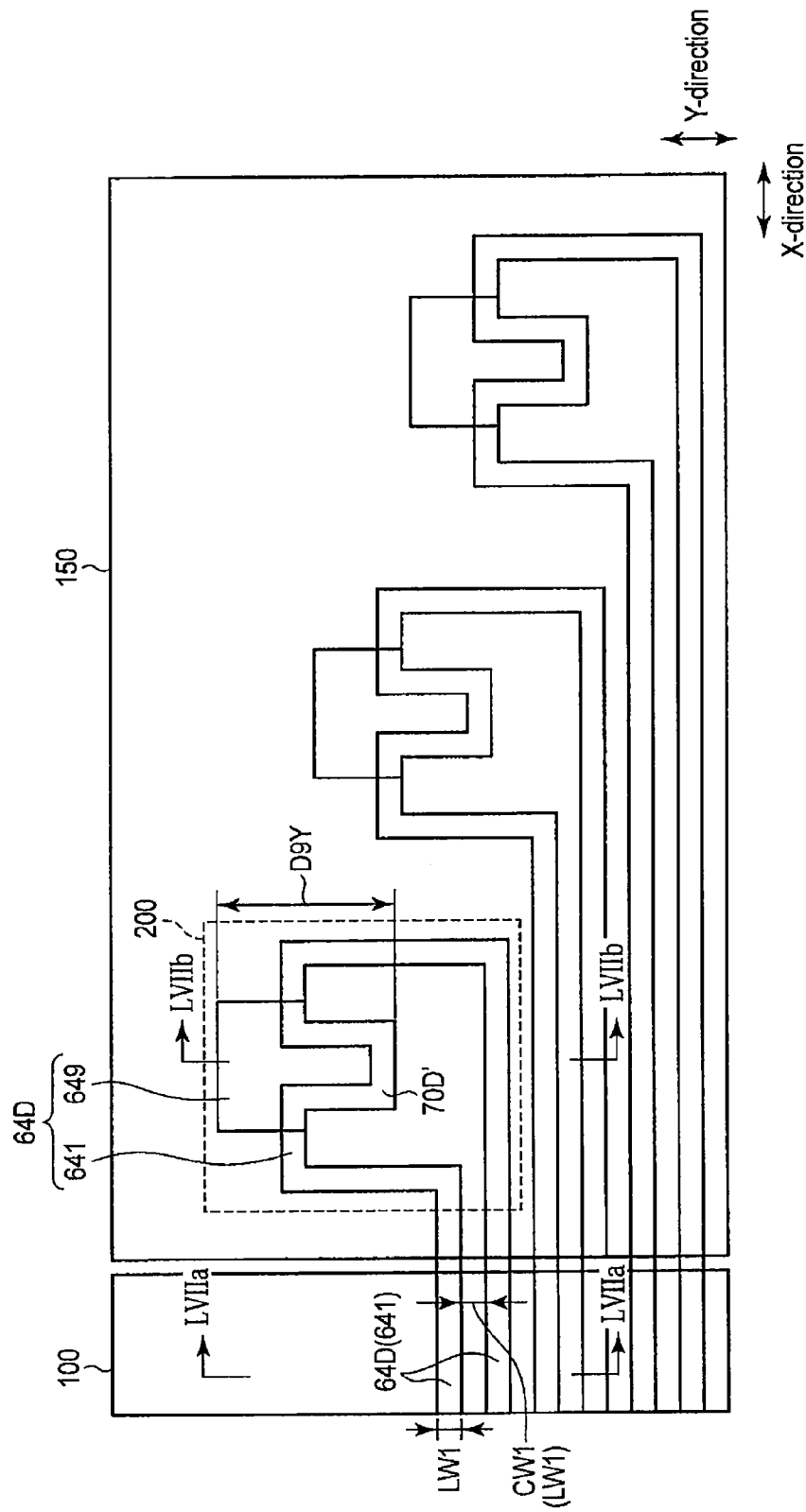
FIG. 56 is a plan view showing a process of the method of manufacturing the semiconductor device according to the fifth embodiment.

A process of the method of manufacturing a flash memory according to the present embodiment will be described using FIGS. 56 to 57B. FIG. 56 shows a plan view of a portion of the memory cell array and the leading region in a process of the method of manufacturing a flash memory according to the present embodiment. FIGS. 57A and 57B show sectional process drawings corresponding to FIG. 56. FIG. 57A shows a sectional process drawing along an LVIIa-LVIIa line in FIG. 56. FIG. 57B shows a sectional process drawing along an LVIIb-LVIIb line in FIG. 56.

As shown in FIGS. 56 to 57B, after the resist mask being removed, a BARC film 64D and an intermediate layer (silicon nitride) 63D are processed by, for example, dry etching by using the formed sidewall spacer and dummy layer as masks. The BARC film 64D and the intermediate layer 63D having a pattern in a closed loop shape to which patterns of the sidewall spacer and dummy layer have been transferred are formed.

The BARC film 64D is etched by using a mixed gas including chlorine ($Cl_2$), nitrogen ($N_2$), and $O_2$. The silicon nitride 63D as an intermediate layer is etched by using a mixed gas including, for example, $C_4F_8$, $CHF_3$, and $CF_4$.

When the silicon nitride 63D as an intermediate layer is processed, the silicon oxide as a sidewall film may disappear by being exposed to etching conditions for the silicon nitride. However, even if the sidewall film disappears due to etching of the silicon nitride, the BARC film 64D covered with the sidewall film remains on the silicon nitride 63D because the sidewall film serves as a protective film.

As shown in FIGS. 56 and 57A, line patterns (line portions) 631, 641 corresponding to the sidewall film (sidewall spacer) are formed in the intermediate layer 63D and the BARC film 64D in the memory cell array 100. The line width LW1 of the line portions 631, 641 is set to, for example, about half the critical dimension of the resolution of photolithography. Regardless of whether a space in which the upper-layer core material is arranged, the interval LI1 between the line portions 641, 631 is set to the size substantially the same as the line width LW1 of the line portions 641, 631.

As shown in FIGS. 56 and 57B, patterns (hereinafter, also called dummy patterns) 639, 649 corresponding to a dummy layer are formed in the intermediate layer 63D and the BARC film 64D. A dimension D9Y of the dummy patterns 639, 649 in the Y direction is larger than the line width LW1 between the line portions 631, 641. For example, the dimension D9Y of the dummy patterns 639, 649 is set to the critical dimension of the resolution of photolithography or more.

The planar shape of the dummy patterns 639, 649 is, for example, convex. For example, in the convex dummy patterns 639, 649, the dimension (width) in the Y direction of the dummy patterns 639, 649 on the inner circumferential side of the patterns 63D, 64D in a closed loop shape is smaller than the dimension (width) in the Y direction of the dummy patterns 639, 649 on the outer circumferential side of the patterns 63D, 64D in a closed loop shape. The line portions 631, 641 extending from in the memory cell array 100 into the leading region 150 are connected to an intermediate position (convex difference level) between one end and the other end of the dummy patterns 639, 649 in the Y direction.

For example, as shown in FIG. 57B, a portion 70D' of the sidewall film having a bent planar shape along a concave shape of the fringe formed in the upper-layer core material may remain in a portion corresponding to the sidewall of the dummy layer.

Subsequent to processing of the BARC film 64D and the silicon nitride 63D as an intermediate layer, the core material 62 below the silicon nitride 63D may be processed. After the BARC film 64D and the silicon nitride 63D being processed, the BARC film 64D may selectively be removed by ashing to process the lower-layer core material 62 based on the patterns 631, 639 of the processed silicon nitride 63D.

In the manufacturing process shown in FIGS. 53 to 57, after a sidewall spacer 71 being formed on the side face of the upper-layer core material 65 by etching back the sidewall material, the resist mask 89 covering the concave fringe 99 may be formed. In this case, after the upper-layer core material being removed, the BARC film 64 and the silicon nitride 63D are processed based on patterns of the sidewall spacer 71 and the resist mask 89 without the resist mask being removed.

A process of the method of manufacturing a flash memory according to the present embodiment will be described using FIGS. 58 to 59B. FIG. 58 shows a plan view of a portion of the memory cell array and the leading region in a process of the method of manufacturing a flash memory according to the present embodiment. FIGS. 59A and 59B show sectional process drawings corresponding to FIG. 58. FIG. 59A shows a sectional process drawing along an LVIIa-LVIIa line in FIG. 58. FIG. 59B shows a sectional process drawing along an LVIIb-LVIIb line in FIG. 58.

As shown in FIGS. 58 to 59B, a lower-layer core material (silicon oxide) 62A is processed by, for example, dry etching using the patterned silicon nitride film (not shown) serving as an intermediate layer as a mask and the pattern of the silicon nitride based on the sidewall spacer and dummy layer is transferred to the lower-layer core material 62A.

As described above, the silicon oxide 62A as the lower-layer core material 62A is etched by using, for example, a mixed gas of a fluorocarbon etching gas and an $O_2$ gas. As the fluorocarbon etching gas, $C_4F_8$, $CHF_3$, or $CF_4$ is used. Instead of the $O_2$ gas, an Ar gas may be mixed with a fluorocarbon etching gas or both of the $O_2$ gas and Ar gas may be mixed with a fluorocarbon etching gas.

After the silicon oxide 62A being processed, the patterned silicon nitride serving as an intermediate layer is selectively removed. The silicon nitride is selectively removed by wet etching using, for example, hot phosphoric acid as a chemical solution.

Slimming processing is performed on the silicon oxide 62A on which a pattern has been transferred.

As shown in FIGS. 58 and 59A, the line width LW2 of the line portion (interconnect spacer pattern) 621 of the silicon oxide 62A is slimmed to a size about ¼ the critical dimension of the resolution of photolithography by the slimming processing. For example, a line width CW2 of the line portion 621 of the silicon oxide 62A is slimmed to about 20 nm by the slimming processing.

As shown in FIGS. 58 and 59B, a pattern (convex portion, spacer portion, or contact spacer pattern) 629 corresponding to dummy patterns of the dummy layer and intermediate layer is formed in the lower-layer core material 62A in the contact formation region 200. The dimension D2Z in the Y direction of the spacer portion 629 of the lower-layer core material 62A is set in accordance with the sizes of the dummy layer and dummy pattern and is larger than the line width CW2 of the line portion 621.

The slimming processing on the lower-layer core material 62A including the silicon oxide is performed by wet etching, dry etching, or by combining wet etching and dry etching. If the slimming processing on the lower-layer core material 62A is performed by wet etching, the slimming processing may be performed before the mask layer (here, the silicon nitride as an intermediate layer) to process the lower-layer core material is removed. Alternatively, processing of the lower-layer core material and slimming processing may simultaneously be performed by wet etching. When the silicon oxide is etched by wet etching, for example, dilute fluoric acid is used as a chemical solution for etching.

Like the other embodiments described above, a silicon oxide whose thickness is, for example, about 20 nm is deposited on the slimmed lower-layer core material 62A and the mask layer 60. Then, the deposited silicon nitride is etched back to form the second sidewall film 71 on the side face of the lower-layer core material 62A. The sidewall mask 71 in a closed loop shape is formed by the second sidewall formation process above processed layers 33A, 35A on the side face of the lower-layer core material 62A including the spacer patterns 621, 629. To form the silicon nitride (sidewall film) 71 with good coverage, it is preferable to deposit the silicon nitride by using the ADL method. The silicon nitride as the sidewall film 71 is etched back by using a mixed gas of a fluorocarbon etching gas, an $O_2$ gas, and an Ar gas.

The sidewall mask 71 on the outer circumferential side and the sidewall mask 71 on the inner circumferential side of the spacer pattern 629 are bent in the opposite directions with respect to the Y direction across the spacer pattern 629 in accordance with the shape (convex planar shape) of the spacer pattern 629 of the lower-layer core material.

Thus, in the present embodiment, like the above embodiments, the sidewall mask 71 in a closed loop shape in the memory cell array 100 is formed in such a way that the line width LW 2 of the sidewall mask 71 has a size about ¼ the critical dimension of the resolution of photolithography and the intervals LI2, CW2 of the sidewall mask 71 opposed with respect to the Y direction have a size about ¼ the critical dimension of the resolution of photolithography.

The sidewall mask 71 is formed in such a way that the interval D2Z in the Y direction between the sidewall masks 71 opposed across the spacer portion 629 of the lower-layer core material 62A in the contact formation region 200 has a dimension larger than the intervals LI2, CW2 between the sidewall masks 71 in the memory cell array 100.

Figure 60:
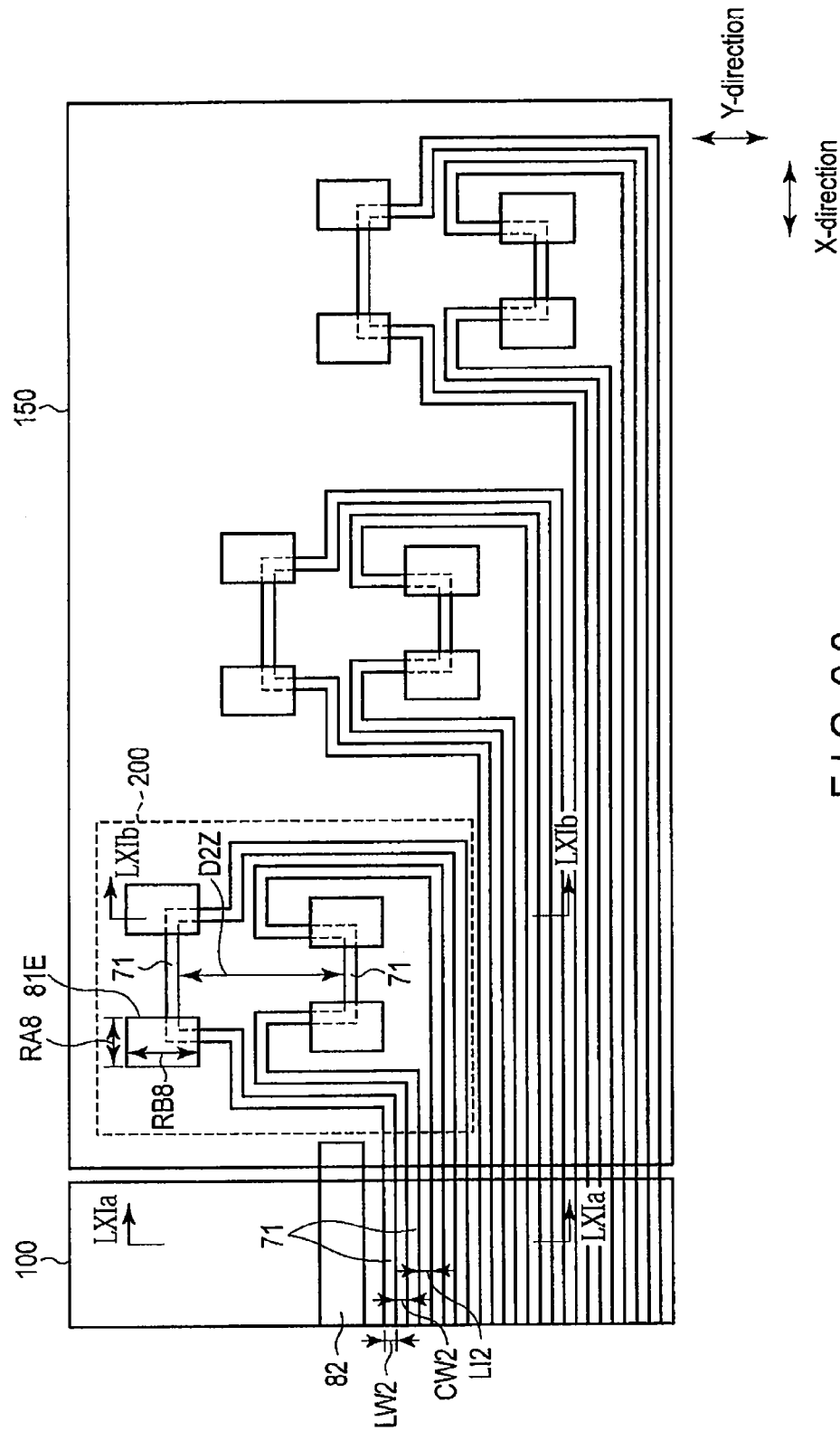
FIG. 60 is a plan view showing a process of the method of manufacturing the semiconductor device according to the fifth embodiment.

A process of the method of manufacturing a flash memory according to the present embodiment will be described using FIGS. 60 to 61B. FIG. 60 shows a plan view of a portion of the memory cell array and the leading region in a process of the method of manufacturing a flash memory according to the present embodiment. FIGS. 61A and 61B show sectional process drawings corresponding to FIG. 60. FIG. 61A shows a sectional process drawing along an LXIa-LXIa line in FIG. 60. FIG. 61B shows a sectional process drawing along an LXIb-LXIb line in FIG. 60.

As shown in FIGS. 60 to 61B, after the lower-layer core material (silicon oxide) being selectively removed by wet etching using, for example, dilute fluoric acid, a resist mask 81E is formed in the pad formation position in the contact formation region 200 by photolithography and etching so as to cover the sidewall mask 71.

A plurality of the resist masks 81E is formed in the contact formation region 200 so as to cover a portion of the sidewall mask 71 in a closed loop shape bent in accordance with the shape of the spacer pattern to correspond to each of four interconnects led into the common contact formation region 200.

As described above, the dimension of a contact spacer pattern in the contact formation region 200 formed in the core material is larger than the line width or the interval of a line & space pattern of the core material. The sidewall masks 71 are bent in the directions opposite to each other with respect to the Y direction across the spacer pattern of the core material. As a result, the sidewall masks 71 in the contact formation region 200 are spaced with the interval (dimension in the Y direction) D2Z larger than the intervals CW2, LI2 between the sidewall masks 71 in the memory cell array 100. Thus, a space to form a resist mask 89E to form a pad and a processing margin can be secured and unintended contact between the resist mask 89E and the sidewall mask 71 or unintended contact between the resist masks 89E can be reduced.

For example, the resist mask 81E is formed in a process common to, for example, a resist mask 82 to form a select gate line and a select transistor.

The mask layers 60A, 60B, 60C is processed by using the sidewall mask 71 in a closed loop shape and the resist masks 81E, 82 and patterns of the sidewall mask 71 and the resist masks 81E, 82 are transferred to mask layers 60A, 60B, 60C.

For example, amorphous silicon films 602A, 602B, 602C of the mask layers 60A, 60B, 60C in a stacked structure are processed by dry etching using a mixed gas such as $CF_4$ and HBr. Silicon oxides 601A, 601B, 601C of the mask layers 60A, 60B, 60C in a stacked structure are processed by, as described above, dry etching using a mixed gas including a fluorocarbon etching gas.

Like the first to fourth embodiments, after the sidewall mask 71 and the resist masks being selectively removed, conductive layers 35A, 33A and an insulating layer 34A as processed layers are sequentially processed and memory cells and a conductive layer of a closed loop pattern are formed in each of the memory cell array 100 and the leading region 150. Also, a conductive layer corresponding to a pattern of a select gate line and a conductive layer corresponding to a pattern of a pad are formed simultaneously with the conductive layer of a closed loop shape.

A resist mask having a straight opening is formed on the semiconductor substrate 30 by using the process substantially the same as, for example, the process shown in FIGS. 30 and 31 in the second embodiment or the process shown in FIGS. 40 and 41 in the third embodiment. The opening of the resist mask is formed in the resist mask in such a way that a portion (line portion) between pads of two conductive layers in a closed loop shape is exposed. Then, the conductive layer exposed via the opening of the resist mask is divided and, as shown in FIGS. 49, 50, 5A, and 5C, mutually independent word lines WL are formed.

In the present embodiment, four resist masks are formed to correspond to four pads forming a group in the contact formation region. However, like the second embodiment, one resist mark may be formed for each of the sidewall mask 71 in a closed loop shape on the outer side and the sidewall mask 71 in a closed loop shape on the inner side in the one contact formation region 200 so that the pattern corresponding to each resist mask is divided by loop-cutting into two pads to correspond to each interconnect.

Then, like in the first to fourth embodiments, the inter-layer insulating film, contact plug/via plug, and intermediate wiring layer/bit line are sequentially formed.

With the above manufacturing processes, a flash memory according to the present embodiment is formed.

In the method of manufacturing a flash memory according to the present embodiment, like in the first to fourth embodiments, a mask of a dimension larger than the line width LW and the interconnect interval LI2 of the interconnect WL formed by transferring a pattern of the sidewall film is formed in the contact formation region 200 of the leading region 150 so as to cover the first sidewall film (sidewall spacer) 70. The second sidewall film (sidewall mask) 71 corresponding to an interconnect pattern is formed on the side face of the patterns (contact spacer patterns) 70D, 649, 639, 629 corresponding to the mask 89 and the side face of the pattern (interconnect spacer pattern) 621 corresponding to the sidewall spacer 70.

In a flash memory according to the present embodiment, like the other embodiments, an interval D2Z larger than at least one of the line width LW2 of the word line WL and the interval LI2 between the word lines WL in the memory cell array 100 is secured between the interconnects WL in the contact formation region 200 by using the process substantially the same as the formation of a pattern (interconnect) for the memory cell array 100. Thus, even if the line width of an interconnect and the interconnect interval are formed in a dimension smaller than the critical dimension of the resolution of photolithography, space to arrange pads connected to interconnects and a resist mask to process pads or a space for processing margin of these pads can be secured in the contact formation region 200.

Therefore, in the method of manufacturing a flash memory according to the present embodiment, like in the first to fourth embodiments, a short (short circuit) that may arise between the pad, interconnect, and contact in the contact formation region 200 can be prevented and device failures caused by the short can be reduced.

In the method of manufacturing a semiconductor device according to the present embodiment, the planar shape of the fringe 659 of the core material (for example, the resist material) 65 to form the first sidewall film (sidewall spacer) 70 is made concave and a sidewall film is formed (etch-back of the sidewall material) and the core material is removed while a concave depressed portion 99 of the fringe is covered with the resist mask 89. The patterns (contact spacer patterns) 70D, 649, 639, 629 to increase the interval D2Z between the sidewall films (sidewall masks) and between the interconnects WL based on the sidewall mask in the contact formation region 200 are formed in the contact formation region 200 to correspond to the portion covered with the resist mask 89.

Accordingly, the area in which the fringe 659 and the resist mask 89 overlap can be decreased relatively easily and further, the patterns 70D, 649, 639, 629 to secure a large interval between the sidewall masks 71 and between interconnects in the contact formation region 200 can be formed even if the area in which the fringe 659 and the resist mask 89 overlap is small.

As a result, even if the fringe 650 overlapping with the resist mask 89 is excessively removed when the core material 65 having the fringe 659 is removed, the size of the cavity 98 below the resist mask 89 generated by the removal of the fringe becomes smaller and losses and defects of pattern caused by the cavity 98 can be controlled. Thus, according to the method of manufacturing a flash memory in the present embodiment, controllability of the formation of the patterns 70D, 649, 639, 629 to increase the interval D2Z between the interconnects WL based on the fringe 659 and the resist mask 89 can be improved.

Further, according to the method of manufacturing a flash memory in the present embodiment, controllability of the formation of a pattern can be secured by devising the shape and layout of members and thus, constraints of processes in consideration of adverse effects of processes (for example, constraints of the combination of stacked materials and constraints of methods used) can be eliminated so that flexibility of processes can be improved.

Therefore, according to the method of manufacturing a semiconductor device in the fifth embodiment, like the first and fourth embodiments, a semiconductor device including a fine pattern whose reliability is improved can be provided.

[Others]

In a semiconductor device and the method of manufacturing a semiconductor device according to the present embodiment, a flash memory is illustrated as a semiconductor device, but the present embodiment is not limited to the flash memory. For example, the above embodiments may be applied to the structure and the manufacturing method of a volatile semiconductor memory such as a DRAM and SRAM. The above embodiments may also be applied to the structure and the manufacturing method of a resistance change memory using an element whose resistance reversibly changes as a memory element such as an MRAM (Magnetoresistive RAM), PCRAM (Phase Change RAM), and ReRAM (Resistive RAM). For example, the semiconductor device and the method of manufacturing a semiconductor device according to the above embodiments can be applied to the structure and the formation method of am interconnect (word line/bit line) of a line & space pattern in a cross-point memory cell array included in a resistance change memory and a contact portion (pad, fringe) connected to the interconnect.

Further, in addition to the memory as a semiconductor device, the structure and the manufacturing method described in the above embodiments may be applied to the gate electrode of a FET (Field Effect Transistor), an interconnect connected to a FET, or a contact portion (pad, fringe) connected to the gate electrode and the interconnect in a logic circuit formed of a FET in a planar structure or a Fin FET if the layout includes a line & space pattern.

Also the structure and the manufacturing method described in the first to fifth embodiments can be applied to these semiconductor devices and the effects described in the first to fifth embodiments can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:

forming a first layer to be processed on a first region and a second region of a semiconductor substrate;

forming a first core material above the first layer, the first core material including a line portion extending in a first direction from the first region toward the second region and having a first line width in a second direction perpendicular to the first direction and a fringe connected to the line portion in the second region and having a first dimension larger than the first line width;

forming a first sidewall film having the first line width on a side face of the first core material so as to surround the side face of the first core material;

forming a first mask covering at least a portion of the first sidewall film and at least a portion of the fringe;

removing the first core material so that a first remaining portion having a second dimension larger than the first line width is formed below the first mask, the first remaining portion including at least one of the first core material and the first sidewall film;

forming a second sidewall film on the side face of a first pattern so as to surround the first pattern corresponding to a pattern of the first sidewall film and a pattern of the first remaining portion, the second sidewall film having a second line width equal to the first line width or less and facing each other with a first interval equal to the first line width or less in the first region and facing each other with a second interval larger than the first interval in the second region; and after the first pattern being removed, forming a plurality of interconnects having the second line width, adjacent to each other in the first region with the first interval, and adjacent to each other in the second region with the second interval by processing the first layer using the second sidewall film as a mask.

2. The method of manufacturing a semiconductor device according to claim 1, wherein
the fringe has a concave planar shape, and
the first mask is formed on the fringe and the first sidewall film so as to cover a depressed portion of the concave in the fringe.

3. The method of manufacturing a semiconductor device according to claim 2, wherein
the first mask is formed before a first sidewall material to form the first sidewall film being selectively retained on the side face of the first core material, and
etching of the first sidewall material is performed while the first mask covers the first sidewall material and the first sidewall film is formed on the side face of the line portion and the fringe in the first region and the second region, a portion not covered with the first mask in the fringe is exposed.

4. The method of manufacturing a semiconductor device according to claim 3, wherein
after the first sidewall film being formed, the first core material is selectively removed and the first sidewall material remains between the first mask and the first layer to have the pattern corresponding to the first mask.

5. The method of manufacturing a semiconductor device according to claim 3, wherein
the first core material includes a film containing carbon, and
the first sidewall material includes a film containing silicon.

6. The method of manufacturing a semiconductor device according to claim 5, wherein
the first core material is removed by ashing.

7. The method of manufacturing a semiconductor device according to claim 1, wherein
the first sidewall film is formed so that the first line width of the first sidewall film has a dimension smaller than a minimum resolution of a photolithography process used to form the first mask,
a first spacer corresponding to the first sidewall film of the first pattern is slimmed to the second line width smaller than the first line width, and
the second sidewall film is formed on the side face of the slimmed first spacer and on the side face of a second spacer corresponding to the first remaining portion of the first pattern so that the second line width of the second sidewall film has a dimension smaller than the first line width.

8. The method of manufacturing a semiconductor device according to claim 1, wherein
the first sidewall film is formed so that the first line width of the sidewall film has a dimension smaller than a half of a minimum resolution of a photolithography process used to form the first mask, and
the second sidewall film is formed on the side face of the first pattern so that the second line width of the second sidewall film has the same dimension as the first line width.

9. The method of manufacturing a semiconductor device according to claim 1, wherein
a foundation layer is formed on the first layer before the first core material being formed, and
the pattern of the first sidewall film and the pattern of the first remaining portion are transferred to the foundation layer to form the first pattern.

10. The method of manufacturing a semiconductor device according to claim 1, further comprising:
before the first pattern being removed, forming a second mask covering first portions opposed with the second interval of second sidewall film and the first pattern in the second region;
removing the first pattern so that a second remaining portion extending over the first portions is formed below the second mask; and
after the first layer being processed based on the second sidewall film and the second remaining portion, making the interconnects independent of each other by processing a second pattern of the first layer corresponding to the second remaining portion and at the same time, forming a contact pad portion connected to each of the interconnects.

11. The method of manufacturing a semiconductor device according to claim 10, wherein
a resist mask having a cross opening that exposes a cutting site of the second pattern is formed in the first and second regions.

12. The method of manufacturing a semiconductor device according to claim 11, wherein
the contact pad portion is formed so as to be connected to the side face of the interconnect.

13. The method of manufacturing a semiconductor device according to claim 10, further comprising:
forming a third mask corresponding to a transistor gate pattern and having a third width larger than the second width in the first region at the same time as forming the second mask; and
processing the first layer so that the patterns of the second sidewall film and the second and third masks are transferred.

14. The method of manufacturing a semiconductor device according to claim 1, further comprising:
before the first layer being processed, forming two second masks so as to cover two first portions of the second sidewall films adjacent to each other with the second interval in the second region; and
after the first layer being processed, making the interconnects independent of each other by processing two second patterns of the first layer corresponding to the second masks and at the same time, forming a contact pad portion connected to each of the interconnects.

15. The method of manufacturing a semiconductor device according to claim 14, wherein
the contact pad portion is formed so as to be connected to a tip of the interconnect.

16. A method of manufacturing a semiconductor device, comprising:
forming a first layer to be processed on a first region and a second region of a semiconductor substrate;
forming a first core material above the first layer, the first core material including a line portion extending in a first direction from the first region toward the second region and having a first line width in a second direction perpendicular to the first direction and a fringe connected to the line portion in the second region and having a first dimension larger than the first line width;
forming a first sidewall film having the first line width on a side face of the first core material so as to surround the side face of the first core material;
after the first core material being removed, forming a first mask so as to cover a portion in the second region of a first pattern corresponding to the first sidewall film;

adopting a second line width smaller than the first line width for a portion in the first region that is not covered with the first mask of the first pattern;

after the first mask being removed, forming a second sidewall film on the side face of the first pattern so as to surround the side face of the first pattern, the second sidewall film having the second line width and facing each other with a first interval corresponding to the second line width in the first region and facing each other with a second interval corresponding to the first line width and larger than the first interval in the second region; and after the first pattern being removed, forming a plurality of interconnects having the second line width, adjacent to each other in the first region with the first interval, and adjacent to each other in the second region with the second interval by processing the first layer using the second sidewall film as a mask.

17. The method of manufacturing a semiconductor device according to claim 16, wherein the first line width is smaller than a minimum resolution of a photolithography process used to form the first mask, and the first dimension is equal to the limit dimension of resolution of photolithography or more.

18. The method of manufacturing a semiconductor device according to claim 16, further comprising:

after the first pattern being removed, forming a plurality of second masks so as to cover first portions of the second sidewall film opposed to each other with the second interval; and after the first layer being processed based on the second sidewall film and the second mask, making the interconnects independent of each other by processing a second pattern of the first layer corresponding to at least one of the second sidewall film and the second mask in the second region and at the same time, forming a contact pad portion connected to each of the interconnects.

19. The method of manufacturing a semiconductor device according to claim 18, further comprising:

forming a third mask corresponding to a transistor gate pattern and having a third width larger than the second width in the first region at the same time as forming the second mask; and processing the first layer so that the patterns of the second sidewall film and the second and third masks are transferred.

20. The method of manufacturing a semiconductor device according to claim 16, wherein each of the interconnects is formed so as to be bent in the second direction in the second region and each of the contact pad portions is formed between a bent portion of the interconnect and a tip of the interconnect.

* * * * *